United States Patent
Lim et al.

(10) Patent No.: US 10,600,945 B2
(45) Date of Patent: Mar. 24, 2020

(54) LIGHT EMITTING DEVICE AND LIGHT EMITTING DEVICE PACKAGE

(71) Applicant: LG INNOTEK CO., LTD., Seoul (KR)

(72) Inventors: Chang Man Lim, Seoul (KR); Ki Seok Kim, Seoul (KR); Young Shin Kim, Seoul (KR); June O Song, Seoul (KR); Ju Hyeon Oh, Seoul (KR); Chang Hyeong Lee, Seoul (KR); Tae Sung Lee, Seoul (KR); Se Yeon Jung, Seoul (KR); Byung Yeon Choi, Seoul (KR); Sung Min Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/035,306

(22) Filed: Jul. 13, 2018

(65) Prior Publication Data

US 2019/0019929 A1 Jan. 17, 2019

(30) Foreign Application Priority Data

Jul. 13, 2017 (KR) .................. 10-2017-0088755
Aug. 25, 2017 (KR) .................. 10-2017-0108220

(51) Int. Cl.
| | | |
|---|---|---|
| H01L 33/62 | (2010.01) | |
| H01L 33/38 | (2010.01) | |
| H01L 33/44 | (2010.01) | |
| H01L 33/48 | (2010.01) | |
| H01L 33/56 | (2010.01) | |
| H01L 33/60 | (2010.01) | |
| H01L 33/50 | (2010.01) | |

(52) U.S. Cl.
CPC ............ *H01L 33/62* (2013.01); *H01L 33/382* (2013.01); *H01L 33/44* (2013.01); *H01L 33/486* (2013.01); *H01L 33/502* (2013.01); *H01L 33/56* (2013.01); *H01L 33/60* (2013.01); *H01L 2933/005* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2009/0200570 A1* | 8/2009 | Mori ..................... | H01L 33/642 257/99 |
| 2014/0332839 A1* | 11/2014 | Choi ...................... | H01L 24/17 257/99 |
| 2015/0348906 A1* | 12/2015 | Park ..................... | H01L 33/486 257/774 |

(Continued)

*Primary Examiner* — Grant S Withers
(74) *Attorney, Agent, or Firm* — Birch, Stewart, Kolasch & Birch, LLP

(57) ABSTRACT

The light emitting device package disclosed in the embodiment includes: first and second frames having first and second through holes; a body disposed between the first and second frames; a light emitting device including a first bonding pad and a second bonding pad; and a conductive part in the first and second through holes. wherein at least one of the first and second bonding pads faces the first and second frames and overlaps with the first and second through holes and includes a contact region contacting the conductive part and a first non-contact non-contacting the conducive part.

12 Claims, 34 Drawing Sheets

(56) References Cited

U.S. PATENT DOCUMENTS

| | | | | |
|---|---|---|---|---|
| 2016/0372646 A1* | 12/2016 | Yoon | ..................... | H01L 33/62 |
| 2018/0226549 A1* | 8/2018 | Nakabayashi | ...... | H01L 25/0753 |
| 2019/0088824 A1* | 3/2019 | Kim | ..................... | H01L 33/56 |
| 2019/0334063 A1* | 10/2019 | Kim | ..................... | H01L 33/48 |

\* cited by examiner (a)

(b)

(c)

(a)

(b)

(c)

LIGHT EMITTING DEVICE AND LIGHT EMITTING DEVICE PACKAGE

The present application claims priority under 35 U.S.C. § 119(a) of Korean Patent Application No. 10-2017-0088755 filed on Jul. 13, 2017, and Application No. 10-2017-0108220 filed on Aug. 25, 2017, which is hereby incorporated by reference in its entirety.

BACKGROUND

Embodiments of the invention relate to a semiconductor device, a semiconductor device package, and a method of manufacturing a semiconductor device package.

Embodiments of the invention relate to a light emitting device, a light emitting device package, and a room for manufacturing a light emitting device package.

Embodiments of the invention relate to a light source device having a semiconductor device package or a light emitting device package.

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group II-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

SUMMARY

According to an embodiment of the invention, a light emitting device package or a semiconductor device package can be provided in which a through hole of a frame and a bonding pad of a semiconductor device or a light emitting device are faced to each other, wherein a contact region and an open region or a non-contact region are disposed in the bonding pad.

According to an embodiment of the invention, a bonding pad of a semiconductor device or a light emitting device disposed on a through hole of a frame includes a contact region and a non-contact region, the invention provides a semiconductor device package or a light emitting device package which may disperse the adhesion between the bonding pad and a conductive part.

An embodiment of the invention can provide a semiconductor device package or a light emitting device package capable of improving light extraction efficiency and electrical properties.

An embodiment of the invention can provide a semiconductor device package or a light emitting device package capable of improving process efficiency and providing a new package structure to reduce manufacturing costs and improve manufacturing yield.

Embodiments of the present invention can provide a semiconductor device package or a light emitting device package that can prevent a re-melting phenomenon from occurring in a bonding region of a semiconductor device package in a process of re-bonding the semiconductor device package to the substrate.

An embodiment of the invention relates to a light emitting device or a semiconductor device capable of improving light extraction efficiency and electrical properties, and a package having the same.

According to an embodiment of the invention, a light emitting device or a semiconductor device capable of performing stable bonding by providing a small pressure at a low temperature is provided, and a package having the same.

Embodiments of the present invention provide a semiconductor device package or a light emitting device package capable of preventing a re-melting phenomenon from occurring in a bonding region of a semiconductor device package in a process of re-bonding the semiconductor device package to the substrate.

An embodiment of the invention can provide a light emitting device having an improved reliability of a device or a package, a method for manufacturing a semiconductor device, and a package manufacturing method.

An embodiment of the invention provides a light emitting device comprising: a light emitting structure including a first conductivity type semiconductor layer, a second conductivity type semiconductor layer, an active layer disposed between the first and second conductivity type semiconductor layers, and a plurality of recesses penetrating the second conductivity type semiconductor layer and the active layer to expose a partial region of the first conductivity type semiconductor layer; a first insulating layer disposed on the light emitting structure and including a plurality of first openings in a region overlapping with the plurality of recesses in a vertical direction; a second insulating layer disposed on the first insulating layer and including a plurality of second openings overlapping in a vertical direction with the plurality of first openings and a plurality of third openings spaced apart from the plurality of second openings; a first electrode disposed on the second insulating layer and electrically connected to the first conductivity type semiconductor layer in the second opening; a second electrode disposed on the second insulating layer and electrically connected to the second conductivity type semiconductor layer in the third opening; a third insulating layer disposed on the first and second electrodes and including a plurality of fourth and fifth openings vertically overlapping with a part of the first and second electrodes; and first and second bonding pads disposed on the third insulating layer and electrically connected to the first and second electrodes, respectively, in the fourth and fifth openings, wherein the first and second electrodes include a plurality of first and second branched electrodes each extending in a first direction, wherein the first bonding pad includes a first concave portion in which the plurality of second branched electrodes are extended, wherein the second bonding pad includes a second concave portion in which the plurality of first branched electrodes are extended, wherein the first and second bonding pads overlap in the first direction, wherein the first concave portion includes a non-contact area of the first bonding pad adjacent to the second bonding pad, and wherein the second concave portion includes a non-contact region of the second bonding pad adjacent to the first bonding pad.

According to an embodiment of the invention, the first and second concave portions may be disposed to be offset from each other in the first direction.

According to an embodiment of the invention, wherein a number of the second concave portion is greater than a number of the first concave portion, wherein a number of the second branched electrodes is greater than the number of the second concave portion, wherein a number of the first branched electrodes is equal to the number of the first concave portion.

According to an embodiment of the invention, a size of the second bonding pad may be larger than a size of the first bonding pad.

According to an embodiment of the invention, the light emitting device package comprises: a first frame including a first through hole; a second frame including a second through hole; a body disposed between the first and second frames; a light emitting device including a first bonding pad and a second bonding pad; a light emitting device including a first conductive part; and a second conductive part in the second through hole, wherein the first through hole penetrates an upper surface and a lower surface of the first frame, wherein the second through hole penetrates an upper surface and a lower surface of the second frame, wherein the first bonding pad faces the first frame and overlaps the first through hole, wherein the second bonding pad faces the second frame and overlaps the second through hole, wherein the first bonding pad includes a first contact region which is in contact with the first conductive part on the first through hole and a first non-contact region which is non-contacted with the first conductive part.

According to an embodiment of the invention, wherein the second bonding pad may include a second contact region that is in contact with the second conductive part on the second through hole and a second non-contact region that is not in contact with the second conductive part.

According to an embodiment of the invention, the first and second conductive parts may include a solder paste, and the body may be an insulating material.

According to an embodiment of the invention, at least one of the first and second bonding pads may have an area of each of the first and second contact regions that is at least twice the area of the particle of the first and second conductive parts. At least one of the first and second bonding pads may have an area of each of the first and second non-contact regions that is at least 1.5 times of an area of the particle constituting the first and second conductive parts.

According to an embodiment of the invention, the area of the first contact region of the first bonding pad is smaller than an area of the upper surface of the first through hole, the area of the second contact region of the second bonding pad can be smaller than an area of the upper surface of the second through hole.

According to an embodiment of the invention, the first contact region of the first bonding pad is formed in one or more on the first through hole, wherein the second contact region of the second bonding pad is formed in one or more on the second through hole, wherein the first non-contact region of the first bonding pad is formed in one or more of the first through holes and has an area smaller than that of the first contact region, wherein the second non-contact region of the second bonding pad is disposed on the second through-hole and has an area smaller than that of the second contact region.

According to an embodiment of the invention, the first and second conductive parts may have a concave curved surface on the first and second non-contact regions, and at least one of an adhesive and a resin part disposed between the body and the light emitting device.

According to an embodiment of the invention, the body includes a recess recessed in a direction toward a lower surface from a upper surface of the body, and the adhesive is disposed in the recess, wherein the adhesive may be contacted with the upper surface of the body, a lower surface of the light emitting device and the first and second bonding pads.

According to an embodiment of the invention, at least one of the adhesive and the resin part may be disposed outside the non-contact region of the first and second bonding pads.

According to an embodiment of the invention, the first and second frames are conductive frames, and the adhesive can be formed of an insulating resin material.

According to an embodiment of the invention, the body may have a concave cavity around the light emitting device.

According to an embodiment of the invention, the light emitting device package comprises: a first frame and a second frame spaced apart from each other; and a light emitting device which is disposed on the first and second frames and includes a first bonding pad and a second bonding pad; a first conductive part which is disposed between the first bonding pad and the first frame and is connected to the first bonding pad; and a second conductive part which is disposed between the first bonding pad and the second frame and is electrically connected to the second bonding pad, wherein the first and second conductive parts include first and second intermetallic compound layers, wherein the first and second intermetallic compound layers comprise Ag and Sn, and a weight percentage of the Ag and the Sn can be provided in a range of 2.27:1 to 3.18:1.

According to an embodiment of the invention, the first and second intermetallic compound layers may include an Au-containing region.

According to an embodiment of the invention, the Au-containing region includes the first and second intermetallic compound layers and the first and second frames.

According to an embodiment of the invention, a Ni layer disposed under the first and second intermetallic compound layers, and a Cu layer disposed under the Ni layer.

According to an embodiment, the invention can further include an Ag layer disposed between the first and second intermetallic compound layers and the Ni layer.

According to an embodiment of the invention, the light emitting device comprises: a light emitting structure including a first conductivity type semiconductor layer, a second conductivity type semiconductor layer, and an active layer disposed between the first conductivity type semiconductor layer and the second conductivity type semiconductor layer; a first bonding pad which is disposed on the light emitting structure and is electrically connected to the first conductivity type semiconductor layer; and a second bonding pad which is disposed on the light emitting structure, is spaced apart from the first bonding pad and is electrically connected to the second conductivity type semiconductor layer, wherein each of the first bonding pad and the second bonding pad may include an Ag layer disposed on the light emitting structure and a Sn layer disposed on the Ag layer.

According to an embodiment of the invention, the light emitting device comprises a barrier layer disposed at least one between the Ag layer and the Sn layer or on the Sn layers.

According to an embodiment of the invention, the barrier layer may include an Au layer.

According to an embodiment of the invention, each of the first bonding pad and the second bonding pad may include a stacked structure of Ag layer/Au layer/Sn layer/Au layer.

According to an embodiment of the invention, an amount of the Ag layer may be 2.73 times smaller than an amount of the Sn layer based on the weight percentage (wt %).

According to an embodiment of the invention, the Ag layer and the Sn layer may be provided in a few micrometers, respectively, a thickness of the Sn layer may be thicker than a thickness of the Ag layer.

According to an embodiment of the invention, a thickness of the Ag layer may be less than 0.47 times as compared to a thickness of the Sn layer.

According to an embodiment of the invention, the light emitting device package comprises: a package body including a frame; an intermetallic compound layer including Ag and Sn disposed on the frame; and a semiconductor layer disposed on the intermetallic compound layer.

According to an embodiment of the invention, the amount of Ag in the intermetallic compound layer may be provided in a range of 2.27:1 to 3.18:1 with respect to an amount of Sn based on the weight percentage (wt %).

According to an embodiment of the invention, the intermetallic compound layer may include a region in which Au is further included.

According to an embodiment of the invention, the region in which the Au is further included may be provided between a central region of the intermetallic compound layer and the frame.

According to an embodiment of the invention, the frame comprises: a Ni layer disposed under the intermetallic compound layer; and a Cu layer disposed under the Ni layer.

According to an embodiment of the invention, the light emitting device package further comprises an Ag layer disposed between the intermetallic compound layer and the Ni layer.

DETAILED DESCRIPTION OF THE EMBODIMENTS

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment of the invention will be described in detail with reference to the accompanying drawings. The semiconductor device of the semiconductor device package may include a light emitting device emitting light of an ultraviolet ray, an infrared ray, or a visible ray. The invention is based on a case where a light emitting device is applied as an example of a semiconductor device, and a light emitting device is applied to a package or a light source device to which the light emitting device is applied, and a sensing device for monitoring a wavelength or a heat from a device such as a Zener diode. Hereinafter, a semiconductor device package or a light emitting device package according to an embodiment of the invention will be described with reference to the accompanying drawings, and a method for manufacturing a package having a light emitting device or a semiconductor device will be described in detail.

Embodiment 1

Figure 1:
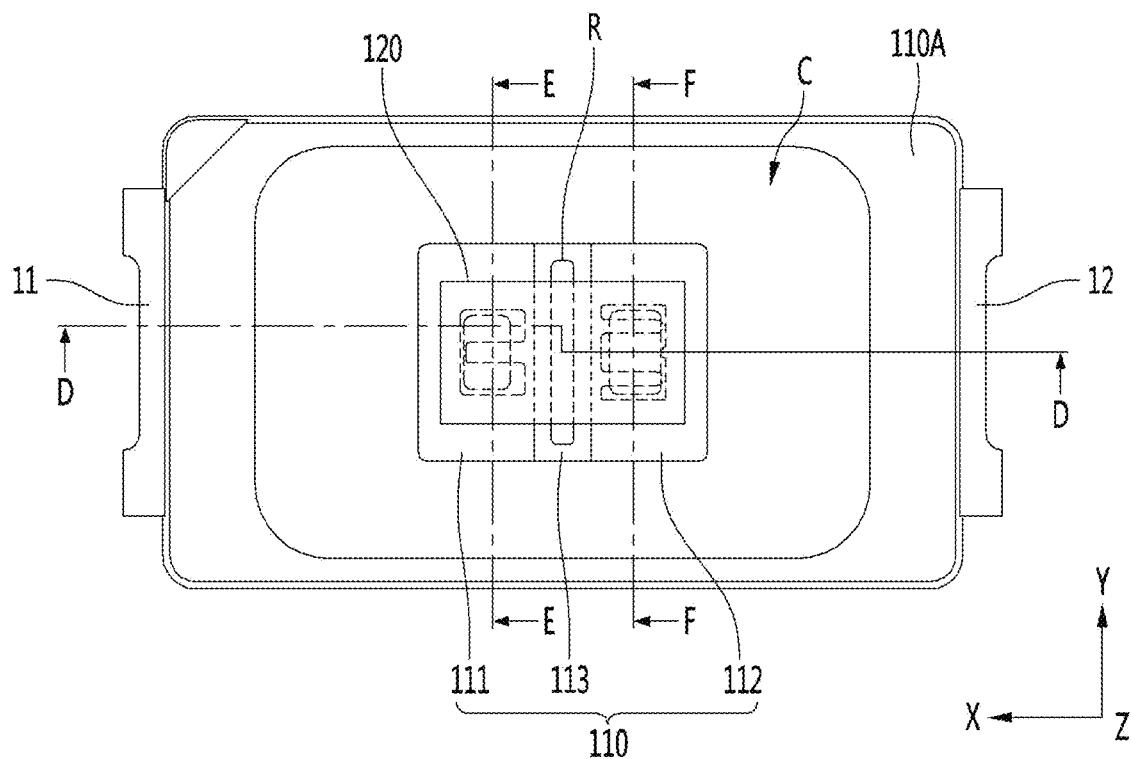
FIG. 1 is a plan view of a light emitting device package according to a first embodiment of the invention.
Figure 2:
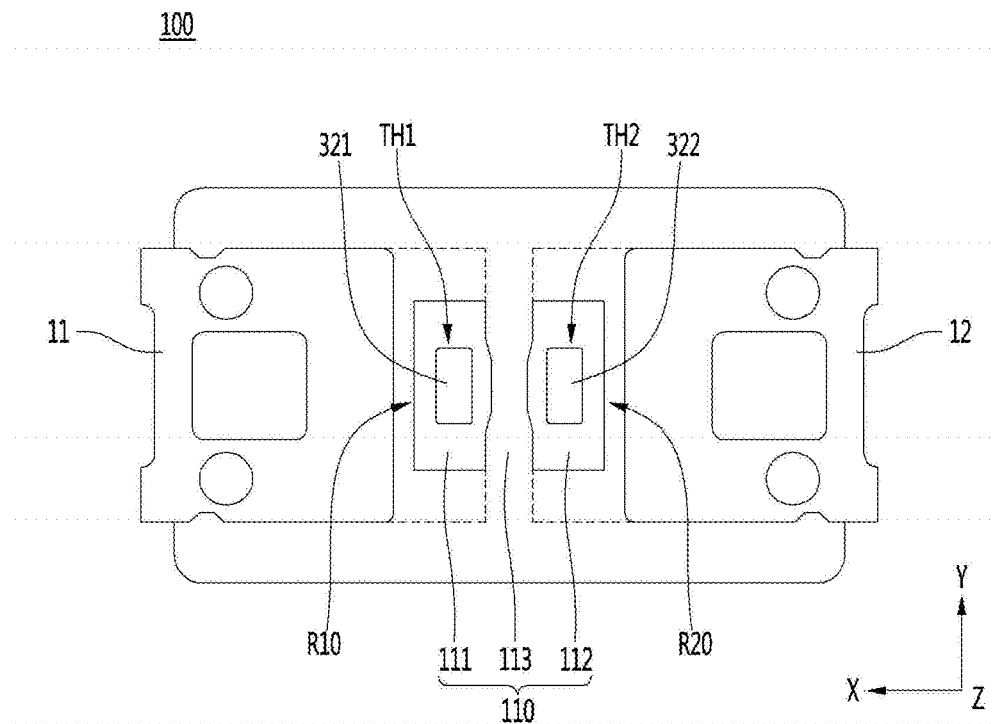
FIG. 2 is a bottom view of the light emitting device package shown in FIG. 1.
Figure 4:
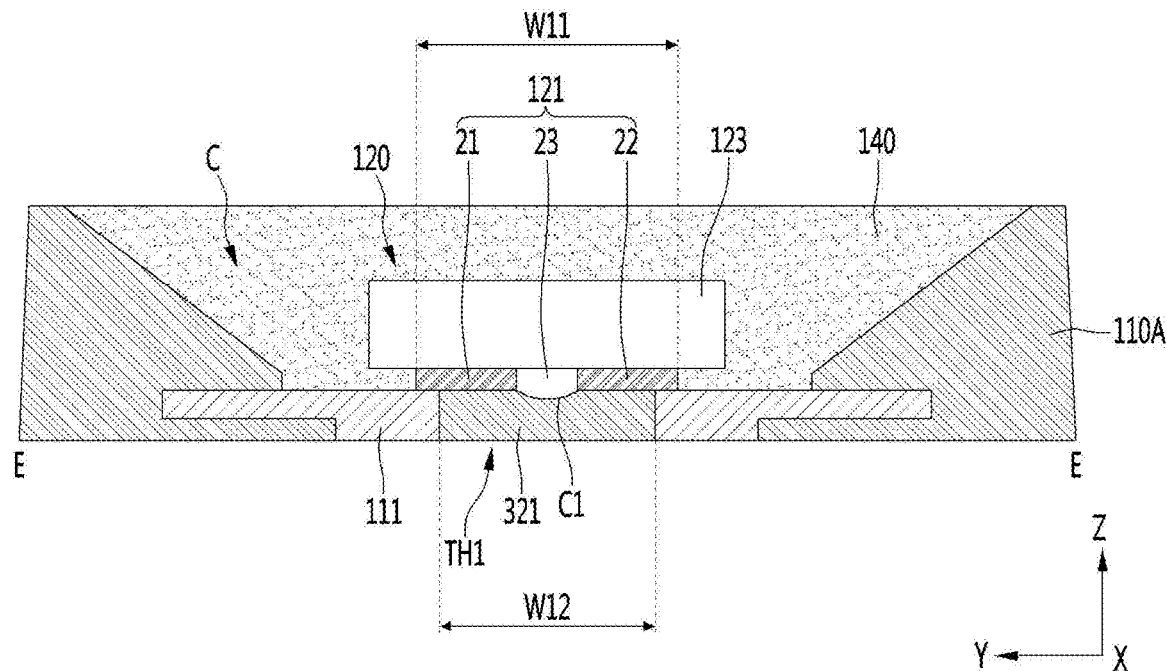
FIG. 4 is a cross-sectional view taken along the line E-E of the light emitting device package shown in FIG. 1.
Figure 5:
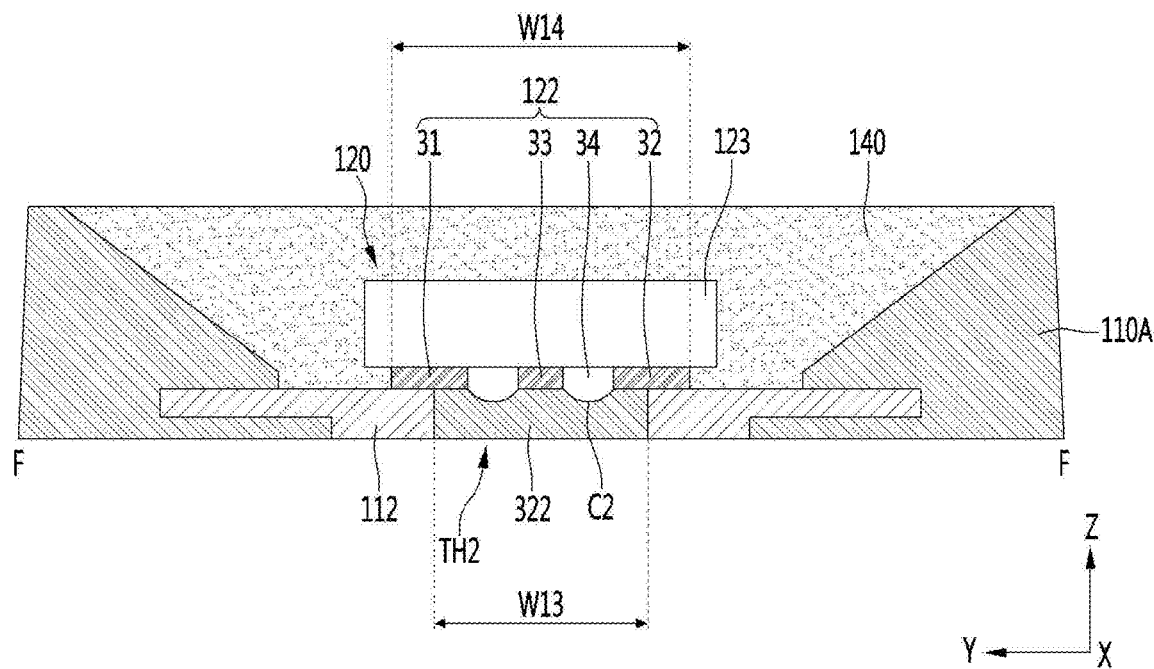
FIG. 5 is a cross-sectional view taken along line F-F of the light emitting device package shown in FIG. 1.
Figure 6:
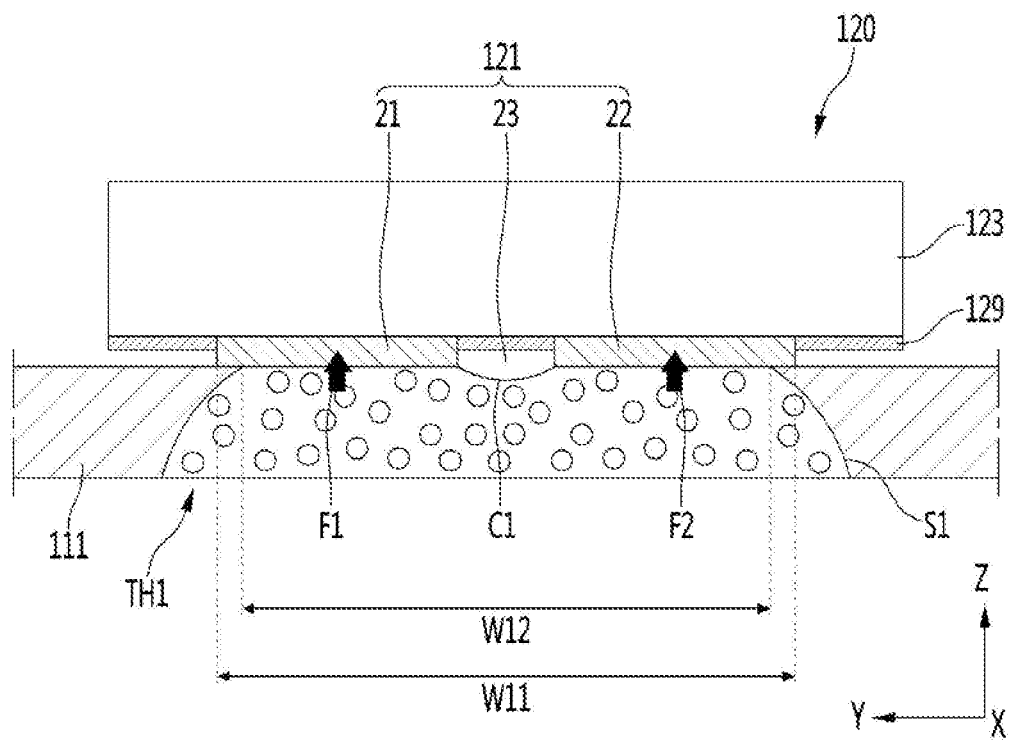
FIG. 6 is a detailed view illustrating a first bonding pad and a first conductive part of the light emitting device of FIG. 4.
Figure 7:
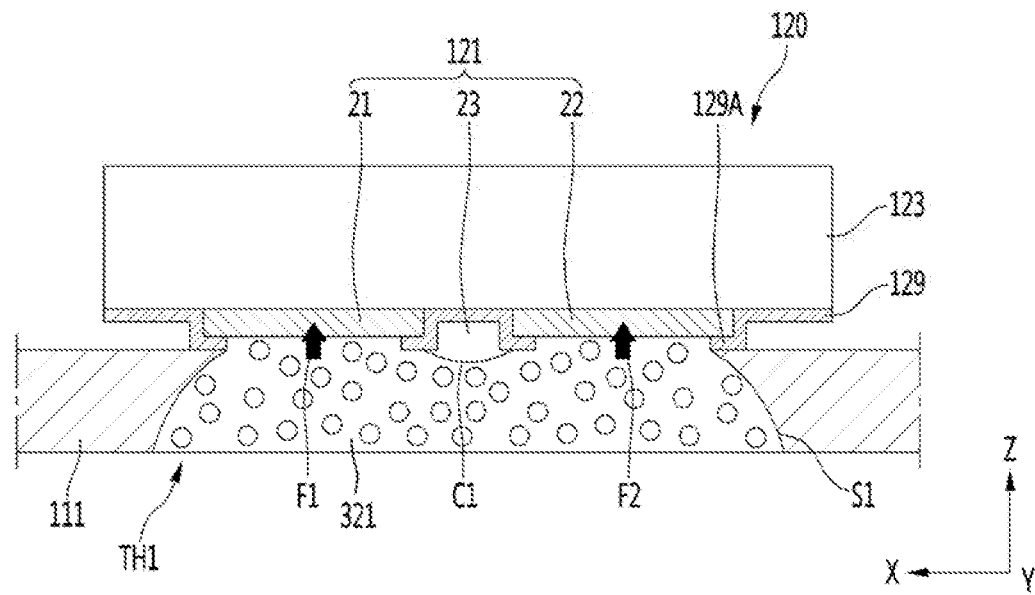
FIG. 7 is another example of a detailed view illustrating a first bonding pad and a first conductive part of the light emitting device of FIG. 4.
Figure 8:
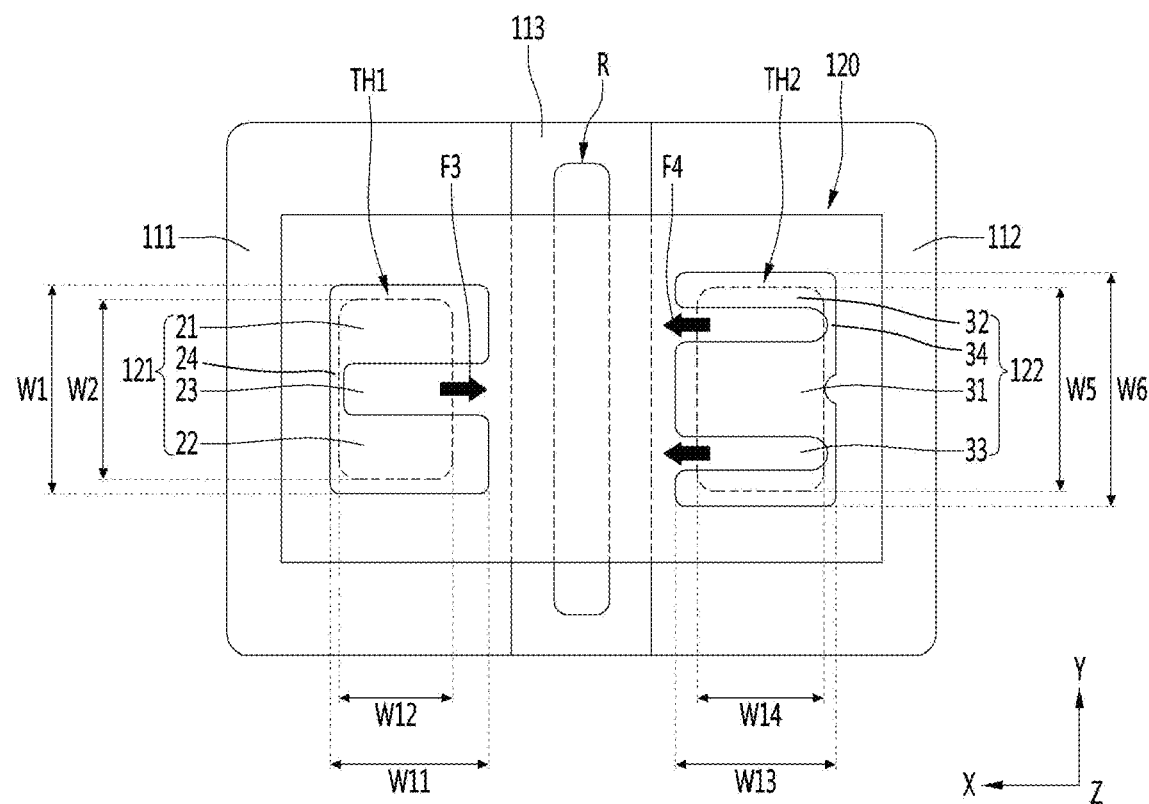
FIG. 8 is an enlarged view of a portion of the light emitting device package of FIG. 1.
Figure 9:
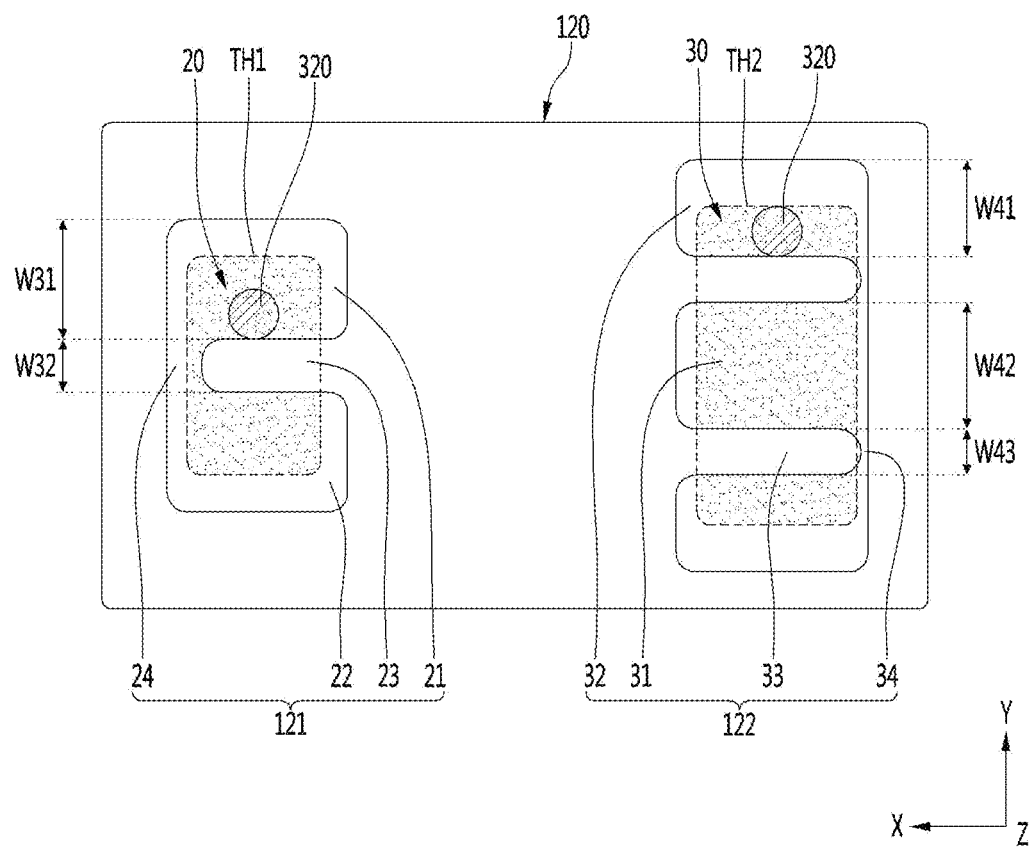
FIG. 9 is a view for explaining a contact and non-contact region between the first and second conductive parts and the first and second bonding pads of the light emitting device of FIG. 8.

FIG. 1 is a plan view of a light emitting device package according to a first embodiment of the invention, FIG. 2 is a bottom view of the light emitting device package shown in FIG. 1, FIG. 4 is a cross-sectional view taken along the line E-E of the light emitting device package shown in FIG. 1, FIG. 5 is a cross-sectional view along the F-F line of the light emitting device package shown in FIG. 1, FIG. 6 is a detailed view showing a first bonding pad and a first conductive part of the light emitting device of FIG. 4, FIG. 7 is another example of a detailed view showing a first bonding pad and a first conductive part of the light emitting device of FIG. 4, FIG. 8 is a part of the light emitting device package of FIG. 1, FIG. 9 is a view for explaining contact and non-contact regions between the first and second conductive parts and the first and second bonding pads of the light emitting device of FIG. 8.

FIGS. 1 to 5, an device package 100 according to an embodiment of the invention includes a package body 110 having a plurality of frames 111 and 112 and a body 113 disposed between the plurality of frames 111 and 112, and a semiconductor device disposed on the plurality of frames 111 and 112. For example, the semiconductor device includes a light emitting device 120 disposed on the plurality of frames 111 and 112. Hereinafter, the device package 100 will be described as a light emitting device package in which the light emitting device 120 is disposed.

<Package Body 110>

The plurality of frames 111 and 112 may include at least two, for example, a first frame 111 and a second frame 112. The first frame 111 and the second frame 112 may be spaced apart from each other. The first and second frames 111 and 112 may be spaced apart in a first direction X. The first direction may be an X direction, the second direction may be a Y direction, and the third direction may be a thickness direction of the package or a direction orthogonal to the first and second directions.

The package body 110 may include a body 113. The body 113 may be disposed between the first frame 111 and the second frame 112. The body 113 may function as an electrode separation line. The body 113 may be referred to as an insulating member. The body 113 may be disposed in a second direction between two opposing frames 111 and 112.

The body 113 may be disposed on the first frame 111. The body 113 may be disposed on the second frame 112. The body 113 may provide an inclined surface disposed on the first frame 111 and the second frame 112. The body 113 may provide the wall portion 110A having the cavity C on the first frame 111 and the second frame 112 by the inclined surface. The wall portion 110A may be integrally formed with the body 113 or may be formed separately. According to an embodiment of the present invention, the package body 110 may be provided with a structure having a cavity C. The package body 110 may be provided with a flat structure without a cavity C on the upper part, or the wall part 110A may be removed.

The body 113 may include an insulating material or a resin material. For example, the body 113 may be formed of a material selected from the group consisting of Polyphthalamide (PPA), Polychloro Tri phenyl (PCT), Liquid Crystal Polymer (LCP), Polyamide 9T, Silicone, and Epoxy molding compound (EMC), Photo sensitive glass (PSG), sapphire (Al2O3), and the like. The body 113 may include high refractive index fillers such as TiO2 and SiO2.

The first frame 111 and the second frame 112 may include a conductive frame. The first frame 111 and the second frame 112 can stably provide the structural strength of the package body 110 and can be electrically connected to the light emitting device 120. When the first frame 111 and the second frame 112 are conductive frames, the first frame 111 and the second frame 112 may be defined as a lead frame and may radiate heat or reflect light generated from the light emitting device 120.

The first and second frames 111 and 112 may include a conductive material. The first and second frames 111 and 112 are made of a metal such as Pt, Ti, Ni, Cu, Au, Ta, Al, Ag, and may be a single layer or a multi-layer having different metal layers.

As another example, the first frame 111 and the second frame 112 may be provided as an insulating frame. When the first frame 111 and the second frame 112 are an insulating frames, the structural strength of the package body 110 can be stably provided. When the first frame 111 and the second frame 112 are an insulating frames, the body 113 and the frames 111 and 112 may be integrally formed of the same material or may be made of different materials. The difference between the case where the first frame 111 and the second frame 112 are formed of an insulating frame and the case of forming a conductive frame will be described later.

When the first and second frames 111 and 112 are made of an insulating material, the first and second frames 111 and 112 may be made of a resin material or an insulating material. Examples of the material include Polyphthalamide (PPA), Polychloro Tri phenyl (PCT), liquid crystal polymer (LCP), Silicone, Epoxy molding compound (EMC), Silicone molding compound (SMC), ceramic, photo sensitive glass (PSG), sapphire ($Al_2O_3$), and the like. In addition, the first and second frames 111 and 112 may include a high refractive index filler such as $TiO_2$ and $SiO_2$ as an epoxy material. The first and second frames 111 and 112 may be made of a reflective resin. Hereinafter, for convenience of explanation, the first and second frames 111 and 112 are made of a metal material.

As shown in FIGS. 1 and 2, the first frame 111 may protrude more outward than the first side of the package body 110. The second frame 112 may protrude further than the second side opposite the first side of the package body 110.

<Light Emitting Device 120>

The light emitting device 120 may include a plurality of bonding pads 121 and 122 and a light emitting part 123 including a semiconductor layer. One or a plurality of the light emitting devices 120 may be disposed on the first and second frames 111 and 112. For convenience of explanation, a structure in which one light emitting device is disposed on the first and second frames 111 and 112 will be described.

The light emitting part 123 may include a first conductivity type semiconductor layer, a second conductivity type semiconductor layer, and an active layer disposed between the first conductivity type semiconductor layer and the second conductivity type semiconductor layer. The first bonding pad 121 may be electrically connected to the first conductivity type semiconductor layer. The second bonding pad 122 may be electrically connected to the second conductivity type semiconductor layer. The semiconductor layer of the light emitting part 123 may be provided as a compound semiconductor. The semiconductor layer may be provided, for example, as a Group II-VI or III-V compound semiconductor. For example, the semiconductor layer may be provided with at least two or more elements selected from aluminum (Al), gallium (Ga), indium (In), phosphorus (P), and arsenic (As). The semiconductor layer may include a first conductivity type semiconductor layer, an active layer, and a second conductivity type semiconductor layer.

The first and second conductivity type semiconductor layers may be formed of at least one of Group III-V or Group II-VI compound semiconductors. The first and second conductivity type semiconductor layers may be formed of a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group consisting of GaN, AlN, AlGaN, InGaN, InN, InAlGaN, AlInN, AlGaAs, GaP, GaAs, GaAsP, and AlGaInP. The first conductivity type semiconductor layer may be an n-type semiconductor layer doped with an n-type dopant such as Si, Ge, Sn, Se, or Te.

The second conductivity type semiconductor layer may be a p-type semiconductor layer doped with a p-type dopant such as Mg, Zn, Ca, Sr, or Ba.

The active layer may be formed of a compound semiconductor. The active layer may be embodied, for example, in at least one of Group III-V or Group II-VII compound semiconductors. When the active layer is implemented as a multi-well structure, the active layer may include a plurality of alternately arranged well layers and a plurality of barrier layers. At least one of the well layer and the barrier layer may be disposed of a semiconductor material having a composition formula of $In_xAl_yGa_{1-x-y}N$ ($0 \leq x \leq 1$, $0 \leq y \leq 1$, $0 \leq x+y \leq 1$). For example, the pair of the well layer/barrier layer of the active layer may be formed of at least one selected from the group consisting of InGaN/GaN, GaN/AlGaN, AlGaN/AlGaN, InGaN/InGaN, InGaN/InGaN, AlGaAs/GaAs, InGaAs/GaAs, InGaP/GaP, AlInGaP/InGaP, InP/GaAs.

The light emitting device 120 may be disposed on the package body 110. The light emitting device 120 may be disposed on the first frame 111 and the second frame 112. The light emitting device 120 may overlap the first frame 111 and the second frame 112 in the vertical direction, for example, the Z axis direction. The light emitting device 120 may be disposed in the cavity C. The first and second bonding pads 121 and 122 of the light emitting device 120 may be spaced apart from each other under the light emitting part 123. The first and second bonding pads 121 and 122 may be disposed between the light emitting part 123 and the first and second frames 111 and 112. The first and second bonding pads 121 and 122 may face the frames 111 and 112 in a vertical direction. The first bonding pad 121 may be disposed on the first frame 111. The second bonding pad 122 may be disposed on the second frame 112. The first bonding pad 121 may face the first frame 111 and the second bonding pad 122 may face the second frame 112. The first bonding pad 121 and the second bonding pad 122 may be spaced apart from each other on a lower surface of the light emitting device 120.

The first bonding pad 121 may be disposed between the semiconductor layer of the light emitting part 123 and the first frame 111. The second bonding pad 122 may be disposed between the semiconductor layer of the light emitting part 123 and the second frame 112. The first bonding pad 121 may be disposed between the first conductivity type semiconductor layer and the first frame 111. The second bonding pad 122 may be disposed between the second conductivity type semiconductor layer and the second frame 112. The first bonding pad 121 and the second bonding pad 122 may be formed of one selected from the group consisting of Ti, Al, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, Ni/$IrO_x$, or like, and may formed in single or multiple layers using at least one material or alloy selected from the group.

<Through Holes TH1 and TH2 of the Body>

Referring to FIGS. 2 to 5, the light emitting device package 100 according to an embodiment of the invention may include at least two through holes. The through hole may be disposed on the first and second frames 111 and 112 or on the body 113 disposed under the light emitting device 120. The through hole may include a hole vertically penetrating an upper surface and a lower surface of the frames or the body. The through hole may include a first through hole TH1 and a second through hole TH2. The first frame 111 may include the first through hole TH1. The second frame 112 may include the second through hole TH2.

The first through hole TH1 may be provided in one or more in the first frame 111. The first through hole TH1 may be provided through the first frame 111. The first through hole TH1 may be pass through the upper surface and the lower surface of the first frame 111 in the vertical direction Z.

The first through hole TH1 may be disposed under the first bonding pad 121 of the light emitting device 120. The first through hole TH1 may be provided to overlap with the first bonding pad 121 of the light emitting device 120 in the vertical direction. The first through hole TH1 may be overlapped with the first bonding pad 121 of the light emitting device 120 in a direction toward the lower surface from the lower surface of the first frame 111.

The second through holes TH2 may be provided in one or more in the second frame 112. The second through hole TH2 may be provided through the second frame 112. The second through hole TH2 may be provided through the upper surface and the lower surface of the second frame 112 in a vertical direction.

The second through hole TH2 may be disposed under the second bonding pad 122 of the light emitting device 120. The second through hole TH2 may be provided to overlap with the second bonding pad 122 of the light emitting device 120. The second through hole TH2 may be overlapped with the second bonding pad 122 of the light emitting device 120 in a direction toward the lower surface from the upper surface of the second frame 112.

The first through hole TH1 and the second through hole TH2 may be spaced apart from each other. The first through hole TH1 and the second through hole TH2 may be spaced apart from each other under the lower surface of the light emitting device 120. The first through hole TH1 and the second through hole TH2 may overlap the light emitting device 120 in the third direction. The first through hole TH1 and the second through hole TH2 may be disposed in a region overlapping the light emitting device 120 and may be spaced apart from the body 113.

Figure 3:
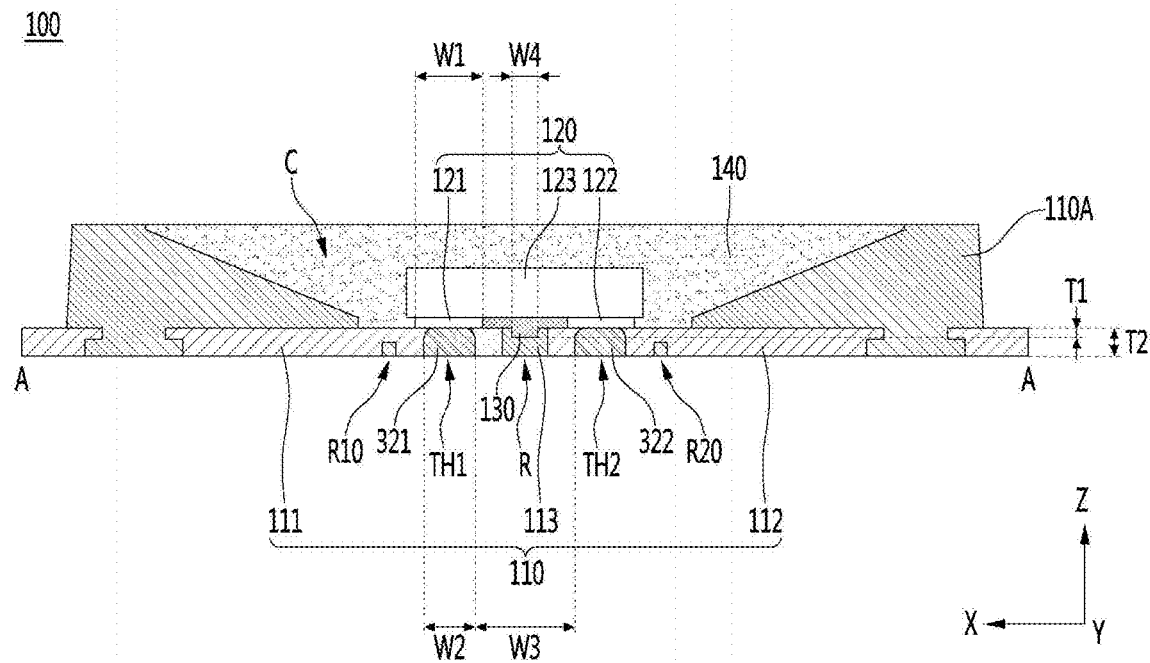
FIG. 3 is a cross-sectional view taken along the line D-D of the light emitting device package shown in FIG. 1.

Referring to FIGS. 3 and 8, according to an embodiment of the invention, the width W2 of the upper region of the first through hole TH1 in the X direction may be equal to or smaller than the width W1 of the first bonding pad 121. In addition, the width of the upper region of the second through hole TH2 in the X direction may be equal to or smaller than the width of the second bonding pad 122. The widths of the first and second through holes TH1 and TH2 in the X direction may be equal to or different from each other. The widths of the first and second bonding pads 121 and 122 in the X direction may be the same or different from each other.

Referring to FIGS. 4 and 8, according to an embodiment of the invention, a length W12 of the upper region of the first through hole TH1 in the Y direction may be equal to or smaller than the length W11 of the first bonding pad 121. The length W13 of the upper region of the second through hole TH2 in the Y direction may be equal to or smaller than the length W14 of the second bonding pad 122 as shown in FIG. 5. The lengths W2 and W5 of the first and second through holes TH1 and TH2 in the Y direction may be the same or different from each other. The lengths W1 and W6 of the first and second bonding pads 121 and 122 in the Y direction may be the same or different from each other. Here, when the lengths of the bonding pads 121 and 122 are W13≥W11, the lengths of the through holes TH1 and TH2 may have a relationship of W12≥W14. The upper areas of the through holes TH1 and TH2 may be at least 50% or 50% to 110% of the bottom area of the bonding pads 121 and 122, respectively. In addition, each of the through holes TH1 and TH2 and each bonding pad 121 and 122 may have a non-overlapping region that does not overlap with a partially overlapping region. Accordingly, the first bonding pad 121 and the first frame 111 of the light emitting device 120 may be attached by a material provided by the first through hole TH1. The second bonding pad 122 and the second frame 112 of the light emitting device 120 may be attached by a material provided by the first through hole TH1.

A distance from the upper region of the second through hole TH2 to the side end of the second bonding pad 122 in the X direction may be 40 micrometers or more, for example, 40 to 60 micrometers. When the distance is equal to or greater than 40 micrometers, a process margin for preventing the second bonding pad 122 from being exposed at the bottom of the second through hole TH2 can be secured. When the distance is less than 60 micrometers, the area of the second bonding pad 122 exposed to the second through hole TH2 can be ensured, and a resistance of the second bonding pad 122 exposed by the second through hole TH2 can be lowered, and a current injection through the second bonding pad 122 exposed by the second through hole TH2 can be improved.

Figure 19:
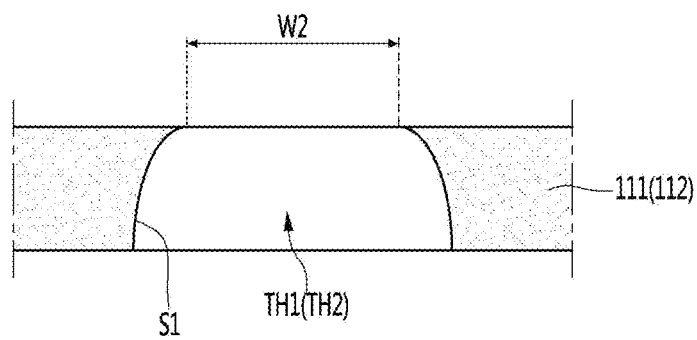
FIGS. 19 to 22 are examples of through holes of a light emitting device according to an embodiment of the invention.
Figure 20:
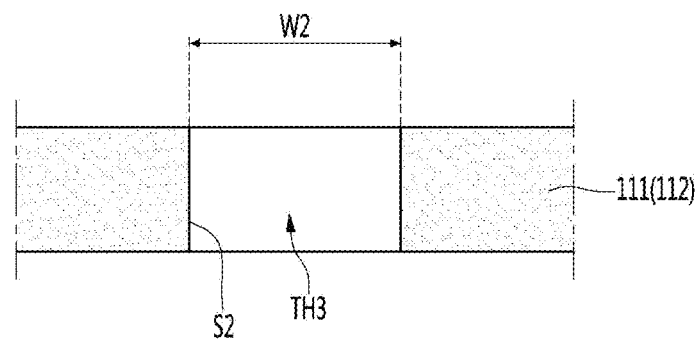
Figure 21:
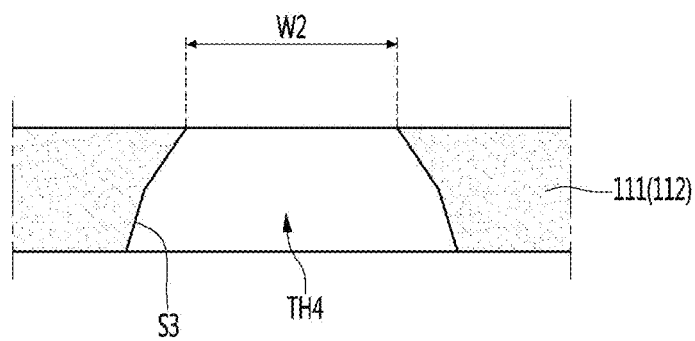
Figure 22:
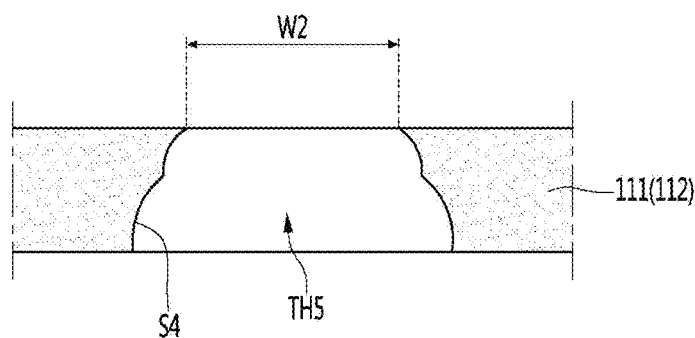

Referring to FIGS. 8 and 19, the width W2 of the upper region of the first through hole TH1 in the X direction may be smaller than the width of the lower region of the first through hole TH1 or may be equal to a width of a through hole TH3 as shown in FIG. 20. The width of the upper region of the second through hole TH2 may be smaller than the width of the lower region of the second through hole TH2 or may be provided in the through hole TH3 having the same width as in FIG. 20. As shown in FIG. 19, the circumference surfaces of the through holes TH1 and TH2 may be a convex curved surface S1 or may be a vertical plane S2 as shown in FIG. 20.

The through holes TH1, TH2, TH3, and TH5 may be provided in such a shape that the width in the X or Y direction gradually decreases from the lower region to the upper region thereof. The circumference surfaces S1, S3 and S4 between the upper and lower regions of the first and second through holes TH1 and TH2 may be a plurality of inclined planes S3 having different slopes, curved surfaces S1 or a curved surface S4 having a different curvature. The circumference surfaces of the through holes TH1, TH2, TH3, TH4 and TH5 may be at least one of a flat surface, a sloped surface and a curved surface. If the material of the frames 111 and 112 is formed of an insulating material, the through holes may be provided in a shape as shown in FIGS. 19 and 20. When the through hole formed of a conductive material, the thorough may be provided in a shape as shown in FIGS. 19 to 22.

An interval between the first through hole TH1 and the second through hole TH2 in the lower surface region of the first frame 111 and the second frame portion 112 may be at least 100 micrometers, or 100 to 150 micrometers. The interval between the through holes TH1 and TH2 may be a minimum distance to prevent an electrical short between the bonding pads when the light emitting device package 100 is mounted on a circuit board or a submount.

<Adhesive 130>

Referring to FIGS. 3 to 5, the light emitting device package 100 according to an embodiment of the invention may include an adhesive 130. The adhesive 130 may be disposed between the body 113 and the light emitting device 120. The adhesive 130 may be disposed between the upper surface of the body 113 and the lower surface of the light emitting device 120. The adhesive 130 may overlap the Z direction perpendicular to a lower surface of the light emitting device 120. The adhesive 130 may be adhered to the light emitting device 120 and the body 113. The adhesive 130 may be disposed between the first bonding pad 121 and the second bonding pad 122 of the light emitting device 120 or may be in contact with the first and second bonding pads 121 and 122.

<Recess R of the Body>

As shown in FIGS. 1, 2 to 5, the light emitting device package 100 according to the embodiment of the invention may include a recess R. The recess R may be provided on the body 113 or an upper portion of the body 113. The recess R may be provided between the first through hole TH1 and the second through hole TH2. The recess R may be recessed in a downward direction from an upper surface of the body 113. The recesses R may be disposed in one or more under the light emitting device 120. The recesses R may be provided to overlap with the light emitting device 120 in the Z direction. The adhesive 130 may be disposed in the recess R. The adhesive 130 may provide a stable fixing force between the light emitting device 120 and the package body 110. The adhesive 130 may provide a stable fixing force between the light emitting device 120 and the body 113. The adhesive 130 may be disposed in direct contact with the upper surface of the body 113. In addition, the adhesive 130 may be disposed in direct contact with the lower surface of the light emitting device 120.

For example, the adhesive 130 may include at least one of an epoxy-based material, a silicone-based material, a hybrid material including an epoxy-based material and a silicon-based material. As an example, if the adhesive 130 comprises a reflective function, the adhesive 130 may comprise a white silicone.

The adhesive 130 may provide a stable fixing force between the body 113 and the light emitting device 120. The adhesive 130 may provide a light diffusion function between the light emitting device 120 and the body 113 when light is emitted to the lower surface of the light emitting device 120. When the light is emitted from the light emitting device 120 to the lower surface of the light emitting device 120, the adhesive 130 may provide a light diffusion function. Accordingly, the light extraction efficiency of the light emitting device package 100 can be improved. In addition, the adhesive 130 may reflect light emitted from the light emitting device 120. When the adhesive 130 includes a reflection function, the adhesive 130 may be formed of a material including $TiO_2$, silicone, and the like.

As shown in FIG. 3, a depth T1 of the recess R may be smaller than a depth T2 of the first through hole TH1 or a depth T2 of the second through hole TH2 according to the embodiment of the invention. The depth T1 of the recess R may be determined in consideration of the adhesive force of the adhesive 130. The depth R of the recess R may be considered by the stable strength of the body 113 or may not to occur a cracking by a heat emitted from the light emitting device 120 on the light emitting device package 100.

The recess R may provide a suitable space in which an underfill process may be performed under the light emitting device 120. The underfill process may be a process of disposing the adhesive 130 under the light emitting device 120, after mounting the light emitting device 120 on the package body 110. The underfill process is performed by disposing the light emitting device 120, after disposing the adhesive 130 in the recess R in the process of mounting the light emitting device 120 on the package body 110. The recess R may be greater than or equal to the first depth to sufficiently provide the adhesive 130 between the lower surface of the light emitting device 120 and the upper surface of the body 113. In addition, the recess R may be smaller than or equal to a second depth to provide a stable strength of the body 113.

The depth T1 of the recess R and the width W4 in the X direction may affect the forming position and fixing force of the adhesive 130. The depth T1 and the width W4 of the recess R may be determined so that a sufficient fixing force can be provided by the adhesive 130 disposed between the body 113 and the light emitting device 120. By way of example, the depth T1 of the recess R may be greater than or equal to 40 micrometers or may be provided in the range of 40 to 60 micrometers.

The width W4 of the recess R may be narrower than the interval between the first bonding pad 121 and the second bonding pad 122 in the X direction of the light emitting device 120. The width W4 may be greater than or equal to 140 micrometers, or may be provided in the range of 140 to 160 micrometers. The length of the recess R in the Y direction may be greater or smaller than the length of the light emitting device 120 in the Y direction. A formation of the adhesive 130 may be guided by the length of the recess R and the adhesion in the Y direction may be strengthened by the adhesive 130 on the length of the recess R.

The depth T2 of the first through hole TH1 may be equal to the thickness of the first frame 111. The depth T2 of the first through hole TH1 may be provided to a thickness sufficient to maintain a stable strength of the first frame 111. The depth T2 of the second through hole TH2 may be equal to the thickness of the second frame 112. The depth T2 of the second through hole TH2 may be provided to a thickness capable of maintaining a stable strength of the second frame 112.

The depth T2 of the first through hole TH1 and the depth T2 of the second through hole TH2 may be the same as the thickness of the body 113. The depth T2 of the first through hole TH1 and the depth T2 of the second through hole TH2 may be provided to maintain the stable strength of the body 113. For example, the depth T2 of the first through hole TH1 may be 180 micrometers or more, or 180 to 220 micrometers. As an example, the difference T2−T1 of the depths T2 and T1 may be selected to be 100 micrometers or more. This is in consideration of the thickness of the injection process capable of providing crack free of the body 113.

According to an embodiment of the invention, the ratio T2/T1 of the depth T1 to the depth T2 may be provided in the range of 2 to 10. As an example, if the depth T2 is provided at 200 micrometers, the depth T1 may be provided at 20 micrometers to 100 micrometers.

<Molding Part 140>

As shown in FIGS. 1, 2 to 5, the light emitting device package 100 according to the embodiment of the invention may include a molding part 140. The molding part 140 may be provided on the light emitting device 120. The molding part 140 may be disposed on the first frame 111 and the second frame 112. The molding part 140 may be disposed in the cavity C provided by the package body 110.

The molding part 140 may include an insulating material. The molding part 140 may include wavelength conversion means for receiving light emitted from the light emitting device 120 and providing wavelength-converted light. For example, the molding part 140 may include at least one selected from the group including phosphors, quantum dots, and the like. The light emitting device 120 may emit light of blue, green, red, white, infrared, or ultraviolet rays. The phosphors or quantum dots may emit blue, green or red light. The molding part 140 may not be formed.

<Conductive Parts 321 and 322>

As shown in FIGS. 3 to 5, the light emitting device package 100 according to an embodiment of the invention may include a first conductive part 321 and a second conductive part 322. The first conductive part 321 may be spaced apart from the second conductive part 322. The first conductive part 321 and the second conductive part 322 may be physically and electrically separated from each other.

The first conductive part 321 may be disposed in the first through hole TH1. The first conductive part 321 may be disposed under the first bonding pad 121. The width and length of the first conductive part 321 in the X and Y directions may be less than the width and length of the first bonding pad 121.

The first bonding pad 121 may have a width in the X direction perpendicular to the Z direction in which the first through hole TH1 is formed. The width of the first bonding pad 121 may be greater than the width W2 of the first through hole TH1 in the X direction.

The first conductive part 321 may be disposed in direct contact with the lower surface of the first bonding pad 121. The first conductive part 321 may be electrically connected to the first bonding pad 121. The first frame 111 may be disposed around the first conductive part 321.

The second conductive part 322 may be disposed in the second through hole TH2. The second conductive part 322 may be disposed under the second bonding pad 122. The width and length of the second conductive part 322 in the X and Y directions may be smaller than the width and length of the second bonding pad 122. The second bonding pad 122 may have a width W13 in the X direction perpendicular to the Z direction in which the second through hole TH2 is formed. The width W13 of the second bonding pad 122 in the X direction may be greater than the width W14 of the second through hole TH2 in the X direction.

The second conductive part 322 may be disposed in direct contact with the lower surface of the second bonding pad 122. The second conductive part 322 may be electrically connected to the second bonding pad 122. The second frame 112 may be disposed around the second conductive part 322.

The first conductive part 321 and the second conductive part 322 may be include at least one material selected from the group consisting of Ag, Au, Pt, Sn, Cu, Zn, In, Bi, Ti, or an alloy thereof. The first conductive part 321 and the second conductive part 322 may be formed of a material capable of ensuring a conductive function. The first and second conductive parts 321 and 322 are solder pastes, and may be formed by mixing powder particles or particles and flux. The solder paste may include Sn—Ag—Cu, and the weight percentage of each metal may be varied.

For example, the first conductive part 321 and the second conductive part 322 may be formed using a conductive paste. The conductive paste may include a solder paste, a silver paste, or the like, and may be composed of a multilayer which is composed of different materials or a multilayer or a single layer which is formed of an alloy.

The light emitting device package 100 according to the embodiment of the present invention can supply power to the first bonding pad 121 through the first conductive part 321 of the first through hole TH1, TH2 through the second conductive part 322 of the second bonding pad 122. When the first and second frames 111 and 112 are made of a conductive material, the first and second frames 111 and 112 may be electrically connected to the bonding pads 121 and 122 of the light emitting device 120. The bonding pads 121 and 122 of the light emitting device 120 may be electrically connected to at least one or both of the first and second conductive parts 321 and 322 and the frames 111 and 112.

Accordingly, the light emitting device 120 can be driven by the driving power supplied through the first bonding pad 121 and the second bonding pad 122. The light emitted from the light emitting device 120 may be provided in an upward direction of the package body 110.

<Lower Recess R10 and R20>

As shown in FIGS. 1 to 3, the light emitting device package 100 according to an embodiment of the invention may include a first lower recess R10 and a second lower recess R20. The first lower recess R10 and the second lower recess R20 may be spaced apart from each other.

The first lower recess R10 may be provided on the lower surface of the first frame 111. The first lower recess R10 may be concave on the lower surface of the first frame 111 in the top surface direction of the first frame 111. The first lower recess R10 may be spaced apart from the first through hole TH1. A resin portion may be provided in the first lower recess R10. For example, the resin portion filled in the first lower recess R10 may be provided with the same material as that of the body 113. The resin portion may be selected from materials having adhesion and poor wettability with the first and second conductive parts 321 and 322. Alternatively, the resin portion may be selected from materials having a low surface tension with respect to the first and second conductive parts 321 and 322. For example, the resin portion filled in the first lower recess R10 may be provided in the process of forming the package body including the first frame 111, the second frame 112, and the body 113 through an injection process.

The resin portion filled in the first lower recess R10 may be disposed around a first lower surface region of the first frame 111 providing the first through hole TH1. As shown in FIG. 2, the first lower surface region of the first frame 111 in which the first through holes TH1 may disposed may be disposed in an island shape and may be separated from a second lower surface region constituting a lower surface of the first frame 111. For example, the first lower surface region of the first frame 111 in which the first through holes TH1 is disposed, may be isolated from the second lower surface region of first frame 111 formed by a resin portion filled in the first lower recess R10 and the body 113. The first lower surface region of the first frame 111 in which the first through hole TH1 is disposed is island-shaped shape and is separated from the second lower surface region constituting the first frame 111. For example, the first lower surface region of the first frame 111, in which the first through hole TH1 is disposed, may be isolated from the second bottom surface region of the first frame 111 and a resin portion filled in the first lower recess R10. As another example, the first and second bottom surface regions of the first frame 111 may be connected to each other.

Therefore, when the material of the resin portion may be poor in adhesion or wettability with the first and second conductive parts 321 and 322, or may be low in surface tension with respect to the first and second conductive parts 321 and 322, a part of the first and second conductive parts 321 and 322 may be leak from the first and second through holes TH1 and TH2. At this time, the material of the resin portion or the body 113 filled in the first and second lower recesses R10 and R20 may prevent the conductive parts 321 and 322 disposed in the through holes TH1 and TH2 from leaking or diffusing in the other direction. The resin portion or the body 113 may be made of a material having poor adhesion, wettability, and surface tension with respect to the first and second conductive parts 321 and 322. The material of the first and second conductive parts 321 and 322 may be selected to have good adhesion properties with the first and second frames 111 and 112. The material constituting the first and second conductive parts 321 and 322 may be selected to have poor adhesion properties with the resin portion and the body 113.

Whereby, the first conductive part 321 may be prevented from overflowing or spreading out of the region provided with the resin portion or the body 113 in the first through hole TH1, and may be stably disposed in a region where the first through hole TH1 is provide. Therefore, the first conductive part 321 disposed in the first through hole TH1 may be prevented from being extended by the resin portion or the outer region of the first lower recess R10. In addition, the first conductive part 321 may be stably connected to the lower surface of the first bonding pad 121 in the first through hole TH1.

The first conductive part 321 may extend from the first through hole TH1 to the first lower recess R10. Therefore, the first conductive part 321 and/or the resin portion may be disposed in the first lower recess R10. The second lower recess R20 may be provided on the lower surface of the second frame 112. The second lower recess R20 may be concave in the top surface direction from the lower surface of the second frame 112. The second lower recess R20 may be spaced apart from the second through hole TH2. For example, a resin portion filled in the second lower recess R20 is formed by the injection molding process of the first frame 111, the second frame 112, and the body 113.

A resin portion filled in the second lower recess R20 may be disposed around a first lower surface region of the second frame 112 providing the second through hole TH2. As shown in FIG. 2, the first lower surface region of the second frame 112 in which the second through hole TH2 is disposed, is formed of an island shape and may be separated from a second lower surface region of the second frame 112 around the island. The first lower surface region of the second frame 112, which provides the second through hole TH2, may be isolated from the second lower surface region of the second frame 112 by a resin portion filled in the second lower recess R20 and a lower portion of the body 113. Accordingly, the second conductive part 322 can be prevented from flowing outwardly of the second through hole TH2, or may be prevented from overflowing or spreading outside the region where the resin portion or the body 113 is provide. Accordingly, the second conductive part 322 may be stably disposed in the region provided with the second through hole TH2. Therefore, the first conductive part 322 disposed in the second through hole TH2 may be prevented from being extended by the outer region of the resin portion or the second lower recess R20. In addition, the second conductive part 322 may be stably connected to the lower surface of the second bonding pad 122 in the second through hole TH2.

Therefore, when the light emitting device package is mounted on the circuit board, the first conductive part 321 and the second conductive part 322 may not contact each other. The first and second conductive parts 321 and 322 may easily control the amount of the implantation.

The second conductive part 322 may extend from the second through hole TH2 to the second lower recess R20. Accordingly, the second conductive part 321 and/or the resin portion may be disposed in the second lower recess R20. The lower recesses R10 and R20 may be disposed in one or more of the frames 111 and 112, respectively.

The conductive parts 321 and 322 injected into the through holes TH1 and TH2 and curing in the embodiments may brought into contact with the conductive parts 321 and 322 and the bonding pads 121 and 122 of the light emitting device 120 may be pulled. When the conductive parts 321 and 322 attract the bonding pads 121 and 122 of the light emitting device 120, the bonding pads 121 and 122 may be partially separated from the light emitting part 123 or the semiconductor layer, and a contact region between the bonding pad and the conductive part may be reduced, and a power supply efficiency may be lowered. The interface between the semiconductor layer and the bonding pads 121 and 122 may be separated so that the power supplied to the bonding pads 121 and 122 may not be smoothly supplied to the semiconductor layer.

The contact region of the bonding pads 121 and 122 of the light emitting device 120 in the embodiment of the invention may be dispersed by the non-contact region or may be reduced in contacted area with the conductive parts 321 and 322 for partial contact with the conductive parts 321 and 322. In this case, since the light emitting device 120 secures a sufficient shear force (DST: Die Shear Strength) by the conductive parts 321 and 322 and the adhesive 130, the conductive parts 321 and 322 may be distributed and contacted with the bonding pads 121 and 122. When the conductive parts 321 and 322 is partially contacted with the bonding pads 121 and 122, an adhesive force between the light emitting device 120 and the adhesive 130 may not fall below a predetermined standard.

At least one or both of the bonding pads 121 and 122 of the light emitting device 120 in the embodiment of the invention may include a regions that are not in contact with the conductive parts 321 and 322 on the through holes TH1 and TH2. At least one or both of the bonding pads 121 and 122 may include a contacting region with the conductive parts 321 and 322 and a non-contacting region from the conductive parts 321 and 322 on the through holes TH1 and TH2. Each of the bonding pads 121 and 122 may include a contact region and a non-contact region. For convenience of explanation, a region contacting each of the conductive parts 321 and 322 in the bonding pads 121 and 122 is a contact region, and a non-contacting region may be defined as a non-contact region. In the bonding pads 121 and 122, the contact region may include one or a plurality of regions. The non-contact region in each of the bonding pads 121 and 122 may include one or more regions. The contact region may be a part of the lower surface of the bonding pads 121 and 122, and the non-contact region may be an open area without the bonding pad or an area where an insulating material is formed on the bonding pad surface. The first and second bonding pads 121 and 122 may include a concave part which may be the non-contact region.

As shown in FIGS. 4, 8 and 9, the first bonding pad 121 of the light emitting device 120 may include first contact regions 21 and 22 and a first non-contact region 23. The first contact regions 21 and 22 may be divided into one or a plurality of areas and the plurality of first contact regions 21 and 22 may be connected to each other by a first connection part 24. The first connection part 24 may be in contact with or non-contact with the conductive parts 321 and 322. The first connection part 24 may connect a power source between the plurality of first contact regions 21 and 22, and even if a contact region of a part of the first contact region with the conductive parts 321 and 322 is reduced, the power can be transmitted to the other area through the first connection part 24. The first non-contact region 23 may be an empty area or the resin portion may be filled.

A first non-contact region 23 in the first bonding pad 121 may be disposed adjacent to the first contact regions 21 and 22 or between the first contact regions 21 and 22. An area of the first non-contact region 23 may be smaller than an area of the top surface of the first through hole TH1. The first non-contact region 23 may be smaller than or equal to the width W11 of the first bonding pad 121 in the X direction or the length W1 of the first bonding pad 121 in the Y direction. The first non-contact region 23 may be disposed in one or a plurality of areas overlapping the first through hole TH1.

Referring to FIG. 8, the width W12 in the X direction in the first through hole TH1 may be smaller than or equal to the length W2 in the Y direction. The width W14 in the X direction in the second through hole TH2 may be smaller than or equal to the length W6 in the Y direction. The area of the virtual line connecting the outer edge of the first bonding pad 121 may be greater than the area of the top surface of the first through hole TH1. The area of the virtual line connecting the outer edge of the second bonding pad 122 may be larger than the area of the top surface of the second through hole TH2. The top surface area of the first bonding pad 121 may be smaller than or equal to the top surface area of the second bonding pad 122, but the present invention is not limited thereto.

The second bonding pad 122 of the light emitting device 120 may include a second contact region 31, 32 and a second non-contact region 33. The second non-contact region 33 may be an empty region or the resin portion may be filled. The second contact regions 31 and 32 may be divided into one or a plurality of regions and the plurality of second contact regions 31 and 32 may be connected to each other by a second connection part 34. The second connection part 34 may be in contact with or non-contact with the conductive parts 321 and 322. The second connection part 34 connects power between the plurality of second contact regions 31 and 32 so that the second connection part 34 can be electrically connected to the conductive parts 321 and 322, even if a contact region of a part of the first contact region with the conductive parts 321 and 322 is reduced, the power can be transmitted to the other area through the second connection part 34. The second non-contact region 33 may be an empty area or the resin portion may be filled.

In the second bonding pad 122, the second non-contact region 33 may be adjacent to the second contact region 31, 32 or may be disposed between the second contact regions 31 and 32. The area of the second non-contact region 33 may be smaller than the area of the top surface of the second through hole TH2. The second non-contact region 33 may be smaller than or equal to the width W13 of the second bonding pad 122 in the X direction or the length W6 of the second bonding pad 122 in the Y direction. The second non-contact region 33 may be disposed in one or more of the regions overlapping with the second through hole TH2.

Referring to FIG. 8, the first and second through holes TH1 and TH2 may have a relationship of W12<W11 and W14<W13 in the X direction, and W2<W1 and W5<W6 in the Y direction. The contact regions 21, 22, 31 and 32 of the conductive parts 321 and 322 and the bonding pads 121 and 122 may be dispersed through the first and second through holes TH1 and TH2 and an external force transmitted to the bonding pads 121 and 122 may be dispersed.

Referring to FIG. 4, the first contact regions 21 and 22 of the first bonding pad 121 are in contact with the first conductive parts 321 filled in the first through hole TH1 and the first non-contact region 33 may overlap the first through hole TH1 and the first conductive part 321 in the Z direction. Since the first non-contact region 23 corresponds to the first conductive part 321, the first contact region 21 and the second contact region 22 may be spaced apart from the first conductive part 321. The upper surface of the first conductive part 321 corresponding to the first non-contact region 23 may have a concave curved surface Cl. The first non-contact region 33 may be disposed between the first contact regions 21 and 22 in the Y direction or may be disposed adjacent to the center rather than an edge part of the light emitting device 120 in the Y direction.

Referring to FIG. 5, the second contact regions 31 and 32 of the second bonding pad 122 are in contact with the second conductive parts 322 filled in the second through hole TH2, The second non-contact region 33 may overlap the second through hole TH2 and the second conductive part 322 in the Z direction. Since the second non-contact region 33 corresponds to the second conductive part 322, the second contact regions 31 and 32 may be spaced apart from the second conductive part 322. The upper surface of the second conductive part 322 corresponding to the second non-contact region 33 may include a concave curved surface Cl. The second non-contact region 33 may be disposed between the second contact regions 31 and 32 in the Y direction or may be disposed adjacent to the center rather than the edge part of the light emitting device 120 in the Y direction.

Figure 23:
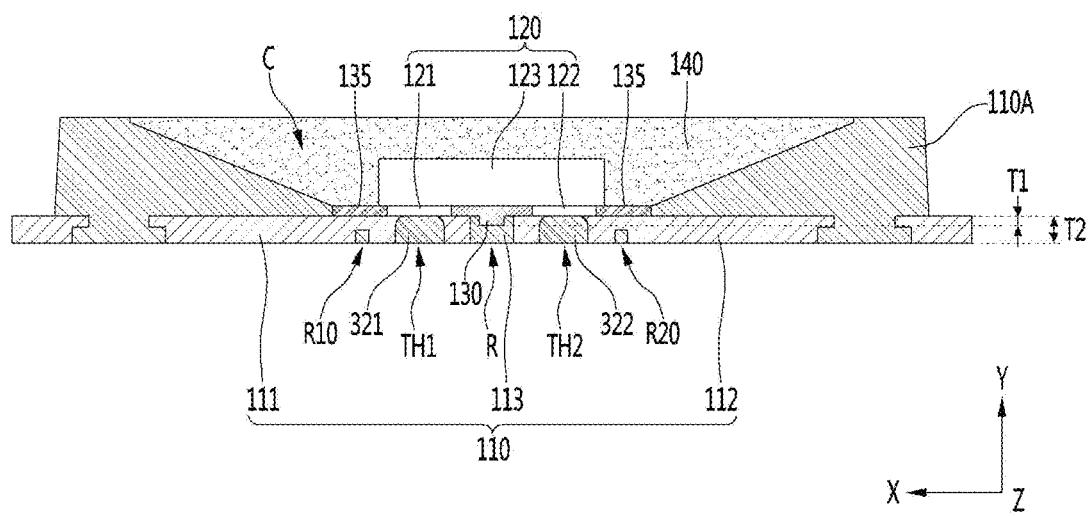
FIG. 23 is a first modification of the light emitting device package of FIG. 3.

The adhesive 130 may be disposed on the outer sides of the first and second non-contact regions 23 and 33 of the first and second bonding pads 121 and 122 or the resin portion 135 may be disposed as shown in FIG. 23. Thus a flow of the conductive part 321 and 322 may be blocked.

The contact area between the conductive parts 321 and 322 and the bonding pads 121 and 122 may be smaller than the top surface area of each of the through holes TH1 and TH2 by a non-contact region. Each contact region of the bonding pads 121 and 122 may have a circular shape, a polygonal shape, an elliptical shape, or a shape having a curved line or a straight line. The non-contact regions of the bonding pads 121 and 122 may be opened in a downward direction and open in at least one of X direction, Y direction and diagonal direction. A bottom view shape of the bonding pads 121 and 122 may be circular, polygonal, or elliptical.

Referring to FIGS. 8 and 9, when the first and second conductive parts 321 and 322 contact the first and second contact regions 21, 22, 31 and 32 of the bonding pads 121 and 122, And the second contact regions 21, 22, 31 and 32 are the areas of the portions 20 and 30 overlapping the first and second through holes TH1 and TH2. The first and second conductive parts 321 and 322. The areas of the first and second contact regions 21, 22, 31 and 32 are larger than a size or areas of the particles 320 or powder (hereinafter, referred to as particles) constituting the first and second conductive parts 321 and 322. The size of the particle 320 may be 10 micrometers, a range of 10 to 40 micrometers, or a range of 20 to 40 micrometers. When the size of the particle 320 is out of the above range, the printability and wettability of the solder paste filled in the through holes TH1 and TH2 may be deteriorated, and high reliability may not be maintained.

The areas of the portions 20 and 30 overlapping with the first and second through holes TH1 and TH2 on the first and second contact areas 21, 22, 31 and 32 of the bonding pads 121 and 122 may be at least twice the area or size of the particle 320. For example, when a radius of the particle 320 is r, the minimum area of each of the contact regions 21, 22, 32, and 33 contacting each of the first and second conductive parts 321 and 322 may be twice or more than an area of the particle obtained by $\pi \times r^2$ or equal to or more than the area of $n \times \pi \times r^2$. The n is n≥2. Since the first and second contact regions 21, 22, 31 and 32 of the first and second bonding pads 121 and 122 are provided at least twice the area of the particle 320, the first and second contact regions 21, 22, 31 and 32 can improve the printability and wettability with the solder paste and maintain high reliability.

The minimum area overlapping the first and second through holes TH1 and TH2 in the first and second non-contact regions 23 and 33 of the bonding pads 121 and 122 may be 1.5 times or more the area of the particle 320. For example, when the radius of the particle 320 is r, the minimum area of the non-contact regions 23 and 33 that are not in contact with the first and second conductive parts 321 and 322 is 1.5 times or more. The first and second non-contact regions 23 and 33 of the first and second bonding pads 121 and 122 may be provided at least 1.5 times as large as the area of the particle 320. Accordingly, the contact region between the first and second conductive parts 321 and 322 and the through holes TH1 and TH2 can be reduced, and the pulling force of the bonding pads 121 and 122 can be dispersed. The contact failure with the bonding pads 121 and 122 can be reduced and the reliability can be improved.

Referring to FIG. 8, when the non-contact regions 23 and 33 are formed in the X direction in the bonding pads 121 and 122, the widths W31, W41 and W42 of the contact regions 21, 22, 31 and 32 in the Y direction may be at least two times the particle diameter or may be in the range of two to four times the particle diameter. The widths W31, W41 and W42 may be in the range of 40 micrometers or more, or in the range of 40 to 100 micrometers. The widths W32 and W43 in the Y direction of the non-contact regions 23 and 33 may be 1.5 times or more of the particle diameter. The widths W32 and W43 of the non-contact regions 23 and 33 in the Y direction may be in a range of 30 micrometers or more, for example, 30 micrometers to 80 micrometers. The width of the non-contact regions 23 and 33 in the X direction may be equal to or greater than the widths W32 and W43 in the Y direction. When the contact regions 21, 22, 31 and 32 of the bonding pads 121 and 122 and the non-contact regions 23 and 33 have the above widths, the contact regions 21, 22, The pulling force of the pads 121 and 122 can be dispersed and the defects of the bonding pads 121 and 122 of the light emitting device 120 can be reduced and the reliability can be improved.

As shown in FIG. 6, a protective layer 129 may be disposed around the first bonding pad 121. The protective layer 129 may be exposed to a region that does not cover the bottom surface of the first bonding pad 121, for example, a region facing the first frame 111. The protective layer 129 may have a thickness smaller than the thickness of the first bonding pad 121 to support and protect the first bonding pad 121. The protective layer 129 may be disposed on the lower surface of the light emitting device 120. The adhesive force F1 or F2 between the first conductive part 321 and the first bonding pad 121 may be dispersed in the first through hole TH1. The non-contact region 23 of the first bonding pad 121 may be disposed on the protective layer 129 to face the conductive parts 321 and 322. The protective layer 129 may be disposed around the second bonding pad 122. The second bonding pad 122 and the protective layer 129 disposed at the periphery of the second bonding pad 122 may be the same as those described above, and will be described with reference to the above description.

As shown in FIG. 7, a protective layer 129 may be disposed around the first and second bonding pads 121 and 122. The passivation layer 129 may cover the outer periphery of the bottom surface of the first and second bonding pads 121 and 122 and may expose an inner region of the bottom surface of the first and second bonding pads 121 and 122. The protective layer 129 can support the first bonding pad 121 when the bottom surface of the first bonding pad 121 and the first conductive part 321 are in contact with each other. Here, the protective layer 129 may include a portion (129A) that is partially in contact with the first conductive part 321, or a portion that is not in contact with the first conductive part 321 or in a non-contact portion. The adhesive forces F1 and F2 between the first and second conductive parts 321 and 322 and the first and second bonding pads 121 and 122 may be dispersed in the first and second through holes TH1 and TH2. The area of the non-contact region 23 can be controlled by the protective layer 129 disposed on the first and second bonding pads 121 and 122. The non-contact region 23 of the first and second bonding pads 121 and 122 may be disposed on the protection layer 29 to face the first and second conductive parts 321 and 322. The second bonding pad 122 and the protective layer 129 disposed around the second bonding pad 122 will be described with reference to the above description, and the above description will be referred to.

Referring to FIGS. 4 and 5, when the conductive parts 321 and 322 are filled in the first and second through holes TH1 and TH2, the conductive parts 321 and 322 are electrically connected to the contact regions 121 and 122 of the bonding pads 121 and 122, and may leak laterally through the non-contact regions 23, 33. For example, as shown in FIG. 8, the conductive parts 321 and 322 may flow out through lateral directions F3 and F4 in which the non-contact regions 23 and 33 of the bonding pads 121 and 122 are opened. In this case, as shown in FIG. 3, the adhesive 130 adhered between the light emitting device 120 and the body 113 can prevent the conductive parts 321 and 322 from leaking.

As shown in FIG. 8, the connection part 24 and 34 of the bonding pads 121 and 122 are adjacent to the frames 111 and 112 or bonded to the conductive parts 321 and 322, respectively. In this case, an outflow of the conductive parts 321 and 322 can be blocked as shown in FIG. 3.

Figure 10:
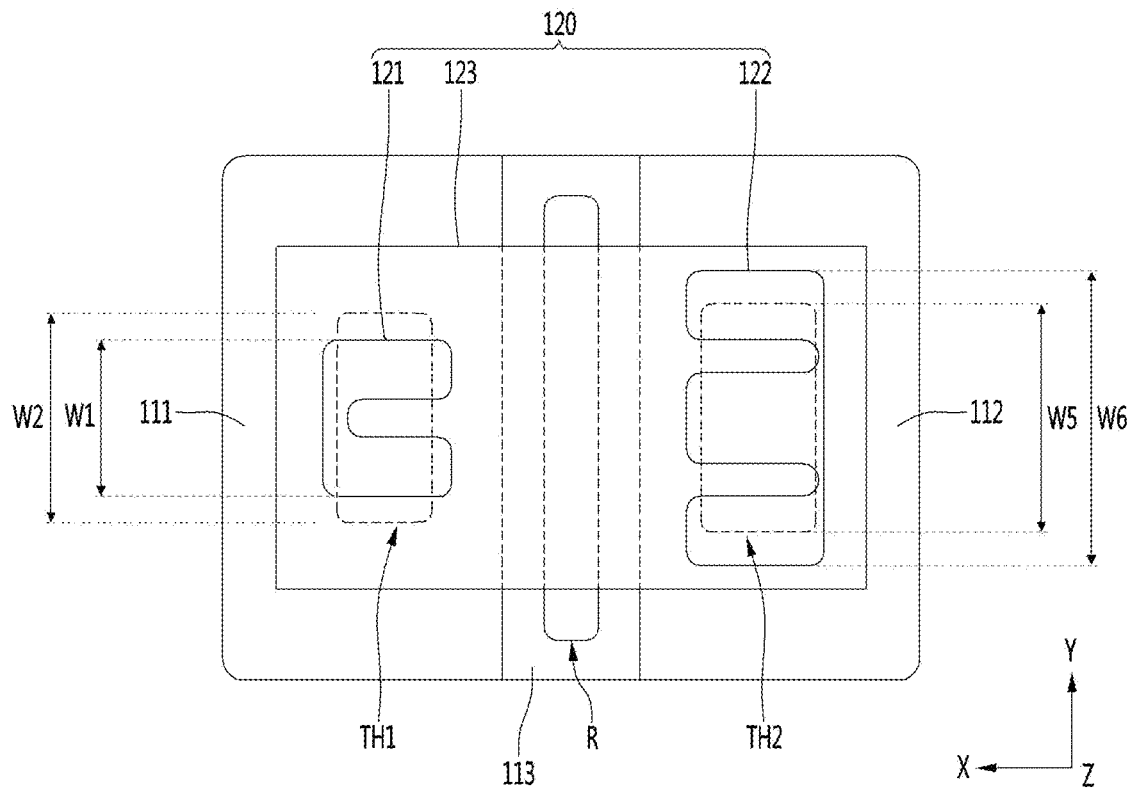
FIG. 10 is another example of a first bonding pad and a through hole of the light emitting device of FIG. 8.

FIG. 10 is another example of the through hole and the bonding pad in the embodiment of the invention. Referring to, FIG. 10, the length W2 in the Y direction of the first through hole TH1 may be greater than the length W1 of the first bonding pad 121 in the Y direction. The Y direction length W5 of the second through hole TH2 may be greater than the Y direction length W6 of the second bonding pad 122. At least one of the first and second bonding pads 121 and 122 may have a length W1 and W5 in the Y direction smaller than a length W2 and W6 in the Y direction of at least one of the first and second through holes TH1 and TH2. In this case, the non-contact area of the bonding pads 121 and 122 can be further increased.

Figure 11:
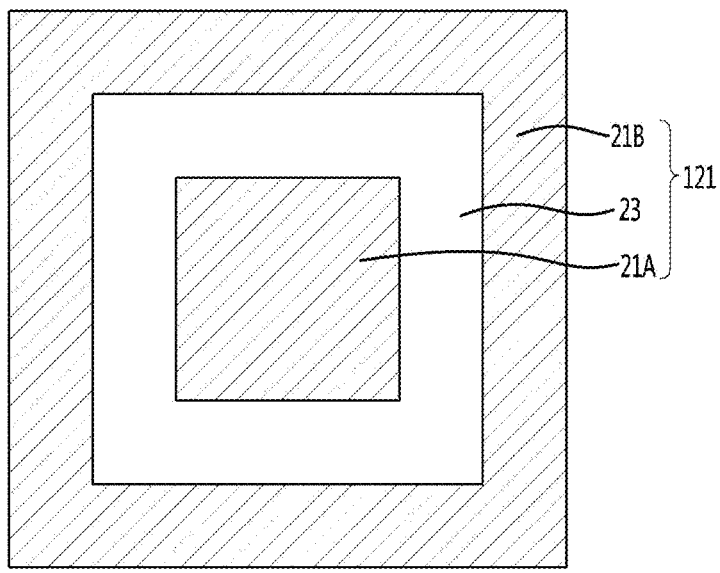
FIG. 11 is a first modification of a bonding pad of a light emitting device according to an embodiment of the invention.

As shown in FIG. 11, at least one of the plurality of bonding pads may include an inner contact region 21A and an outer contact region 21B. The non-contact region 23 of the bonding pad 121 may be disposed between the inner contact region 21A and the outer contact region 21B. The non-contact region 23 can separate the inner and outer contact regions 21A and 21B. When the inner and outer contact regions 21A and 21B are separated from the bonding pads 121, the two separated contact regions may be connected in different patterns. The bonding pads may be applied to the first and second bonding pads as shown in FIG. 12.

Figure 12:
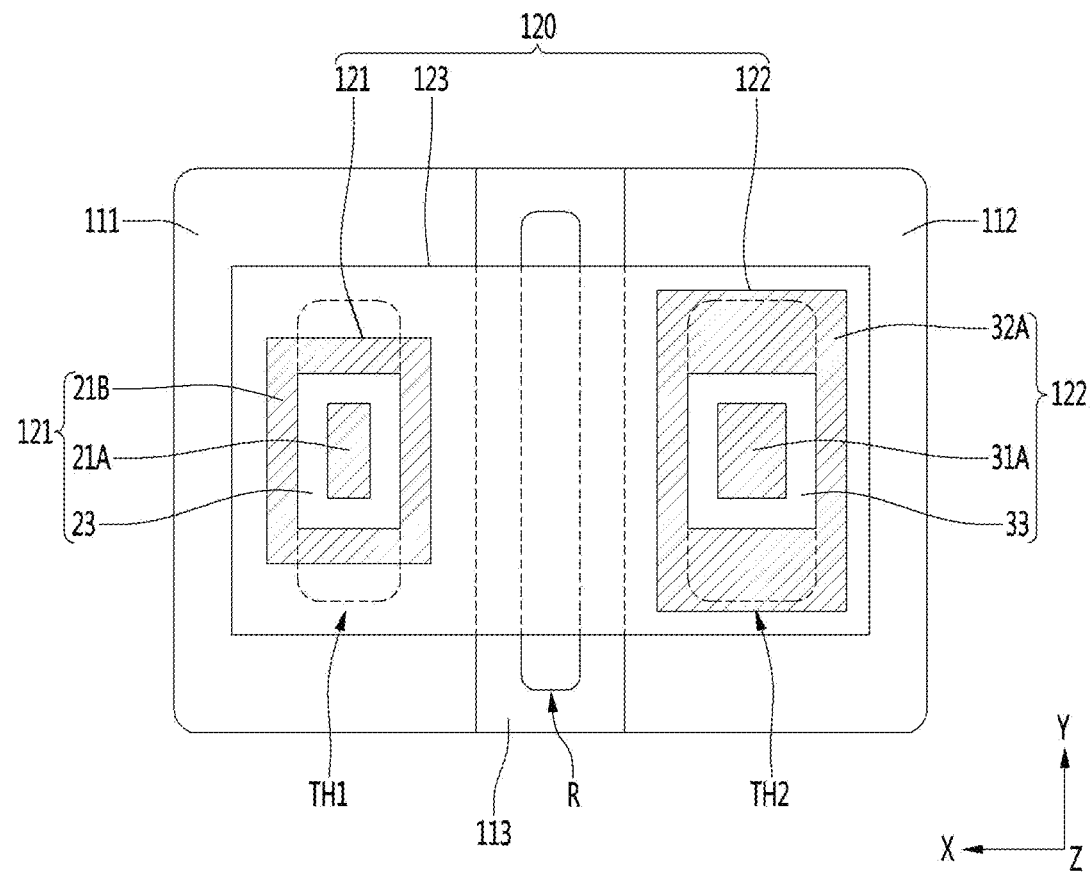
FIG. 12 is an example of a through hole of a body and a bonding pad of the light emitting device of FIG. 11.

As shown in FIG. 12, the first bonding pad 121 may include a non-contact region 23 between the inner and outer contact regions 21A and 21B. The external contact region 21B may be electrically connected to the frame 111. The second bonding pad 122 may have a non-contact region 33 disposed between the inner and outer contact regions 31A and 32A and may be electrically connected to the frame 112.

In this case, an area of the contact regions 21A, 21B, 31A, and 32A of the first and second bonding pads 121 and 122 which is contacted with the first and second frames 111 and 112 may be larger than an area contacting with the first and second conductive parts 321 and 322, respectively. Accordingly, even if the contact regions 21A, 21B, 31A, and 32A of the bonding pads 121 and 122 are separated from each other, a reduction in electrical characteristics can be prevented and a pulling force of the bonding pads can be reduced. The width of the outer contact regions 21B and 32A may be twice or more the diameter of the particle, so that the outer contact regions 21B and 32A may be stably connected to the frames 111 and 112.

The upper surface area of the first bonding pad 121 may be equal to or smaller than the upper surface area of the second bonding pad 122. The top surface area of the first through hole TH1 may be equal to or smaller than the top surface area of the second through hole TH2.

Figure 13:
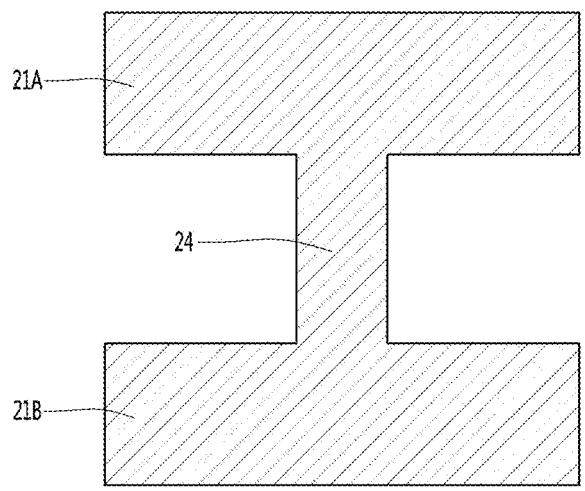
FIG. 13 is a second modification of the bonding pad of the light emitting device of FIG. 11.

Referring to FIG. 13, at least one of a plurality of bonding pads may be connected to a plurality of contact regions 21A and 21B by a connection part 24. The position of the connection part 24 may be a center position of the plurality of contact regions 21A and 21B. The connection part 24 may extend in a direction perpendicular or inclined to the respective contact regions 21A and 21B. The connection part 24 may be one or more. The connection part 24 may be a region in contact with the conductive parts 321 and 322. The shape of the bonding pad can be applied as shown in FIG. 14.

Figure 14:
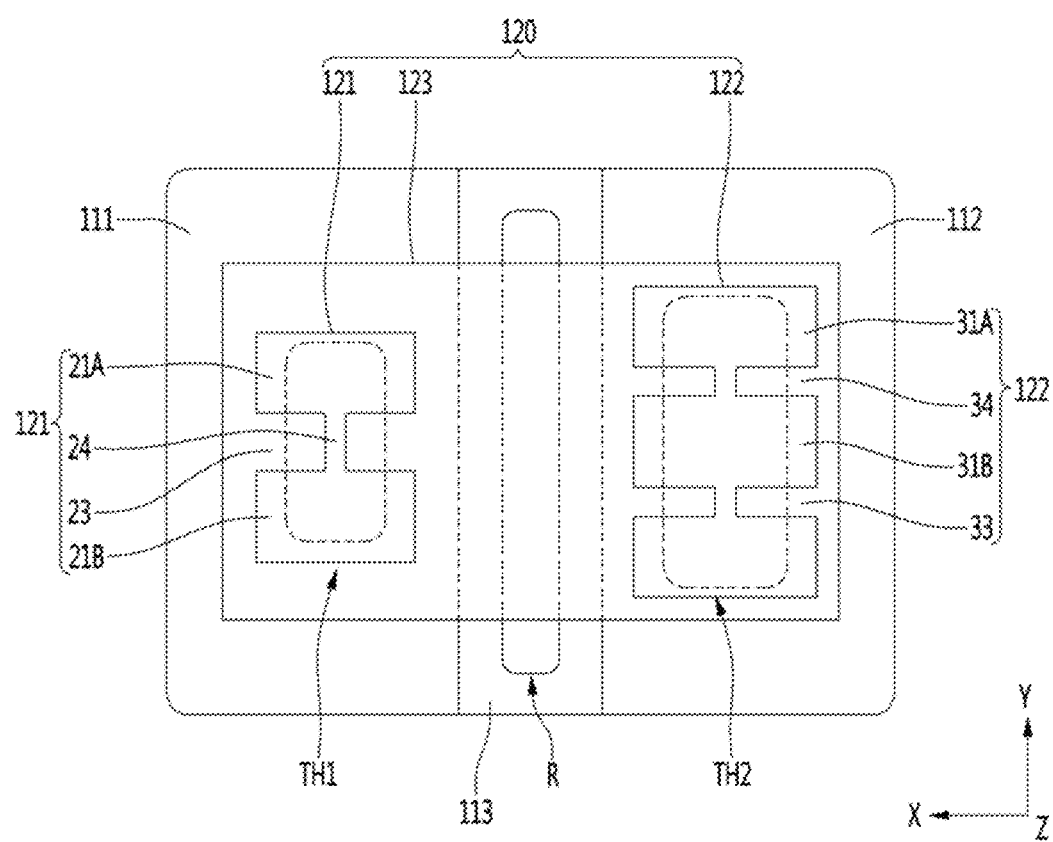
FIG. 14 is an example of a through hole of a body and a bonding pad of the light emitting device of FIG. 11.

Referring to FIG. 14, the first bonding pad 121 includes a connection part 24 between a plurality of contact regions 21A and 21B and a non-contact region 23 on both sides of the connection part 24. The first bonding pad 121 may be connected to a connection part 24 between a plurality of contact regions 21A and 21B and may be in contact with a conductive part. The non-contact region 23 of the first bonding pad 121 may be separated on both sides by the connection part 24. The minimum width of the connection part 24 may be larger or smaller than the particle diameter, but is not limited thereto. The first bonding pad 121 may have a connection part 24 disposed between a plurality of contact regions 21A and 21B and may be in contact with the conductive parts 321 and 322. The width in the X direction and the length in the Y direction of the first bonding pad 121 may be larger than the through holes.

The second bonding pad 122 may have a connection part 34 between a plurality of contact regions 31A and 31B and a non-contact region 33 on both sides of the connection part 34. The second bonding pad 122 may have a connection part 34 disposed between the plurality of contact regions 31A and 31B and may be in contact with the conductive parts 321 and 322. The width in the X direction and the length in the Y direction of the second bonding pad 122 may be larger than the through holes.

The top surface area of the first bonding pad 121 may be equal to or less than the top surface area of the second bonding pad 122. The top surface area of the first through hole TH1 may be equal to or smaller than the top surface area of the second through hole TH2.

FIGS. 15 to 18 are modifications of the bonding pad according to the embodiment of the invention.

Figure 15:
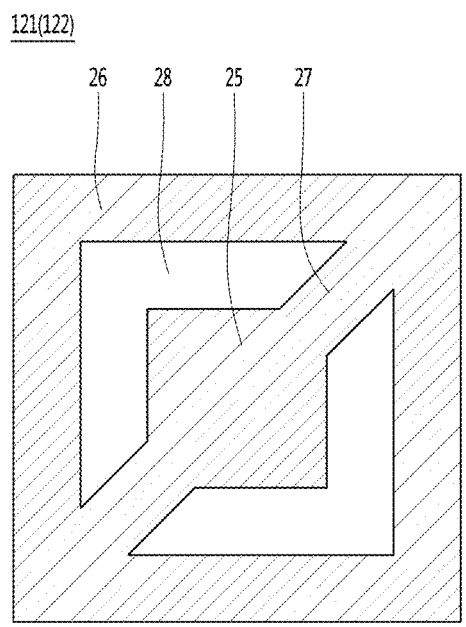
FIGS. 15 to 18 illustrate another variation of a bonding pad of a light emitting device according to an embodiment of the invention.

As shown in FIG. 15, the bonding pads 121 and 122 may be respectively connected to the inner contact region 25 and the outer contact region 26 by the connection part 27 in the diagonal direction. At least two or more non-contact regions 28 may be disposed in the outer contact region 26 by a connection part 27. The minimum width of the non-contact region 28 may be at least 1.5 times the particle diameter, and the minimum width of the contact regions 25 and 26 may be at least twice the particle diameter. By the dispersed contact regions 25 and 26, the printability and wettability of the solder paste as the conductive parts 321 and 322 can be improved and high reliability can be maintained. The inner and outer contact regions 25 and 26 may include circular or polygonal shapes.

Figure 16:
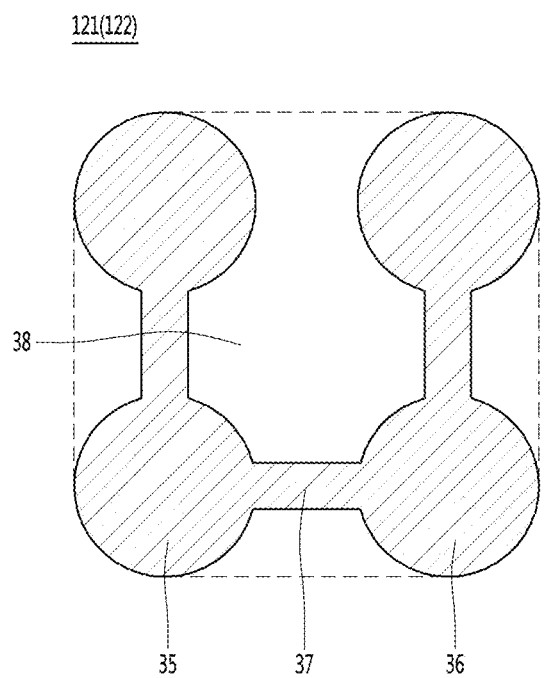

Referring to FIG. 16, the bonding pads 121 and 122 may have a plurality of contact regions 35 and 36 disposed at corner portions of a polygonal shape, and the contact regions 35 and 36 may be connected to the connection part 37. The contact regions 35 and 36 may be circular, polygonal, or elliptical. Each of the contact regions 35 and 36 may include a shape having a curved line or a straight line. The non-contact region 37 may be provided between the contact regions 35 and 36. The minimum width of the non-contact region 37 may be at least 1.5 times the particle diameter, and the minimum width of the contact regions 35 and 36 may be at least twice the particle diameter. The printability and wettability of the solder paste as the conductive parts 321 and 322 can be improved and high reliability can be maintained.

Figure 17:
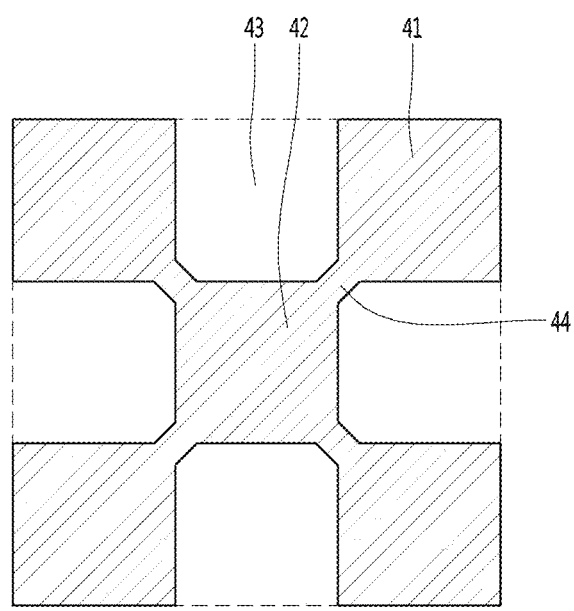

As shown in FIG. 17, the bonding pads 121 and 122 may have a plurality of contact regions 41 and 42 disposed in a matrix, and the contact regions 41 and 42 may be connected to the connection part 44. The non-contact region 43 may be provided between the contact regions 41 and 42. Two or three or more of the non-contact regions 43 may be separated by the connection part 44. The contact regions 41 and 42 may be disposed to surround at least three sides of the non-contact region 43, and an area of the non-contact region 43 may be smaller than the area of the contact regions 41 and 42.

The minimum width of the non-contact region 43 may be at least 1.5 times the particle diameter, and the minimum width of the contact regions 41 and 42 may be at least twice the particle diameter. By disposing the contact regions 35 and 36 around the non-contact region 38, the printability and wettability of the solder paste can be improved upon bonding with the conductive parts 321 and 322, and high reliability can be maintained.

Figure 18:
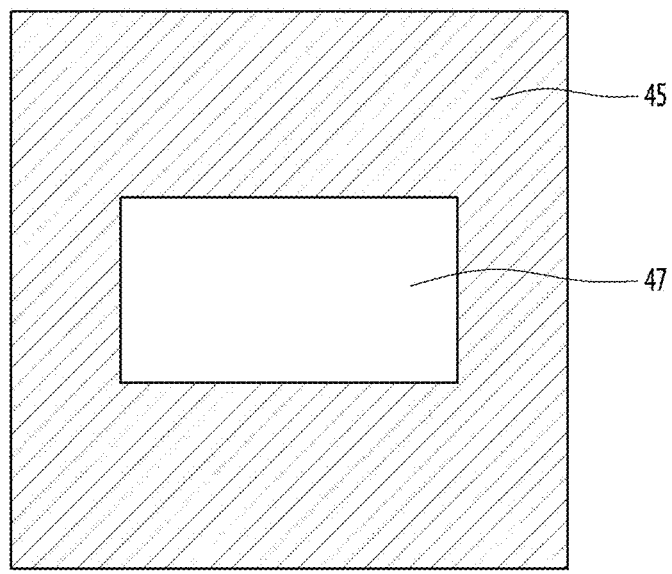

As shown in FIG. 18, the bonding pads 121 and 122 may include a contact region 45 around the non-contact region 47. The contact region 45 cuts off the periphery of the non-contact region 47 and may have an area larger than the area of the non-contact region 47. The minimum width of the non-contact region 47 may be at least 1.5 times the particle diameter, and the minimum width of the contact region 45 may be at least twice the particle diameter. By disposing the contact region 45 around the non-contact region 47, the printability and wettability of the solder paste can be improved when bonded to the conductive part, and high reliability can be maintained.

In an embodiment of the invention, the first and second bonding pads 121 and 122 may be connected to the conductive part through the contact region and separated from the conductive part through the non-contact region. The contact region may be electrically connected to the frame through the conductive part. In this case, the contact region of the first and second bonding pads 121 and 122 may be larger than the contact region of the first and second bonding pads 121 and 122 with the conductive part. Thus, even if the contact regions of the respective bonding pads are separated from each other, it is possible to prevent deterioration of electrical characteristics and reduce the pulling force of the bonding pads. The width of the outer contact region may be at least two times the diameter of the particle, so that the outer contact region can be stably connected to the frame.

Referring to FIG. 23, as another example, the light emitting device package 100 may include a resin part 135. The resin part 135 may be disposed between the first frame 111 and the light emitting device 120. The resin part 135 may be disposed between the second frame 112 and the light emitting device 120. The resin part 135 may be provided on the bottom surface of the cavity C provided in the package body 110.

The resin part 135 may be disposed on a side surface of the first bonding pad 121. The resin part 135 may be disposed on a side surface of the second bonding pad 122. The resin part 135 may be disposed under the light emitting part 123.

For example, the resin part 135 may include at least one of an epoxy-based material, a silicone-based material, a hybrid material including an epoxy-based material and a silicon-based material have. The resin part 135 may be a reflecting part that reflects light emitted from the light emitting device 120, and may be a resin including a reflective material such as $TiO_2$, or may include white silicone.

The resin part 135 may be disposed under the light emitting device 120 to perform a sealing function. The resin part 135 can improve adhesion between the light emitting device 120 and the first frame 111. The resin part 135 can improve adhesion between the light emitting device 120 and the second frame 112. The resin part 135 can prevent the tilting of the light emitting device 120.

The resin part 135 may seal the periphery of the first bonding pad 121 and the second bonding pad 122. The resin part 135 may be formed such that the first conductive part 321 and the second conductive part 322 are escaped from the first through hole TH1 and the second through hole TH2 and may be prevented from being diffused and moved in an outer side direction of the light emitting device. When the first and second conductive parts 321 and 322 are diffused and moved in the outer surface direction of the light emitting device 120, the first and second conductive parts 321 and 322 are electrically connected to the active layer of the light emitting device 120 and short-circuit problems may occur. Accordingly, when the resin part 135 is disposed, the first and second conductive parts 321 and 322 and the active layer can be prevented from being short-circuited, thereby improving the reliability of the light emitting device package.

When the resin part 135 includes a material having a reflective property such as white silicon, the resin part 135 may reflect light emitted from the light emitting device 120 toward the upper part of the package body 110 The light extraction efficiency of the light emitting device package 100 can be improved.

According to another example, the molding part 140 may directly contact the first frame 111 and the second frame 112 without the resin part 135.

Figure 24:
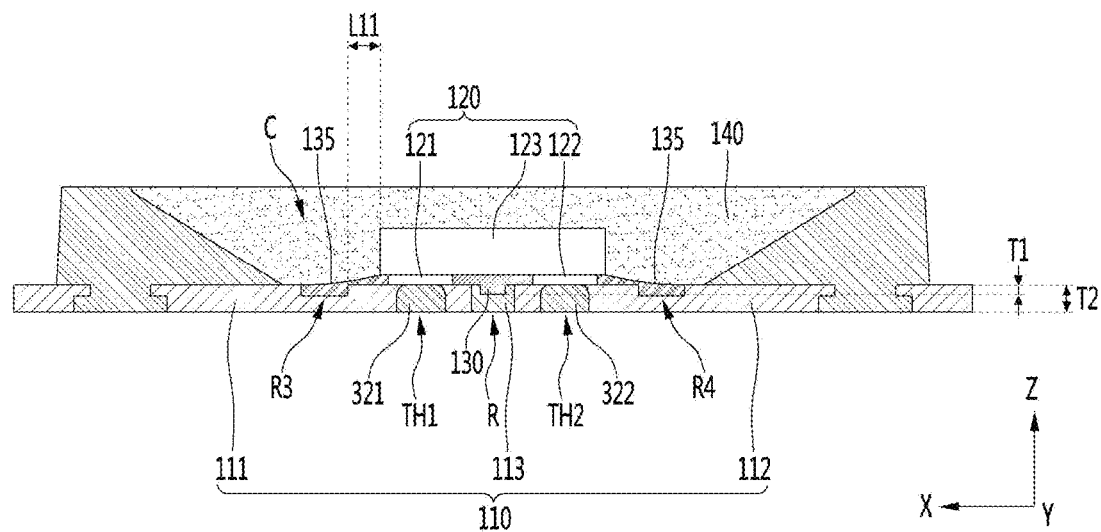
FIG. 24 is a second modification of the light emitting device package of FIG. 3.

FIG. 24 is another example of a light emitting device package according to an embodiment of the invention.

Referring to FIG. 24, the light emitting device package may include a first upper recess R3 on the first frame 111 and a second upper recess R4 on the second frame 112. The first upper recess R3 may be provided on the upper surface of the first frame 111. The first upper recess R3 may be recessed in a downward direction from the upper surface of the first frame 111. The first upper recess R3 may be spaced apart from the first through hole TH1. The first upper recess R3 may be provided in a top view shape adjacent to three sides of the first bonding pad 121. For example, the first upper recess R3 may be disposed along at least one side or three sides of the first bonding pad 121.

The second upper recess R4 may be provided on the upper surface of the second frame 112. The second upper recess R4 may be recessed in a downward direction from the upper surface of the second frame 112. The second upper recess R4 may be spaced apart from the second through hole TH2. The second upper recess R4 may be provided such that a top view shape is adjacent to three sides of the second bonding pad 122. For example, the second upper recess R4 may be disposed along at least one side or three sides of the second bonding pad 122.

The resin part 135 may be provided to the first upper recess R3 and the second upper recess R4. The resin part 135 may be disposed on a side surface of the first bonding pad 121. The resin part 135 may be provided to the first upper recess R3 and extended to a region where the first bonding pad 121 is disposed. The resin part 135 may be disposed under the light emitting part 123.

The distance L11 from the end of the first upper recess R3 to the adjacent end of the light emitting device 120 may be several hundred micrometers or less. For example, the distance L11 from the end of the first upper recess R3 to the adjacent end of the light emitting device 120 may be equal to or less than 200 micrometers.

The distance L11 from the end of the first upper recess R3 to the adjacent end of the light emitting device 120 may be determined by viscosity of a resin part 135 filled in the first upper recess R3.

The distance L11 from the end of the first upper recess R3 to the adjacent end of the light emitting device 120 may be selected as a distance that the resin part 135 filled in the first upper recess R3 may extend to a region where the first bonding pad 121 is disposed.

The resin part 135 may be disposed on a side surface of the second bonding pad 122. The resin part 135 may be provided to the second upper recess R4 and extended to a region where the second bonding pad 122 is disposed. The resin part 135 may be disposed under the light emitting part 123.

Also, the resin part 135 may be provided on a side surface of the light emitting part 123. The resin part 135 is disposed on the side surface of the light emitting part 123 to effectively prevent the first and second conductive parts 321 and 322 from moving to the side surface of the light emitting part 123. When the resin part 135 is disposed on the side surface of the light emitting part 123, the resin part 135 may be disposed under the active layer of the light emitting part 123. Accordingly, the light extraction efficiency of the light emitting device 120 can be improved.

The first upper recess R3 and the second upper recess R4 may include a sufficient space for the resin part 135 to be provided. For example, the resin part 135 may include at least one of an epoxy-based material, a silicone-based material, a hybrid material including an epoxy-based material and a silicon-based material have. In addition, the resin part 135 may include a reflective material, for example, and may include a white silicone including $TiO_2$ and/or Silicone.

The resin part 135 may be disposed under the light emitting device 120 to perform a sealing function. In addition, the resin part 135 may improve the adhesion between the light emitting device 120 and the first frame 111. The resin part 135 can improve adhesion between the light emitting device 120 and the second frame 112.

The resin part 135 may seal the periphery of the first bonding pad 121 and the second bonding pad 122. The resin part 135 may be formed such that the first conductive part 321 and the second conductive part 322 are escaped from the first through hole TH1 and the second through hole TH2 and may be prevented from being diffused and moved in a direction of the light emitting device 120.

When the resin part 135 includes a material having a reflection characteristic such as white silicon, the resin part 135 reflects light provided from the light emitting device 120 toward the upper part of the package body 110, so that the light extraction efficiency of the light emitting device package 100 can be improved.

In the manufacturing process of the light emitting device package, the first conductive part 321 and the second conductive part 322 are formed in the through holes, and then the resin part 135 and the molding part 140 may be formed by a dispensing process. Conversely, after the resin part 135 and the molding part 140 are formed, the first conductive part 321 and the second conductive part 322 may be formed in the through holes. According to another example of the manufacturing process of the light emitting device package according to the embodiment of the invention, only the molding part 140 may be formed in the cavity of the package body 110 without forming the resin part 135.

One or a plurality of the light emitting device packages may be disposed on the circuit board. In addition, the bonding regions with the conductive parts can be dispersed by the contact and non-contact regions of the respective bonding pads of the light emitting device, and the bonding efficiency can be improved.

The light emitting device package 100 according to the embodiment described above may be mounted on a submount, a circuit board, or the like. However, since a conventional light emitting device package is mounted on a submount, a circuit board or the like, a high temperature process such as reflow can be applied. At this time, in the reflow process, a re-melting phenomenon may occur in the bonding region between the lead frame and the light emitting device provided in the light emitting device package, and thereby the electrical connection between the light emitting device and the frame and the stability of the physical connection may be weakened. However, according to the light emitting device package and the method of manufacturing the light emitting device package according to the embodiment, the first bonding pad and the second bonding pad of the light emitting device may receive driving power through the conductive part disposed in the through hole. And, the melting point of the conductive part disposed in the through hole may be selected to have a higher value than the melting point of the common bonding material.

Therefore, even when the light emitting device package 100 according to the embodiment is bonded to the main substrate through a reflow process, re-melting phenomenon does not occur, so that electrical connection and physical bonding force are not deteriorated.

In addition, according to the light emitting device package 100 according to the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

Accordingly, the selection range for the material constituting the body 113 can be widened. According to the embodiment, the body 113 may be provided using not only expensive materials such as ceramics but also relatively inexpensive resin materials. For example, the body 113 may include at least one material selected from the group consisting of PPA (Polyphthalamide) resin, PCT (PolyCyclohexylenedimethylene Terephthalate) resin, EMC (Epoxy Molding Compound) resin and SMC.

<Light Source Module>

Figure 25:
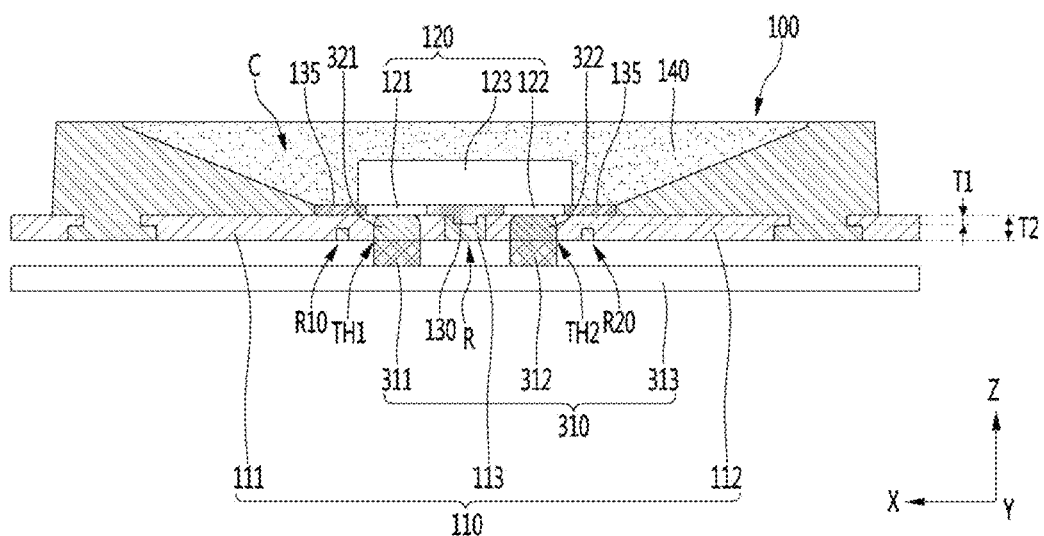
FIG. 25 is an example of a module in which the light emitting device package of FIG. 3 is disposed on a circuit board.

Referring to FIG. 25, one or a plurality of light emitting device packages 100 may be disposed on a circuit board 310 in the light source module 300 according to the embodiment.

The circuit board 310 may include a first pad 311, a second pad 312, and a substrate 313. The substrate 313 may be provided with a power supply circuit for controlling the driving of the light emitting device 120.

The first bonding pad 121 is connected to the first pad 311 of the circuit board 310 via the first conductive part 321 of the first through hole TH1 of the light emitting device package 100, and the circuit board 310 is connected to the second pad 312 through the second conductive part 322 of the second through hole TH2 so that power is connected to the second bonding pad 122. The substrate 313 of the circuit board 310 may be a flexible or non-flexible member.

The package body 110 may be disposed on the circuit board 310. The first pad 311 and the first bonding pad 121 may be electrically connected to each other. The second pad 312 and the second bonding pad 122 may be electrically connected to each other. The first pad 311 and the second pad 312 may include a conductive material. For example, the first pad 311 and the second pad 312 may be formed of a at least one material selected from the group consisting of Ti, Cu, Ni, Au, Cr, Ta, Pt, Sn, Ag, P, Fe, Sn, Zn, Al, or an alloy thereof. The first pad 311 and the second pad 312 may be provided as a single layer or a multilayer.

When the first frame 111 and the second frame 112 are formed as an insulating frame, power can be supplied through the first and second conductive parts 321 and 322. When the first frame 111 and the second frame 112 are formed as a conductive frame, power may be supplied through the first and second conductive parts 321 and 322 and the first and second frames 111 and 112.

Figure 26:
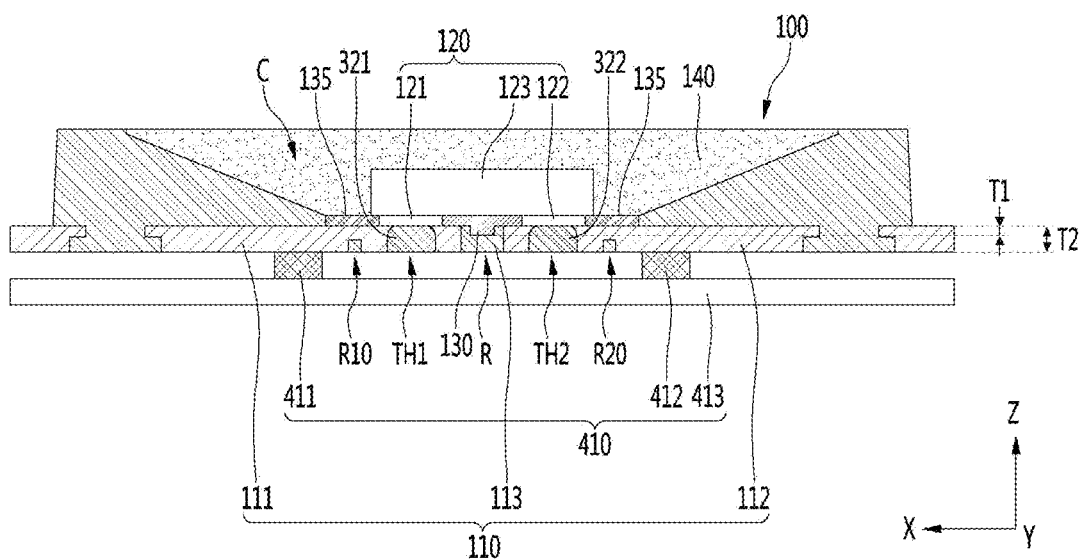
FIG. 26 is an example of a module in which the light emitting device package of FIG. 3 is disposed on a circuit board.

FIG. 26 is another example of the light source module having the light emitting device package according to the embodiment.

Referring to FIG. 26, one or more light emitting device packages 100 may be disposed on a circuit board 410. The circuit board 410 may include a first pad 411, a second pad 412, and a substrate 413. The substrate 413 may be provided with a power supply circuit for controlling the driving of the light emitting device 120.

The package body 110 may be disposed on the circuit board 410. The first pad 411 and the first bonding pad 121 may be electrically connected to each other. The second pad 412 and the second bonding pad 122 may be electrically connected to each other.

According to the embodiment, the first pad 411 of the circuit board 410 and the first conductive part 321 may be electrically connected. In addition, the second pad 412 of the circuit board 410 and the second conductive part 322 may be electrically connected to each other. The first pad 411 may be electrically connected to the first frame 111. The second pad 412 may be electrically connected to the second frame 112. According to the embodiment, a separate bonding layer may be additionally provided between the first pad 411 and the first frame 11*l*. Further, a separate bonding layer may be additionally provided between the second pad 412 and the second frame 112. According to the light emitting device package of the embodiment, the first bonding pad and the second bonding pad of the light emitting device may receive driving power through a conductive part disposed in the through hole. And, the melting point of the conductive part disposed in the through hole may be selected to have a higher value than the melting point of the common bonding material. The light emitting device package according to the embodiment has an advantage that the electrical connection and the physical bonding force are not deteriorated because the re-melting phenomenon does not occur even when the light emitting device package according to the embodiment is bonded to the main substrate through a reflow process. According to the light emitting device package according to the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

The light emitting device package 100 according to the embodiment may be mounted on a submount, a circuit board, or the like. However, since a conventional light emitting device package is mounted on a submount, a circuit board or the like, a high temperature process such as reflow can be applied. At this time, in the reflow process, re-melting phenomenon occurs in the bonding region between the frame and the light emitting device provided in the light emitting device package, so that the stability of electrical connection and physical coupling may be weakened, and the optical and electrical characteristics and reliability of the light emitting device package may be deteriorated. However, according to the light emitting device package according to the embodiment, the first bonding pad and the second bonding pad of the light emitting device according to the embodiment can receive the driving power through the conductive part disposed in the through hole. And, the melting point of the conductive part disposed in the through hole may be selected to have a higher value than the melting point of the common bonding material. Therefore, even when the light emitting device package 100 according to the embodiment is bonded to the main substrate through a reflow process, re-melting phenomenon does not occur, so that electrical connection and physical bonding force are not deteriorated.

Second Embodiment

Figure 27:
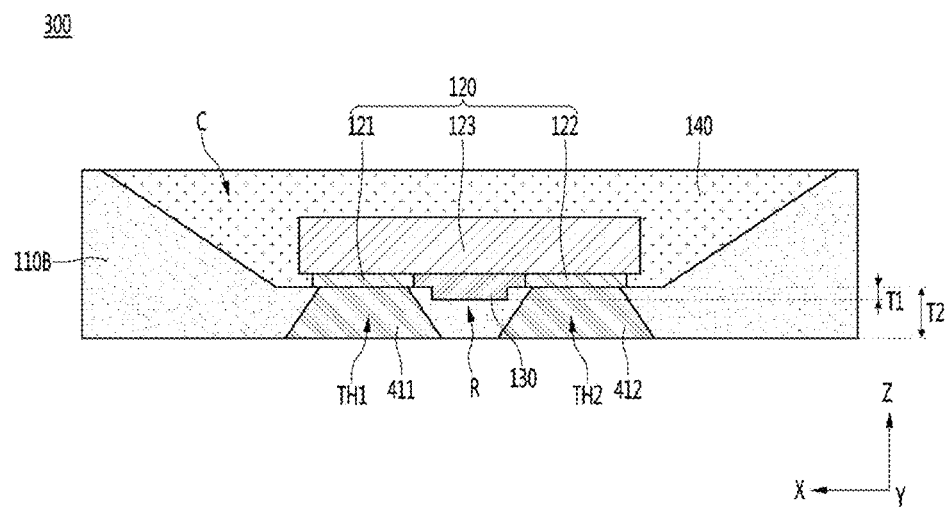
FIG. 27 is a side sectional view of a light emitting device package according to a second embodiment of the invention.
Figure 28:
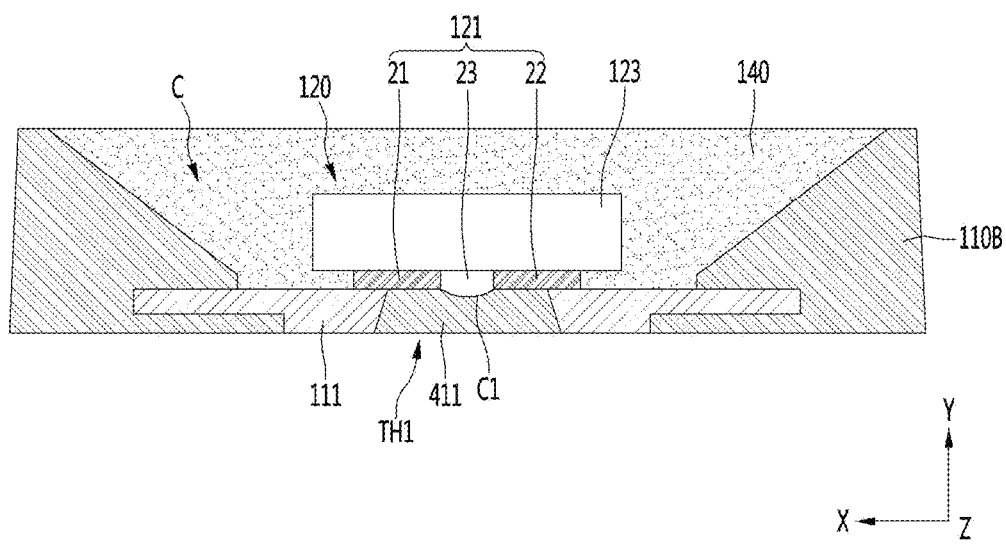
FIG. 28 is a cross-sectional view of another side of the light emitting device package of FIG. 27.

FIGS. 27 and 28 are side sectional views of a light emitting device package according to the second embodiment. In describing the second embodiment, the same configuration as that of the first embodiment can be applied to the second embodiment with reference to the description of the first embodiment.

As shown in FIGS. 27 and 28, the light emitting device package may include a body 110B and a light emitting device 120.

The body 110B may provide a concave cavity C at the top. The cavity (C) can reflect the incident light upward. The cavity C may have an inclined side surface with respect to the bottom surface. The body 110B may be formed of a material such as Polyphthalamide (PPA), polychlorotripheyl (PCT), liquid crystal polymer (LCP), polyamide 9T, silicone, epoxy molding compound (EMC), ceramics, photo sensitive glass (PSG), sapphire ($Al_2O_3$), and the like. In addition, the body 110B may include a high refractive index filler such as $TiO_2$ and $SiO_2$.

Figure 29:
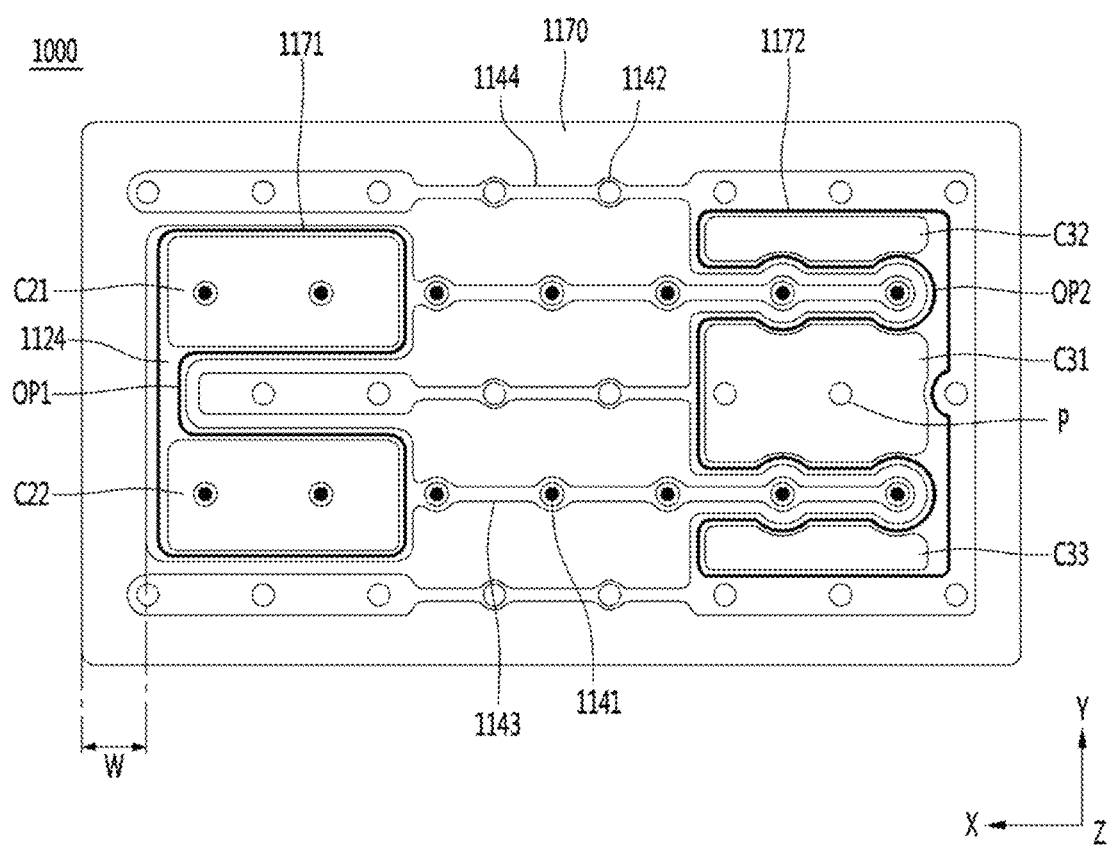
FIG. 29 is an example of a top view of a light emitting device of a light emitting device package according to an embodiment of the invention.

The light emitting device 120 may include a first bonding pad 121, a second bonding pad 122, and a light emitting part 123 having a semiconductor layer. The configuration of the light emitting device 120 will be described with reference to the description of the embodiments disclosed above. As shown in FIG. 29, the first bonding pads 1172 may be provided with different sizes of contact regions according to regions. FIG. 29 shows an example in which the shapes and sizes of the first and second bonding pads 1172 and 1171 are modified to change the sizes of the contact region and the non-contact region.

The light emitting device 120 may be disposed on the body 110. The first bonding pad 121 may be disposed on the lower surface of the light emitting device 120. The second bonding pad 122 may be disposed on the lower surface of the light emitting device 120.

The body 110B may include a plurality of openings, for example, a first through hole TH1 and a second through hole TH2. The first through hole TH1 may be disposed below the first bonding pad 121 of the light emitting device 120 and may penetrate through a lower portion of the body 110B. The first through hole TH1 may be provided to overlap with the first bonding pad 121 of the light emitting device 120. The second through hole TH2 may be disposed below the second bonding pad 122 of the light emitting device 120 and may be provided through the lower portion of the body 110B. The second through hole TH2 may be provided to overlap with the second bonding pad 122 of the light emitting device 120.

At least one or both of the first bonding pad 121 and the second bonding pad 122 may include the contact region and the non-contact region described above, and a detailed description will be made with reference to the above description. For example, as shown in FIG. 28, the first bonding pad 121 may include a first contact region 21 and 22 and a first non-contact region 33.

The body 110B may include a recess R. The recess R may be recessed from the bottom surface of the cavity C to the lower surface of the body 110B. The recess R may be disposed below the light emitting device 120 and may overlap with an area between the first and second bonding pads 121 and 122.

The adhesive 130 may be disposed in the recess R. The adhesive 130 may be disposed between the light emitting device 120 and the bottom surface of the cavity C. The adhesive 130 may be disposed between the first bonding pad 121 and the second bonding pad 122. For example, the adhesive 130 may be disposed in contact with a side surface of the first bonding pad 121 and a side surface of the second bonding pad 122. The adhesive 130 may provide a stable fixing force between the light emitting device 120 and the body 110B. For example, the adhesive 130 may be disposed in direct contact with the bottom surface of the cavity C of the body 110. In addition, the adhesive 130 may be disposed in direct contact with the lower surface of the light emitting device 120. For example, the adhesive 130 may include at least one of an epoxy-based material, a silicone-based material, a hybrid material including an epoxy-based material and a silicon-based material.

The adhesive 130 may provide a light diffusion function between the light emitting device and the body when light is emitted to the lower surface of the light emitting device 120. When the light is emitted from the light emitting device 120 to the lower surface of the light emitting device 120, the adhesive 130 may provide a light diffusion function. Accordingly, the light extraction efficiency of the light emitting device package can be improved.

According to the embodiment, the depth T1 of the recess R may be smaller than the depth T2 of the through holes TH1 and TH2. The depth T1 of the recess R may be determined in consideration of the adhesive force of the adhesive 130. FIG. 28, the depth T1 of the recess R may be determined by taking into consideration the stable strength with the mounting portion or by considering the strength of the light emitting device package by the heat emitted from the light emitting device 120. The depth T1 of the recess R may be determined so as not to generate cracks by the conductive part under the light emitting device.

The recess R may provide a suitable space under which a kind of underfill process may be performed under the light emitting device 120. By way of example, the depth T1 of the recess R may be provided at 40 micrometers or more, for example, 40 to 60 micrometers.

For example, a depth of the through holes TH1 and TH2 may have 180 micrometers or more or in a range of 180 to 220 micrometers. By way of example, the depth T2–T1 may be selected to be at least 100 micrometers or more. According to the embodiment, the ratio of the T1 depth to the T2 depth (T2/T1) may be provided in the range of 2 to 10. By way of example, if the depth of T2 may be provided at 200 micrometers, the depth of T1 may be provided at 20 micrometers to 100 micrometers.

The length of the recess R in the Y direction may be greater than the length of the first and second through holes TH1 and TH2. The Y direction length of the first and second through holes TH1 and TH2 may be smaller than the length of the light emitting device 120 in the short axis direction. In addition, the Y direction length of the recess R may be larger or smaller than the length in the short axis direction of the light emitting device 120.

The conductive parts 411 and 412 may be disposed in the first and second openings TH1 and TH2. The conductive parts 411 and 412 are conductive materials and may be connected to the first and second bonding pads 121 and 122. The conductive parts 411 and 412 may include one material or an alloy thereof selected from the group consisting of Ag, Au, Pt, Sn, Cu, Zn, In, Bi and Ti. The conductive parts 411 and 412 are solder pastes, and may be formed by mixing powders or particles and flux. The solder paste may include Sn—Ag—Cu, and the weight percentage of each metal may be varied. For example, the first conductive part 411 and the second conductive part 412 may be formed using a conductive paste. The conductive paste may include a solder paste, a silver paste, or the like, and may be composed of a multi-layer or an alloy composed of different materials or a multi-layer or a single layer.

The conductive parts 411 and 412 may be in contact with the contact regions of the bonding pads 121 and 122 on the through holes TH1 and TH2 and may be in non-contact with the non-contact region. This configuration will be described with reference to the description of the first embodiment. Since the conductive parts 411 and 412 have a non-contact region with respect to the bonding pads 121 and 122 on the through holes TH1 and TH2, damage to the bonding pads 121 and 122 by the conductive parts 411 and 412 can be prevented. That is, the conductive parts 411 and 412 can disperse the pulling force of the bonding pads 121 and 122, thereby preventing damage to the bonding pads.

The package of FIGS. 28 and 29 described above may include the resin par described above, or may include the resin part and the upper recess.

<Light Emitting Device>

The light emitting device package according to the embodiment may be provided, for example, with a flip chip light emitting device. For example, the flip chip light emitting device may be a transmissive flip chip device emitting light in six-sided directions, or a reflective flip chip device emitter emitting light in five-sided directions. The reflection type flip chip light emitting device in which light is emitted in the five-sided direction may have a structure in which an insulating layer is disposed in a direction close to the body. For example, the reflective flip chip light emitting device may include an insulating layer including a DBR (Distributed Bragg Reflector) or an ODR (Omni Directional Reflector) and/or a conductive layer (e.g., Ag, Al, Ni, Au). The flip-chip light emitting device may include a first bonding pad electrically connected to the first conductivity type semiconductor layer and a second bonding pad electrically connected to the second conductivity type semiconductor layer, and may be provided in a horizontal light emitting device which light is emitted between the first bonding pad and the second bonding pad.

The flip-chip light emitting device in which the light is emitted in the six-sided direction may include a reflective portion which an insulating layer is disposed between the first and second bonding pads and a transmissive region emitting a light, and may be provided in a transmissive flip-chip light emitting device. Here, the transmission type flip chip light emitting device means a device that emits light to six surfaces of an upper surface, four side surfaces, and a lower surface. In addition, the reflection type flip chip light emitting device means a device that emits light to the upper surface and the four side surfaces.

Hereinafter, an example of a flip chip light emitting device applied to a light emitting device package according to an embodiment of the present invention will be described with reference to the accompanying drawings.

Figure 30:
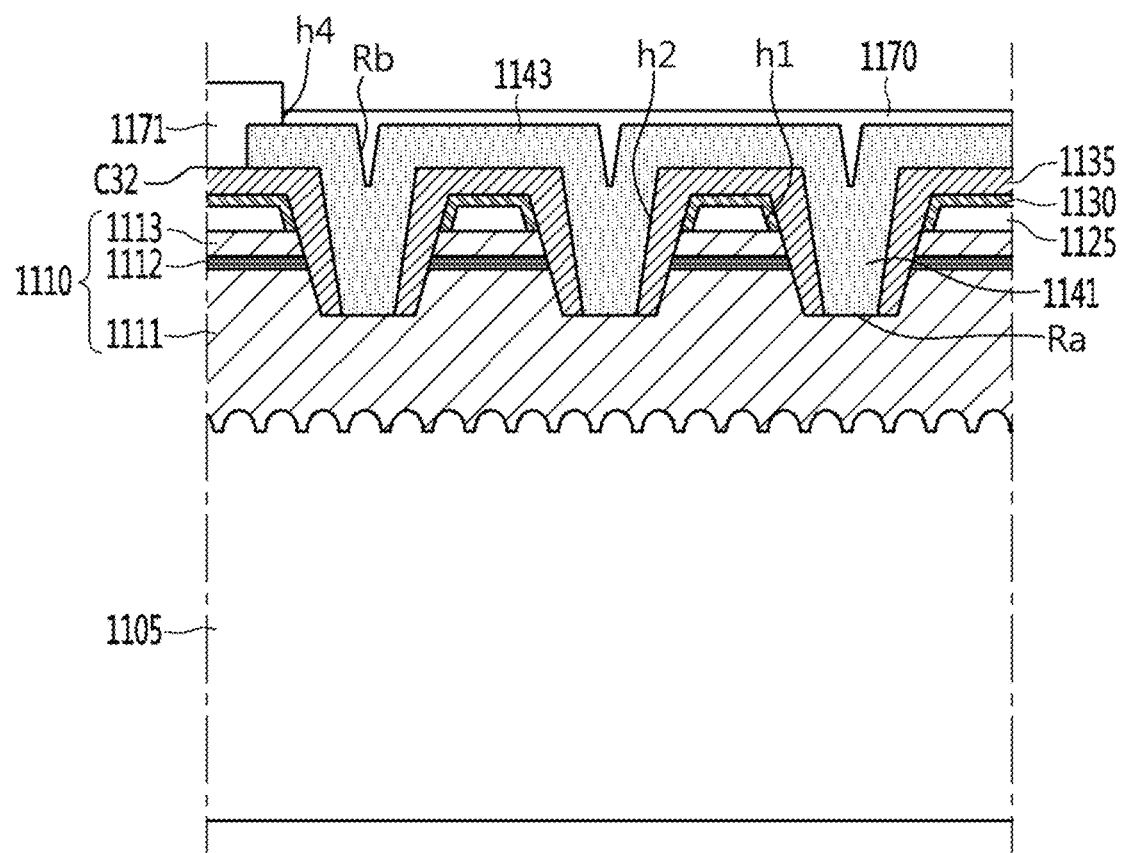
FIG. 30 is a side sectional view of a region passing through a first bonding pad in the light emitting device of FIG. 29.
Figure 31:
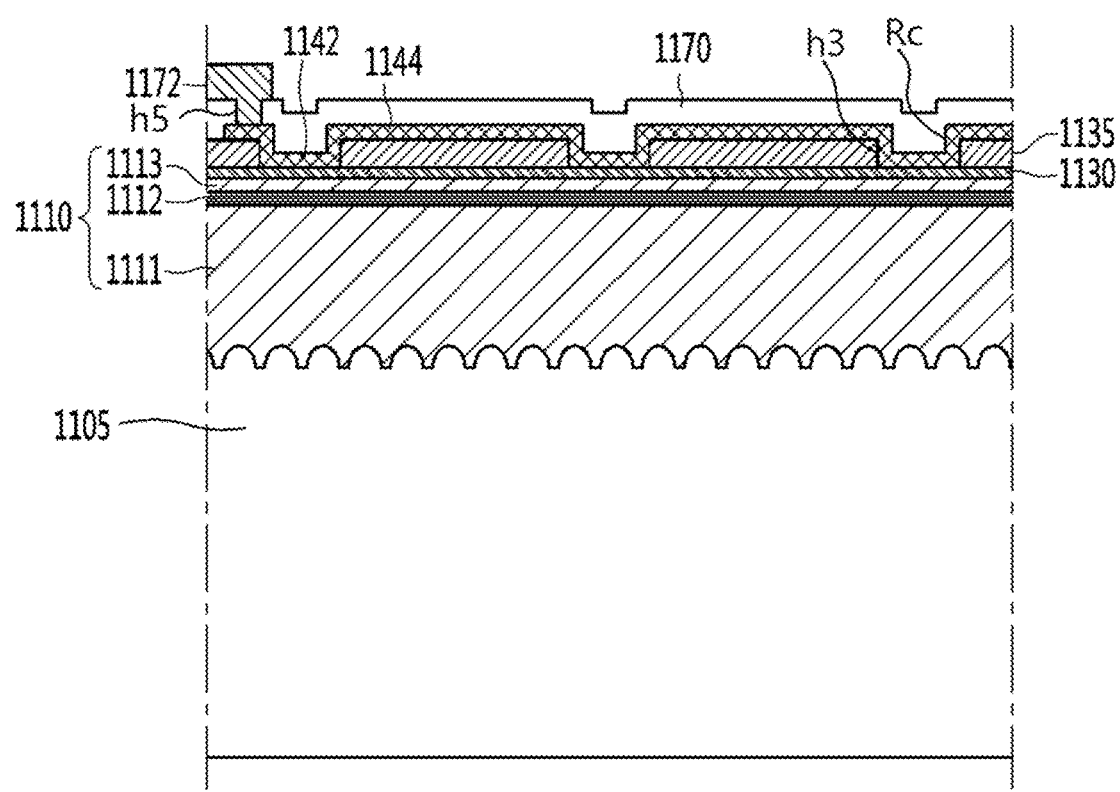
FIG. 31 is a side sectional view of a region passing through a second bonding pad in the light emitting device of FIG. 29.

Referring to FIGS. 29 to 31, a light emitting device according to an embodiment of the present invention will be described. FIG. 29 is a plan view of a light emitting device according to an embodiment of the present invention, FIG. 30 is a side sectional view of a region passing through a first electrode and a first bonding pad in the light emitting device of FIG. 29, FIG. 31 is a sectional view of the region passing through the second electrode and the second bonding pad in the light emitting device of FIG. 29. As shown in FIG. 29, the light emitting device includes a first electrode 1141 electrically connected to the first bonding pad 1171 and a first bonding pad 1171 and a second bonding pad 1172 disposed thereunder, a second electrode 1142 electrically connected to the second bonding pad 1172 may be shown.

As shown in FIGS. 30 and 31, the light emitting device 1000 according to the embodiment may include the light emitting structure 1110 disposed on the substrate 1105. The substrate 1105 may be selected from the group consisting of a sapphire substrate ($Al_2O_3$), SiC, GaAs, GaN, ZnO, Si, GaP, InP and Ge. For example, the substrate 1105 may have a concavo-convex pattern on its upper surface, and may be provided as a patterned sapphire substrate (PSS).

The light emitting structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112. The substrate 1105 and the light emitting structure 1110 may be defined as a light emitting part.

The light emitting structure 1110 may be provided as a compound semiconductor. The light emitting structure 1110 may be formed of, for example, a Group II-VI or Group III-V compound semiconductor. For example, the light emitting structure 1110 may include at least two or more elements selected from aluminum (Al), gallium (Ga), indium (In), phosphorus (P), and arsenic (As).

For example, the first conductivity type semiconductor layer 1111 may be provided as a Group II-VI compound semiconductor or a Group III-VI compound semiconductor. For example, the first conductivity type semiconductor layer 1111 may be a semiconductor material having a composition formula of $In_xAl_yGa_{1-x-y}N$ ($0 \le x \le 1$, $0 \le y \le 1$, $0 \le x+y \le 1$) or $(Al_xGa_{1-x})_yIn_{1-y}P$ ($0 \le x \le 1$, $0 \le y \le 1$). For example, the first conductivity type semiconductor layer 1111 may be selected from the group consisting of GaN, AlN, AlGaN, InGaN, InN, InAlGaN, AlInN, AlGaAs, GaP, GaAs, GaAsP, AlGaInP, AlInP and GaInP, and an n-type dopant selected from the group including Si, Ge, Sn, Se and Te may be doped.

For example, the active layer 1112 may be provided as a Group II-VI compound semiconductor or a Group III-VI compound semiconductor. For example, the active layer 1112 may be formed of a semiconductor material having a composition formula of $In_xAl_yGa_{1-x-y}N$ ($0 \le x \le 1$, $0 \le y \le 1$, $0 \le x+y \le 1$) or $(Al_xGa_{1-x})_yIn_{1-y}P$ ($0 \le x \le 1$, $0 \le y \le 1$). For example, the active layer 1112 may be selected from the group consisting of GaN, AlN, AlGaN, InGaN, InN, InAlGaN, AlInN, AlGaAs, GaP, GaAs, GaAsP, AlGaInP, AlInP, and GaInP. For example, the active layer 1112 may be provided in a multi-well structure, and may include a plurality of barrier layers and a plurality of well layers.

For example, the second conductivity type semiconductor layer 1113 may be provided as a Group II-VI compound semiconductor or a Group III-VI compound semiconductor. For example, the second conductivity type semiconductor layer 1113 may be a semiconductor material having a composition formula of $In_xAl_yGa_{1-x-y}N$ ($0 \le x \le 1$, $0 \le y \le 1$, $0 \le x+y \le 1$) or $(Al_xGa_{1-x})_yIn_{1-y}P$ ($0 \le x \le 1$, $0 \le y \le 1$). For example, the second conductivity type semiconductor layer 1113 may be selected from the group consisting of GaN, AlN, AlGaN, InGaN, InN, InAlGaN, AlInN, AlGaAs, GaP, GaAs, GaAsP, AlGaInP, AlInP and GaInP, and a p-type dopant selected from the group including Mg, Zn, Ca, Sr, and Ba may be doped.

According to the embodiment, the first conductivity type semiconductor layer 1111 may be provided as an n-type semiconductor layer, and the second conductivity type semiconductor layer 1113 may be provided as a p-type semiconductor layer. According to another embodiment, the first conductivity type semiconductor layer 1111 may be provided as a p-type semiconductor layer, and the second conductivity type semiconductor layer 1113 may be provided as an n-type semiconductor layer. The light emitting structure 1110 includes a plurality of recesses Ra penetrating the second conductivity type semiconductor layer 1113 and the active layer 1112 to expose a portion of the first conductivity type semiconductor layer 1111.

The light emitting device 1000 according to the embodiment may include an ohmic contact layer 1130. The ohmic contact layer 1130 may be disposed on the light emitting structure 1110. As shown in FIG. 31, the ohmic contact layer 1130 may be disposed on the second conductivity type semiconductor layer 113. The ohmic contact layer 1130 may be disposed on the first insulating layer 1125 when the first insulating layer 1125 is disposed on a partial region of the second conductivity type semiconductor layer 113 as shown in FIG. 30. The ohmic contact layer 1130 can improve current diffusion and increase light output. For example, the ohmic contact layer 1130 may include at least one selected from the group consisting of a metal, a metal oxide, and a metal nitride. The ohmic contact layer 1130 may include a light-transmitting material. The ohmic contact layer 1130 may be formed of a material such as indium tin oxide (ITO), indium zinc oxide (IZO), indium zinc oxide (IZON), indium zinc oxide (IZTO), indium aluminum zinc oxide indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/IrOx/Au/ITO, Pt, Ni, Au, Rh, and Pd.

As shown in FIGS. 29 to 31, the light emitting device 1000 according to the embodiment may include insulating layers 1125, 1135, and 1170 on the light emitting structure 1110. The insulating layers 1125, 1135, and 1170 may include a first insulating layer 1125 and a second insulating layer 1135. The first insulating layer 1125 may be disposed on the light emitting structure 1110 and/or on the ohmic contact layer 1130. The first insulating layer 1125 may include a plurality of first openings h1. Each of the first openings h1 may be overlapped with each of the recesses Ra in a third direction. The second insulating layer 1135 may be disposed on the ohmic contact layer 1130.

At least one of the first insulating layer 1125, the second insulating layer 1135 and the third insulating layer 1170 may include at least one selected from the group consisting of, for example, $Si_xO_y$, $SiO_xN_y$, $Si_xN_y$, and $Al_xO_y$. Light emitted between the first insulating layer 1125 and the second insulating layer 1135 may be incident on the adhesive disposed in a recess R of the body as shown in FIG. 3. The light emitted in the lower direction of the light emitting device may be light-diffused by the adhesive 130 in FIG. 3, and the light extraction efficiency can be improved. An additional insulating layer may be further disposed between the first and second insulating layers 1125 and 1135 to reflect the incident light in the adhesive direction. At least one of the first and second insulating layers 1125 and 1135 may be a DBR (Distributed Bragg Reflector) layer or an ODR (Omni Directional Reflector) layer. In addition, any one of the first and second insulating layers may be provided by stacking a DBR layer and an ODR layer.

When the first electrode 1141 and the second electrode 1142 have different polarities, they may be arranged in different numbers of electrodes. For example, when the first electrode 1141 is an n-electrode and the second electrode 1142 is a p-electrode, the number of the second electrodes 1142 may be larger than that of the first electrode 1141. When the electrical conductivity and/or resistance of the second conductivity type semiconductor layer 1113 and the first conductivity type semiconductor layer 1111 are different from each other, an electrons and the holes injected into the light emitting structure 1110 by the first electrode 1141 and the second electrode 1142 may be balanced and the optical characteristics of the light emitting device can be improved.

The first electrode 1141 and the second electrode 1142 may have a single-layer structure or a multi-layer structure. For example, the first electrode 1141 and the second electrode 1142 may be ohmic electrodes. For example, the first electrode 1141 and the second electrode 1142 may be formed of one selected from the group consisting of ZnO, IrOx, RuOx, NiO, RuOx/ITO, Ni/IrOx/Au, and Ni/IrOx/Au/ITO, and at least one of Cr, Ti, Al, Rh, Pd, Ir, Ru, Mg, Zn, Pt, Au and Hf or an alloy of two or more of them.

Referring to FIG. 31, the second insulating layer 1135 is disposed on the first insulating layer 1125 and includes a plurality of second opening h2 which are overlapped with the plurality of first openings h1 in the third direction. The second insulating layer 1135 may include a third opening h3 spaced apart from the second opening h2. Referring to FIGS. 29 and 30, the first electrode 1141 is disposed through the second opening h2 of the second insulating layer 1135 and the first opening h1 of the first insulating layer 1125, The first electrode 1141 may be connected to the first conductivity type semiconductor layer 1111 in the recess Ra.

The first electrodes 1141 disposed in the plurality of first openings h1 may be connected to each other by a first branched electrode 1143. The first electrode 1141 is in contact with the first conductivity type semiconductor layer 1111 in the different regions and is connected to each other by the first branch electrode 1143. Accordingly, the light emitting structure 11110 can be supplied with the current diffused through the entire region. A plurality of first branched electrodes 1143 may extend from the region of the first bonding pad 1171 toward the second bonding pad 1172. Also, the first branched electrodes 1143 may have a long length in the first direction, and one or more than two first branched electrodes may be disposed in the second direction. The first branched electrode 1143 may include a concave structure Rb that overlaps with the recess Ra.

The first electrode 1141 and the first branched electrode 1143 may be electrically connected to the first conductivity type semiconductor layer 1111. At least one or both of the first electrode 1141 and the first branch electrode 1143 may be connected to the first bonding pad 1171. The first bonding pad 1171 may be disposed through the fourth opening h4 of the third insulating layer 1170. The first bonding pad 1171 may have a plurality of contact regions C21 and C22 through the fourth opening h4 and may be connected to the first branched electrode 1143 and the first electrode 1141. When the plurality of contact regions C21 and C22 are spaced apart from each other, the connection part 1124 may connect the plurality of contact regions C21 and C22 to each other. The first bonding pad 117 may be spaced a predetermined distance W from the chip edge to reduce electrical or physical interference transmitted from the chip edge.

As shown in FIGS. 29 and 31, the second insulating layer 1135 may include a plurality of third openings h3. The second electrode 1142 may be connected to the ohmic contact layer 1130 and the second conductivity type semiconductor layer 1113 through the third opening h3 of the second insulating layer 1135. The second electrodes 1142 connected through the plurality of third openings h3 may be connected to each other by a second branch electrode 1144. The second bonding pad 1172 has a plurality of contact regions C31, C32 and C33 through the fifth opening h5 and may be connected to the second branched electrode 1144 and the second electrode 1142. The plurality of contact regions C31, C32, and C33 may be connected through a connection part. A plurality of second branched electrodes 1142 may extend from the second bonding pad 1172 toward the first bonding pad 1171. The second electrode 1142 and the second branched electrode 1144 may be electrically connected to the second conductivity type semiconductor layer 1113.

The first and second branched electrodes 1142 and 1144 may be alternately arranged in the second direction. The first and second branched electrodes 1142 and 1144 may have a long length in the first direction and may be arranged in the second direction. Any one of the first and second branched electrodes 1142 and 1144 may be arranged in a larger number than the other. For example, the number of the second branched electrodes 1144 may be larger than that of the first branched electrodes 1142.

The third insulating layer 1170 may be disposed on the first electrode 1141, the first branched electrode 1143, the second electrode 1142, and the second branched electrode 1144, and a surface of the device can be protected by the third insulating layer 1170. The third insulating layer 1170 may include fourth and fifth openings h4 and h5 for opening the first and second bonding pads 1171 and 1172.

As shown in FIG. 29, the first branched electrodes 1142 may have one or more line shapes and extend in the direction of the second bonding pad 1172. One or more first electrodes 1141 may be disposed under the first branched electrodes 1142. The second branched electrode 1144 may have a line shape between the first branch electrode 1142 and the outside and may extend in the direction of the first bonding pad 1171. The second electrodes 1142 may be disposed under the second branched electrodes 1144. The line-shaped electrode may be a branch electrode or an arm electrode. The first and second branched electrodes 1142 and 1144 may be disposed to be offset from each other and extend in a direction facing each other.

The first bonding pad 1171 may include a first concave portion OP1. The first concave portions OP1 may be disposed in one or more. The first concave portion OP1 may be disposed in a region where at least one of the plurality of second branched electrodes 1144 extends in the direction of the first bonding pad 1171 and is disposed at a region between the contact regions C21 and C22 of the first bonding pad 1171. The first concave portion OP1 may be disposed on the second branched electrode 1144. The plurality of second electrodes 1142 may be disposed on the first concave portion OP1 in a region overlapping the second branched electrodes 1144 in the vertical direction. Since the second electrode 1142 and the second branched electrode 1144 are disposed in the peripheral region of the first bonding pad 1171, and the current in the light emitting structure 1110 can be diffused. The first recess OP1 may be an open region or a non-contact region of the first bonding pad 1171.

The second bonding pad 1172 may include a first concave portion OP2. The second concave portions OP2 may be disposed in one or more. The number of the second concave portion OP2 may be the same as or different from the number of the first concave portion OP1. The first and second concave portions OP1 and OP2 may be disposed in regions facing each other or not facing each other. The second concave portion OP2 is disposed in a region where at least one of the plurality of first branch electrodes 1143 extends in the direction of the second bonding pad 1172 and may are disposed at region between the contact regions C31, C32, and C33 of the second bonding pad 1172. The first branched electrode 1143 may be disposed in the second concave portion OP2. A plurality of first electrodes 1141 may be disposed in a region overlapping with the first branched electrodes 1143 disposed in the second concave portion OP2 in the vertical direction. Since the first electrode 1141 and the first branched electrode 1143 are disposed in the peripheral region of the second bonding pad 1172, the current in the light emitting structure can be diffused. The second concave portion OP2 may be an open region or a non-contact region of the second bonding pad 1172. The first concave portion OP1 and the second concave portion OP2 may be arranged so as not to overlap in the first direction.

The first concave portion OP1 may be a non-contact region extending from the region adjacent to the second bonding pad 1172 to the inside of the first bonding pad 1711. The second concave portion OP2 may be a non-contact region extending from the region adjacent to the first bonding pad 1171 to the inside of the second bonding pad 1172.

The number of the second concave portion OP2 is larger than the number of the first concave portion OP1 and the number of the second branched electrode 1144 is larger than the number of the second concave portion OP2, and the number of the first branched electrodes 1143 may be equal to the number of the second concave portions OP2. The size of the second bonding pad 1172 may be larger than the size of the first bonding pad 1171.

According to the embodiment, since power can be supplied through a plurality of contact regions, a current dispersion effect can be generated according to an increase in the contact area and dispersion of branch electrodes, and the operation voltage can be reduced.

As shown in FIG. 30, the first insulating layer 1125 and the second insulating layer 1135 reflect light emitted from the active layer 1112 of the light emitting structure 1110, and it is possible to minimize the occurrence of light absorption at the first and second electrodes and improve the luminous intensity Po. For example, the first insulating layer and the second insulating layer may have a DBR structure. The DBR structure may be arranged in a multi-layer structure including different materials such as $TiO_2$, $SiO_2$, $Ta_2O_5$, and $HfO_2$.

The first insulating layer 1125 and the second insulating layer 1135 may be freely selected so as to adjust the reflectivity of the light emitted from the active layer 1112 in accordance with the wavelength of light emitted from the active layer 1112. According to an embodiment, the first insulating layer 1125 and the second insulating layer 1135 may be provided as an ODR layer. According to another embodiment, the first insulating layer 1125 and the second insulating layer 1135 may be provided as a hybrid type in which a DBR layer and an ODR layer are stacked.

When the light emitting device according to the embodiment is mounted by a flip chip bonding method and is implemented as a light emitting device package, the light provided from the light emitting structure 1110 may be emitted through the substrate 1105. Light emitted from the light emitting structure 1110 may be reflected by the first insulating layer 1125 and the second insulating layer 1135 and may be emitted toward the light transmitting substrate 1105. Light emitted from the light emitting structure 1110 may also be emitted in a lateral direction of the light emitting structure 1110. The light emitted from the light emitting structure 1110 may be transmitted to the outside through a region between the first bonding pad 1171 and the second bonding pad 1172 among the surfaces on which the first bonding pad 1171 and the second bonding pad 1172 are disposed. The light emitting device 1000 can emit light in six-sided directions, and the light intensity can be remarkably improved.

According to the light emitting device according to the embodiment, when viewed from the upper direction of the light emitting device 1000, the sum of the area of the first bonding pad 1171 and the area of the second bonding pad 1172 in the upper direction of the light emitting device 1000 is smaller than the sum of the areas of the first bonding pad 1171 and the second bonding pad 1172, and may be equal to or smaller than 60% of the entire area of the upper surface of the light emitting device 1000 in which the bonding pads 1171 and the second bonding pads 1172 are disposed.

For example, the entire area of the upper surface of the light emitting device 1000 may correspond to an area defined by a lateral length and a longitudinal length of the lower surface of the first conductivity type semiconductor layer 1111 of the light emitting structure 1110. The entire area of the upper surface of the light emitting device 1000 may correspond to the area of the upper surface or the lower surface of the substrate 1105.

The sum of the areas of the first bonding pad 1171 and the second bonding pad 1172 is equal to or smaller than 60% of the entire area of the light emitting device 1000, The amount of light emitted to the surface on which the first bonding pad 1171 and the second bonding pad 1172 are disposed can be increased. Accordingly, according to the embodiment, since the amount of light emitted toward the six-sided surfaces of the light emitting device 1000 is increased, the light extraction efficiency can be improved and the light intensity Po can be increased. The first bonding pad 1171 and the second bonding pad 1172 may have the same area ratio, the area of the first bonding pad 1171 may be 1% or less with respect to an area of the second bonding pad 1172, or the area of the first bonding pad 1171 may be as smaller as in a range of 1% to 40% than an area of the second bonding pad 1172. The first bonding pad 1172 may be spaced a predetermined distance W from the chip side.

When viewed from the upper direction of the light emitting device 1000, the sum of the area of the first bonding pad 1171 and the area of the second bonding pad 1172 in the upper direction of the light emitting device is equal to or greater than 30% the entire area of the light emitting device 1000. By thus providing the sum of the areas of the first bonding pad 1171 and the second bonding pad 1172 equal to or greater than 30% of the entire area of the light emitting device 1000, stable mounting can be performed through the first bonding pad 1171 and the second bonding pad 1172 and the electrical characteristics of the light emitting device 1000 can be secured.

In the light emitting device 1000 according to the embodiment, the sum of the areas of the first bonding pads 1171 and the second bonding pads 1172 is in the range of 30% to 60% of the entire areas of the light emitting device 1000 in order to secure light extraction efficiency and stability of bonding. That is, when the sum of the areas of the first bonding pad 1171 and the second bonding pad 1172 is in the range of 30% to 100% of the entire area of the light emitting device 1000, the electrical characteristics are improved, and the bonding force of the light emitting device can be stable.

When the sum of the areas of the first bonding pad 1171 and the second bonding pad 1172 is more than 0% to 60% of the entire area of the light emitting device 1000, the amount of light emitted to the surface on which the first bond pad 1171 and the second bonding pad 1172 are disposed is increased to improve the light extraction efficiency of the light emitting device 1000 and increase the light intensity Po.

When the area of the third insulating layer 1170 is 10% or more of the entire upper surface of the light emitting device 1000, the package body disposed under the light emitting device may be discolored or prevented from cracking. And when it is 25% or less, it is advantageous to secure the light extraction efficiency to emit light to the six-sided surfaces of the light emitting device.

The light emitted from the light emitting structure 1110 does reflected without being incident to the first bonding pad 1171 and the second bonding pad 1172 and the second insulating layer 1135 by the first insulating layer 1125 and the second insulating layer 1135. Accordingly, according to the embodiment, light generated and emitted from the light emitting structure 1110 can be minimized by being incident on the first bonding pad 1171 and the second bonding pad 1172.

According to the light emitting device 1000 according to the embodiment, since the third insulating layer 1170 is disposed between the first bonding pad 1171 and the second bonding pad 1172, the amount of light emitted between the first bonding pad 1171 and the second bonding pad 1172 can be controlled.

As described above, the light emitting device 1000 according to the embodiment may be mounted in a flip chip bonding manner, for example, and provided as a light emitting device package. At this time, when the package body on which the light emitting device 1000 is mounted is provided by resin or the like, the package body is discolored or cracked due to strong short-wavelength light emitted from the light emitting device 1000 in the lower region of the light emitting device 1000.

When the first and second insulating layers 1125 and 1135 and the ohmic contact layer 1130 are in contact with each other, the coupling force or the adhesion between the first and second insulating layers 1125 and 1135 and the ohmic contact layer 1130 may be weakened. For example, when the insulating layer and the metal layer are combined, the bonding force or adhesion between the materials may be weakened.

For example, if the bonding force or adhesive force between the insulating layers 1125 and 1135 and the ohmic contact layer is weak, peeling may occur between the two layers. If the peeling occurs between the insulating layers 1125 and 1135 and the ohmic contact layer, the characteristics of the light emitting device 1000 may deteriorate and the reliability of the light emitting device 1000 may not be secured.

In the light emitting device package according to the embodiment, at least one or all of the electrodes of the light emitting device according to the embodiment may correspond to the through hole of the frame or the body, and at least one of the electrodes corresponding to the through hole may correspond to the through hole in a region that is not in contact with the conductive part and in a region contacting with the conductive part. Accordingly, the electrode of the light emitting device may receive driving power through at least one of the frame and the conductive part. Since an area of the contact region between the conductive part and the electrode is smaller than the upper surface area of the through hole, the adhesive force between the conductive part and the electrode may be alleviated, so that the interface separation between the electrode and the semiconductor layer may be prevented.

The melting point of the conductive part disposed in the through hole may be selected to have a higher value than the melting point of the common bonding material. Therefore, the light emitting device package according to the embodiment has the advantage that the electrical connection and the physical bonding force are not deteriorated because the re-melting phenomenon does not occur even when the light emitting device package according to the embodiment is bonded to the main substrate through a reflow process have.

According to the light emitting device package according to the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

According to the embodiments of the present invention, it is possible to reduce the damage to the bonding pads by providing a contact region and a non-contact region in the bonding pads of the light emitting device at regions corresponding to the through holes of the package body. The light extraction efficiency and electrical characteristics of the light emitting device package can be improved. The process efficiency of the light emitting device package is improved and a new package structure is presented, so that the manufacturing cost can be reduced and the manufacturing yield can be improved. The package according to the embodiment of the present invention can prevent the reflector from being discolored by providing the body having high reflectance, thereby improving the reliability of the semiconductor device package. According to the light emitting device or the light emitting device package according to the embodiment of the present invention, stable bonding can be performed by providing a small pressure at a low temperature. In the process of re-bonding to a substrate, re-melting phenomenon can be prevented. The reliability of the semiconductor device package or the light emitting device package according to the embodiment of the invention can be improved.

Third Embodiment

Referring to FIGS. 32 to 35, a method of manufacturing a light emitting device package according to a third embodiment of the invention will be described. In the description of the third embodiment, descriptions overlapping with those described in the first and second embodiments may be omitted, and the configurations of the first and second embodiments may be selectively included.

Figure 32:
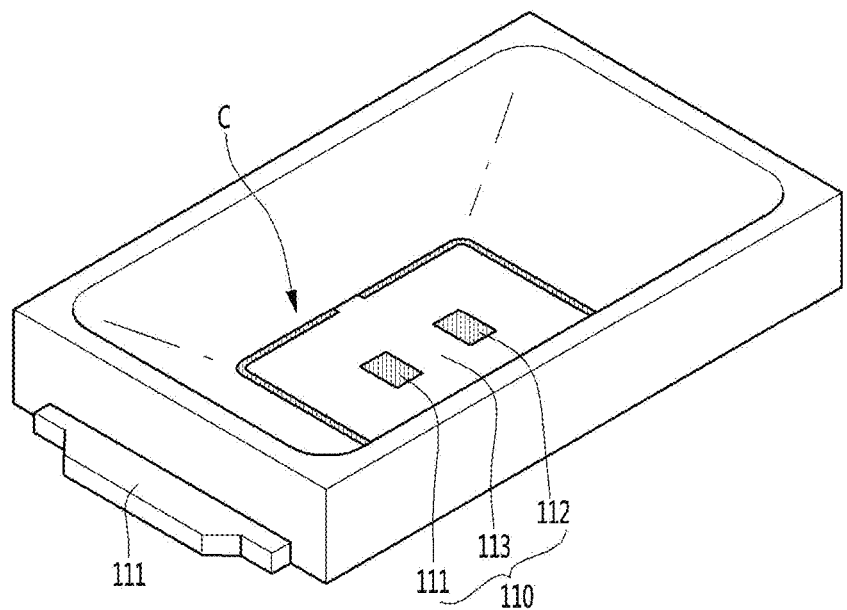
FIGS. 32 to 35 illustrate a method for manufacturing a light emitting device package according to a third embodiment of the invention.

Referring to FIG. 32, a package body 110 may include a first frame 111, a second frame 112, and a body 113. The body 113 may be disposed between the first frame 111 and the second frame 112. The first and second frames 111 and 112 may be formed of a conductive material, and the body 113 may be provided as an insulating member. The body 113 may be coupled to the first and second frames 111 and 111. The body 113 may be disposed above or below the first and second frames 111 and 111.

The package body 110 may be provided with a cavity C and may be provided with a flat upper surface without a cavity C. The package body 110 may include first and second frames 111 and 112 exposed at the bottom of the cavity C. The first and second bonding pads of the light emitting device 120 according to the embodiment may be electrically connected to the first and second frames 111 and 112, respectively. By way of example, the body 113 can be selected from the materials disclosed in the first embodiment, and the description of the first embodiment will be referred to.

Figure 33:
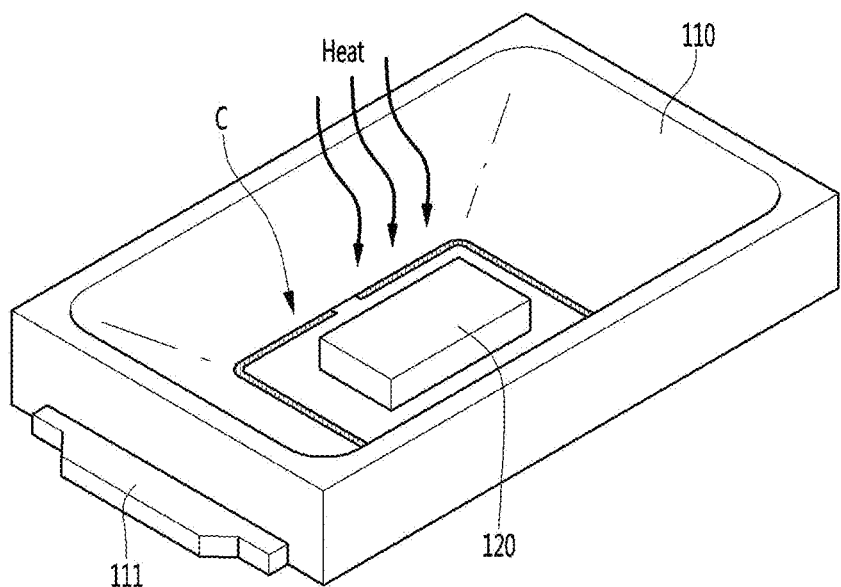

As shown in FIG. 33, the light emitting device 120 may be disposed on and bonded to the package body 110.

A first bonding pad of the light emitting device 120 may be disposed on the first frame 111 and a second bonding pad of the light emitting device 120 may be disposed on the second frame 112. The first bonding pads and the second bonding pads of the light emitting device 120 may be disposed on the pad portion of the first frame 111 and the pad portion of the second frame 112.

When the light emitting device 120 is disposed on the package body 110, the light emitting device 120 is pre-bonded to the package body 110 by applying low temperature heat to the package body 110. For example, the first bonding pad of the light emitting device 120 may be bonded to the first frame 111, and the second bonding pad of the light emitting device 120 may be bonded to the second frame 112.

When the light emitting device 120 is pre-bonded on the package body 110, an air reflow process may be performed. The coupling between the first bonding pad and the first frame 111 may be performed by the air reflow process. The bonding between the first bonding pad and the pad portion of the first frame 111 can be progressed by the air reflow process. The second bonding pad and the pad portion of the second frame 112 may be coupled by the air reflow process. The pad portion of the second frame 112 may be coupled with the second bonding pad by the air reflow process.

By the air-reflow process, the bonding between the first and second bonding pads and the first and second frames 111 and 112 can form an intermetallic compound (IMC) layer. By the air reflow process, the bonding between the first and second bonding pads and the pad portions of the first and second frames 111 and 112 can form an intermetallic compound layer. For example, the first and second bonding pads may be formed of an intermetallic compound layer or may include an intermetallic compound layer. Accordingly, the first bonding pad and the first frame 111 can be stably bonded. In addition, the second bonding pad and the second frame 112 can be stably bonded.

Figure 36:
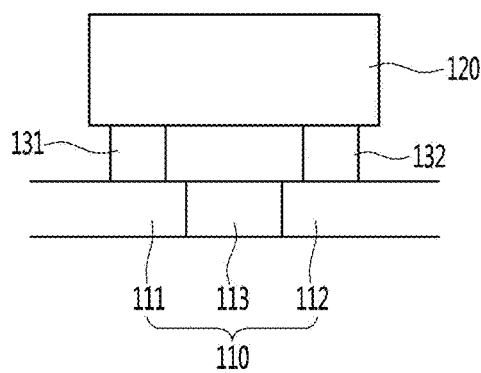
FIG. 36 is a view illustrating a bonding state between a light emitting device in which a reflow process is performed and a bonding state between a first frame and a second frame by a method for manufacturing a light emitting device package according to a third embodiment.

FIG. 36 is a view for explaining the bonding state between the light emitting device 120 and the first and second frames 111 and 112 in which the reflow process is performed according to the third embodiment of the present invention.

Referring to FIG. 36, first and second intermetallic compound layers 131 and 132 may be formed between the light emitting device 120 and the first and second frames 111 and 112. For example, a first intermetallic compound layer 131 is formed by intermetallic bonding at a bonding portion of the first bonding pad of the light emitting device 120 and the pad portion of the first frame 111 or the first frame 111. The second intermetallic compound layer 132 may be formed by intermetallic bonding between the second bonding pad of the light emitting device 120 and the pad portion of the second frame 112 or the second frame 112. For example, the first and second intermetallic compound layers 131 and 132 may include Ag and Sn.

The first intermetallic compound layer 131 may be electrically connected to the first frame 111. The first intermetallic compound layer 131 may be electrically connected to the first electrode or the first bonding pad of the light emitting device 120. The second intermetallic compound layer 132 may be electrically connected to the second frame 112. The second intermetallic compound layer 132 may be electrically connected to the second electrode or the second bonding pad of the light emitting device 120.

Here, the pre-bonding process and the air reflow process may be performed at a lower temperature than a conventional example. As an example, the bonding process of the conventional example proceeds at 280° C. to 320° C., but the pre-bonding process and the air reflow process can be performed at a temperature of 230° C. or less. For example, the pre-bonding process and the air reflow process may be performed at a temperature of 200° C. or lower. In order to perform the pre-bonding and the air reflow at a relatively low temperature, the metal scheme between the first and second bonding pads and the first and second frames 111 and 112 is appropriately should be set.

An example of forming a metal scheme and an intermetallic compound (IMC) layer between the first and second bonding pads and the first and second frames 111 and 112 will be described later. The intermetallic compound layer may include at least two metals, and the at least two metals may include Ag and Sn. The at least two metals may be a metal included in the bonding pad and a metal included in the frame.

Figure 34:
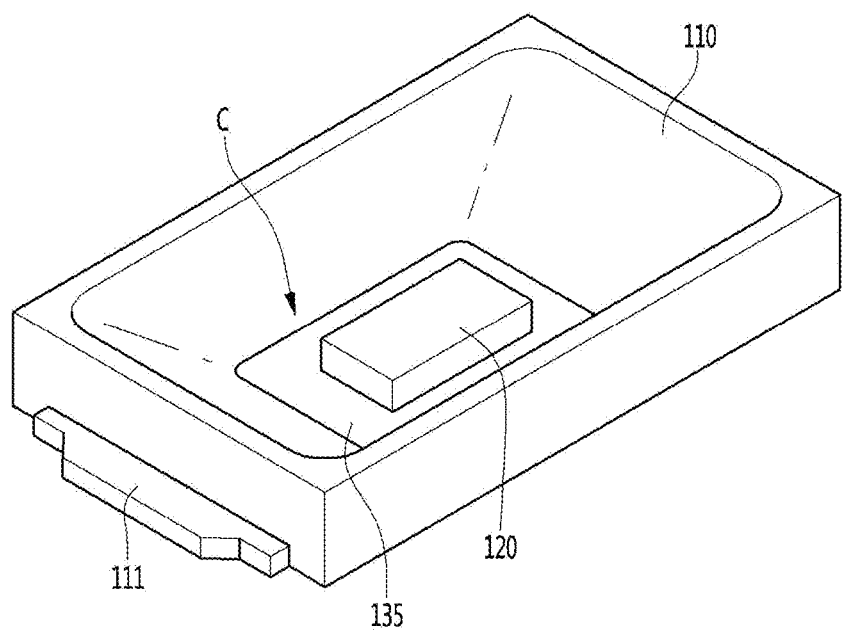

As shown in FIG. 34, when the light emitting device 120 is fixed, a resin part 135 may be formed around the lower part of the light emitting device 120. The resin part 135 may be disposed around the light emitting device 120. The resin part 135 may be disposed around and below the light emitting device 120. The resin part 135 may be disposed on the side surfaces of the first and second bonding pads of the light emitting device 120. The resin part 135 may be in contact with the side surfaces of the bonding pad and the light emitting device 120.

For example, the resin part 135 may include at least one of a hybrid material including an epoxy-based material, a silicone-based material, an epoxy-based material, and a silicon-based material. The resin part 135 may be a reflection part that reflects light emitted from the light emitting device 120. The resin part 135 may be, for example, a resin including a reflective material such as $TiO_2$, or may include white silicone.

When the resin part 135 includes a material having a reflective property such as white silicon, the resin part 135 may transmit light from the light emitting device 120 to the upper part of the package body 110. The light extraction efficiency of the light emitting device package can be improved.

Figure 35:
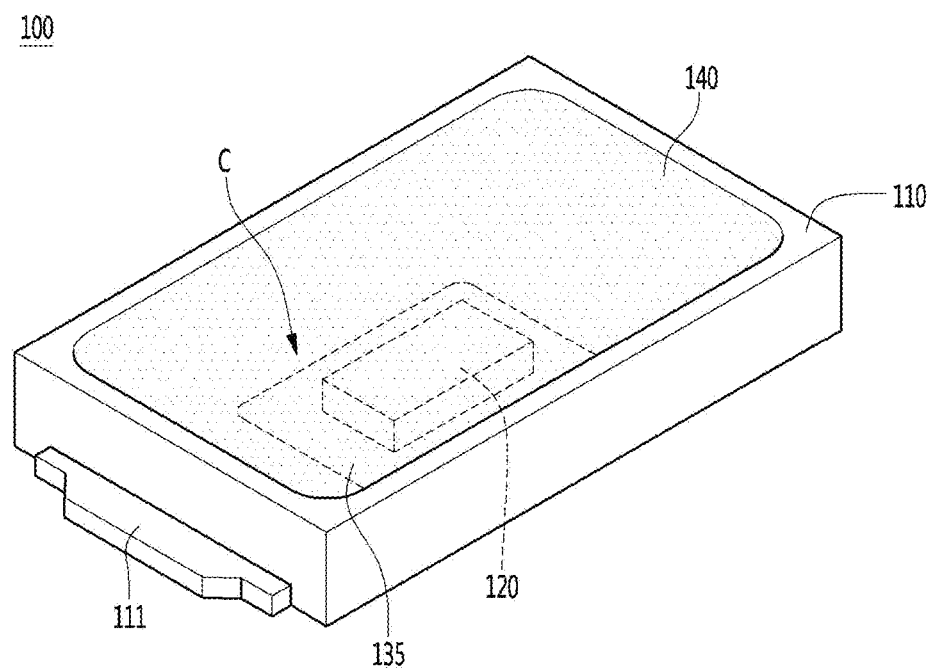

Referring to FIG. 35, a molding part 140 may be provided on the light emitting device 120. The molding part 140 may be provided on the light emitting device 120. The molding part 140 may be disposed on the first frame 111 and the second frame 112. The molding part 140 may be disposed in the cavity C provided by the package body 110 and may cover the light emitting device 120. The molding part 140 may be in contact with the resin part 135. The cavity C may be disposed inside the wall portion 110A.

The molding part 140 may include an insulating material. In addition, the molding part 140 may include a wavelength conversion member, and the wavelength conversion member may convert wavelength of light emitted from the light emitting device 120. For example, the wavelength conversion member of the molding part 140 may include at least one selected from the group including phosphors, quantum dots, and the like. According to another example, only the molding part 140 may be formed in the cavity of the package body 110 without forming the resin part 135. When the molding part 140 is formed, the light emitting device package 101 may be provided. The light emitting device package 101 according to the third embodiment may be mounted on a submount, a circuit board, or the like.

However, when the conventional light emitting device package is mounted on a submount, a circuit board or the like, a high temperature process by reflow can be applied. At this time, in the reflow process, re-melting phenomenon may occur in the bonding region between the frame and the light emitting device provided in the conventional light emitting device package. The stability of the electrical connection and physical coupling may be weakened, the position of the light emitting device may be tilted by re-melting, and the optical and electrical reliability of the light emitting device package may be deteriorated.

However, according to the light emitting device package and the manufacturing method thereof according to the third embodiment, the melting point of the intermetallic compound layer due to the bonding between the first and second bonding pads of the light emitting device 120 and the first and second frames 111 and 112 is higher than the melting point of common bonding materials. Therefore, even when the light emitting device package 101 according to the embodiment is bonded to the main substrate or the substrate through a reflow process, the re-melting phenomenon does not occur, so that the electrical connection and the physical bonding force are not deteriorated. Also, in the manufacturing process of the light emitting device package 101 according to the embodiment, since the pre-bonding process and the air reflow process are performed at a relatively low temperature, the package body 110 may not be exposed to high temperatures. The package body 110 can be prevented from being damaged or discolored by heat.

Further, the selection for the material constituting the body 113 can be widened. For example, the body 113 may be provided using a relatively inexpensive resin material as well as an expensive material such as ceramics. For example, the body 113 may include at least one material selected from the group consisting of PPA (Polyphthalamide) resin, PCT (PolyCyclohexylenedimethylene Terephthalate) resin, EMC (Epoxy Molding Compound) resin and SMC (Silicone Molding Compound) resin.

Next, an example of a metal scheme of a light emitting device and a light emitting device package according to a third embodiment of the present invention will be described with reference to the accompanying drawings.

Figure 37:
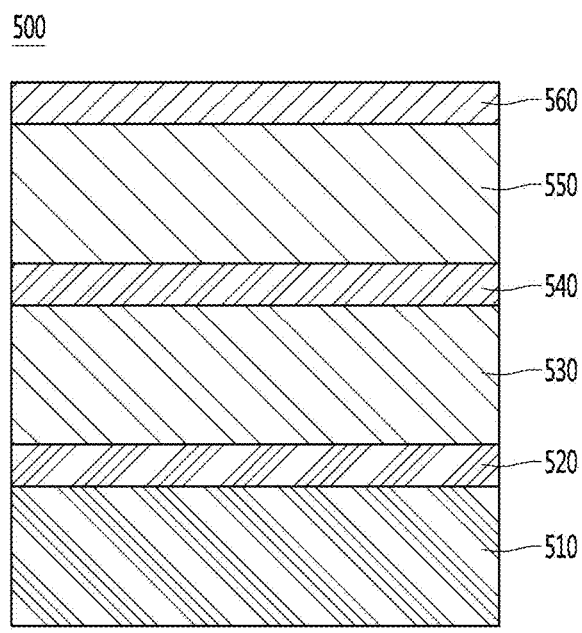
FIG. 37 illustrates an example of a light emitting device according to a third embodiment of the invention.
Figure 38:
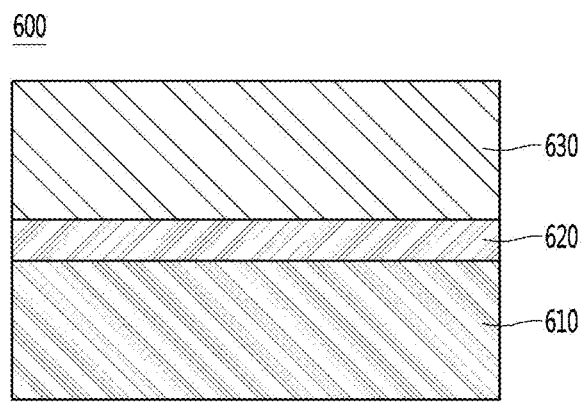
FIG. 38 illustrates an example of a frame applied to a light emitting device package according to a third embodiment of the invention.

FIG. 37 is a view showing an example of a light emitting device according to a third embodiment of the present invention, and FIG. 38 is a view showing an example of a frame applied to the light emitting device package according to the third embodiment of the present invention. Referring to FIG. 37 and FIG. 38, description of elements overlapping with those described with reference to the first and second embodiments described above may be omitted, and the configurations of the first and second embodiments may be selectively included.

Referring to FIG. 37, the light emitting device 500 may include a semiconductor layer 510. The light emitting device 500 shown in FIG. 37 shows a partial region in which power is supplied from the outside to the semiconductor layer 510. The semiconductor layer 510 may be at least one or both of the first conductivity type semiconductor layer and the second conductivity type semiconductor layer. The semiconductor layer 510 may be defined as a light emitting part.

The semiconductor layer 510 may be formed of a compound semiconductor. For example, the semiconductor layer 510 may be a Group II-VI compound semiconductor or a Group III-V compound semiconductor. For example, the semiconductor layer 510 may include at least two elements selected from aluminum (Al), gallium (Ga), indium (In), phosphorus (P), and arsenic (As).

According to the embodiment, the semiconductor layer 510 may be formed of a semiconductor material having a composition formula of $In_xAl_yGa_{1-x-y}N$ ($0 \leq x \leq 1$, $0 \leq y \leq 1$, $0 \leq x+y \leq 1$) or $(Al_xGa_{1-x})_yIn_{1-y}P$ ($0 \leq x \leq 1$, $0 \leq y \leq 1$). The semiconductor layer 510 may be selected from, for example, InAlGaN, InAlN, InGaN, AlGaN, and GaN. The semiconductor layer 510 may be selected from, for example, AlGaInP, AlInP, GaP, GaInP, and the like.

The semiconductor layer 510 may include an n-type dopant. For example, the semiconductor layer 510 may include at least one n-type dopant selected from the group including Si, Ge, Sn, Se, Te, and the like. As another example, the semiconductor layer 510 may comprise a p-type dopant. For example, the semiconductor layer 510 may include at least one p-type dopant selected from the group including Mg, Zn, Ca, Sr, and Ba.

The light emitting device 500 may include a metal layer 520. The metal layer 520 may be disposed on the semiconductor layer 510. The metal layer 510 may be provided as a single layer or a plurality of layers. For example, the metal layer 520 may be provided in a thickness of several tens of micrometers. The thickness of the metal layer 520 may be in the range of 20 to 40 micrometers.

As an example, the metal layer 510 may include at least one of an adhesive metal layer, a reflective metal layer, and a barrier metal layer. The adhesive metal layer may include a material having excellent adhesion to the semiconductor layer 510. The adhesive metal layer may include at least one selected from the group including materials such as Cr, Ti, or an alloy thereof. The adhesive metal layer may be provided as a single layer or a plurality of layers. The reflective metal layer may include a material having high reflectivity with respect to a wavelength band of light emitted from the light emitting device 500. The reflective metal layer may include, for example, at least one selected from the group consisting of materials such as Al, Ag, and Rh, or an alloy thereof. The reflective metal layer may be provided as a single layer or as a plurality of layers. The barrier metal layer may include a material capable of preventing a bonding material from diffusing into the semiconductor layer 510 during bonding of the light emitting device 500 to a frame of a package body. The barrier metal layer may include at least one selected from the group consisting of materials such as Ni, Cr, Ti, Cu, Pt, and Au, or an alloy thereof. The barrier metal layer may be provided as a single layer or as a plurality of layers.

According to an embodiment of the present invention, the metal layer 520 is electrically connected to a first electrode electrically connected to the first conductivity type semiconductor layer of the semiconductor layer 510 and is electrically connected to a second electrode connected to the second conductivity type semiconductor layer of the semiconductor layer 510.

According to another example, a first electrode electrically connected to the first conductivity type semiconductor layer and a second electrode electrically connected to the second conductivity type semiconductor layer are formed between the semiconductor layer 510 and the metal layer 520 and may be provided separately.

A first Ag layer 530 and a Sn layer 550 may be formed on at least one of the metal layer 520 and the semiconductor layer 510. The first Ag layer 530 may be disposed on the semiconductor layer 510. The first Ag layer 530 may be disposed on the metal layer 520. The Sn layer 550 may be disposed on the first Ag layer 530.

According to the embodiment, the first Ag layer 530 and the Sn layer 550 form an intermetallic compound (IMC) in the process of being bonded to the frame. The process of forming an intermetallic compound (IMC) according to an embodiment will be described later.

The first barrier layer 540 and the second barrier layer 560 may be disposed on at least one or both of the first Ag layer 530 and the Sn layer 550. The first barrier layer 540 may be disposed on the first Ag layer 530. The first barrier layer 540 may be disposed between the first Ag layer 530 and the Sn layer 550.

The Sn layer 550 may be disposed on the first barrier layer 540. The Sn layer 550 may be disposed between the first barrier layer 540 and the second barrier layer 560.

The first barrier layer 540 and the second barrier layer 560 may include at least one selected from the group consisting of Ni, Cr, Ti, Cu, Pt, and Au, or an alloy thereof. The first barrier layer 540 and the second barrier layer 560 may be provided as a single layer or a plurality of layers. For example, the first barrier layer 540 may provide a function to prevent the first Ag layer 530 from being oxidized. The second barrier layer 560 may provide a function of preventing the Sn layer 550 from being oxidized. The second barrier layer 560 can improve adhesion to the frame in the process of bonding the light emitting device 500 according to the embodiment to the frame.

The first barrier layer 540 and the second barrier layer 560 may be formed of the same material or different materials. The first barrier layer 540 and the second barrier layer 560 may be provided in a thickness of several tens nanometers. For example, the thicknesses of the first barrier layer 540 and the second barrier layer 560 may be in the range of 20 to 40 nanometers.

According to the light emitting device 500, a separate conductive material electrically connected to the semiconductor layer 510 may be further provided between the metal layer 520 and the semiconductor layer 510. Also, the metal layer 520 may not be provided, and the first Ag layer 530 may be disposed in direct contact with the semiconductor layer 510. At least one of the first barrier layer 540 and the second barrier layer 560 may be removed. According to another example, both the first barrier layer 540 and the second barrier layer 560 may not be provided.

The amount of the first Ag layer 530 may be less than 2.73 times the weight percentage (Wt %) with respect to the amount of the Sn layer 550. The amount of the Sn layer 550 may be greater than 1/2.73 on a mass percent (Wt %) basis as compared to the amount of the first Ag layer 530.

When the first Ag layer 530 and the Sn layer 550 form an intermetallic compound (IMC), the coupling of the amount of Ag and the amount of Sn may be proceed in a ratio of 2.73:1 based on the weight percentage (Wt %). In addition, since the atomic weight of Ag is 107.8682 and the atomic weight of Sn is 118.710, the coupling may proceed at a ratio of 3:1 of Ag and Sn by reference of At %.

The Sn layer 550 according to the embodiment forms an intermetallic compound (IMC) not only with the first Ag layer 530 but also with the metal layer provided on the frame to which the light emitting device 500 is to be bonded should be able to do. The amount of the Sn layer 550 and the amount of the first Ag layer 530 is less than the amount of the Sn layer 550 when the intermetallic compound is formed between the Sn layer 550 and the first Ag layer 530. The amount of each layer 530 and 550 must be selected so that the Sn layer 150 remains. The Sn layer 550 forms an intermetallic compound through the first Ag layer 530 and the frame, and the intermetallic compound between the light emitting device according to the embodiment and the pad portion provided in the frame may be provided a stable bonding strength.

For example, each of the first Ag layer 530 and the Sn layer 550 may be provided to a thickness of a few micrometers. The thickness of the first Ag layer 530 may be less than 0.47 times the thickness of the Sn layer 550. The thickness of the Sn layer 550 may be 2 to 4 micrometers.

The thickness of the first Ag layer 530 may be 0.6 to 1.8 micrometers. At least one or more of the metal layer 520, the first Ag layer 530, the first barrier layer 540, the Sn layer 550, and the second barrier layer 560 may be bonding pads. That is, the layers disposed on the semiconductor layer 510 may be referred to as bonding pads. The semiconductor layer 510 may be supplied with power through a bonding pad. The bonding pad may include, for example, a stacked structure of Ag layer/Au layer/Sn layer/Au layer. As another example, the bonding pad may include a stacked structure of Ti layer/Ag layer/Au layer/Sn layer/Au layer. As another example, the bonding pad may include a stacked structure of Ag layer/Au layer/Sn layer, Ag layer/Sn layer/Au layer, or Ag layer/Sn layer.

Meanwhile, the frame 600 applied to the light emitting device package according to the embodiment of the present invention may be provided in a plurality of layers as shown in FIG. 7.

Referring to FIG. 38, a frame 600 may include a first layer 610, a second layer 620, and a second Ag layer 630. The frame 600 shows a state before the light emitting device 500 described with reference to FIG. 37 is bonded. The frame 600 may correspond to the first frame 111 or the second frame 112 disclosed in the first and second embodiments.

The first layer 610 is a basic support member of the frame 600, and may be provided as a Cu layer, for example. The second layer 620 may be formed as a plating layer on the upper surface of the processed first layer 610. For example, the second layer 620 may be provided as a Ni plating layer, and the upper surface may be provided flat. As an example, the thickness of the first layer 610 may be from several tens of micrometers to several hundreds of micrometers. In addition, the thickness of the second layer 620 may be several micrometers. In addition, the thickness of the second Ag layer 630 may be several micrometers.

Referring to FIGS. 38 and 37, an intermetallic compound may be formed by coupling of the second Ag layer 630 of the frame 600 with the Sn layer 550 in the process of bonding the light emitting device 500. The thickness and the amount of the second Ag layer 630 may be selected depending on the amount of the Sn layer 550 provided to the light emitting device 500 when the Ag layer is combined with the Sn material to form an intermetallic compound. When the second layer 620 is formed of a Ni layer which has a small change in thermal expansion. Accordingly, when the package body is changed in size or position due to thermal expansion, the Ni layer can stably fix the position of the bonding pad bonded to the upper part thereof. For example, the thickness of the second layer 620 may be in the range of 1 to 2 micrometers.

Next, an example in which an intermetallic compound (IMC) layer is formed in a light emitting device package to which the light emitting device 500 and the frame 600 are bonded according to the embodiment will be described.

Figure 39:
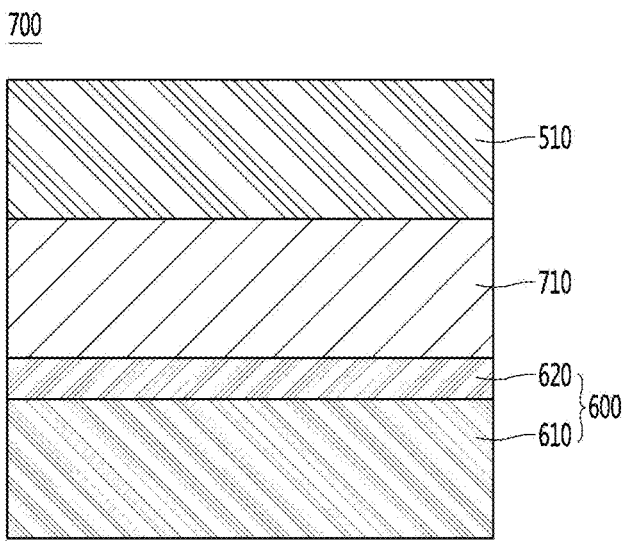
FIG. 39 is a diagram illustrating an intermetallic compound (IMC) layer applied to a light emitting device package according to a third embodiment of the invention.

FIG. 39 is a view illustrating an intermetallic compound (IMC) layer applied to a light emitting device package according to an embodiment of the present invention. In the description of FIG. 39, descriptions overlapping with those described with reference to FIGS. 1 to 38 may be omitted.

Referring to FIG. 39, the light emitting device package 700 may include a frame 600, an intermetallic compound layer 710, and a semiconductor layer 510.

As shown in FIG. 38, the frame 600 may include a first layer 610 and a second layer 620. The intermetallic compound layer 710 may be disposed on the frame 600. The intermetallic compound layer 710 may be disposed between the frame 600 and the semiconductor layer 510. The semiconductor layer 510 may be disposed on the intermetallic compound layer 710.

The intermetallic compound layer 710 may be provided as an intermetallic compound (IMC) layer including Ag and Sn. As shown in FIGS. 37 and 38, the intermetallic compound layer 710 may be formed by bonding between the first and second Ag layers 530 and 630 and the Sn layer 550. The intermetallic compound layer 710 may be formed in a process in which the light emitting device 500 is disposed on the frame 600 and air reflow is performed.

According to the embodiment, since the Sn material included in the Sn layer 550 is diffused and bound in the direction of the first Ag layer 530 by an air reflow process, the intermetallic compound (IMC) layer 710 may be formed by the Sn material and the Au material. Since the Sn material contained in the Sn layer 550 is diffused and bound in the direction of the second Ag layer 630 by the air reflow process, intermetallic compound layer 710 by the Sn material and the Au material may be formed. Here, the amount of Ag and the amount of Sn in the intermetallic compound layer 710 may be formed at a ratio of 2.73:1 based on the weight percentage (Wt %).

In the intermetallic compound layer 710, the composition ratio of Ag and Sn may be varied within a certain range. By way of example, the amount of Ag in the intermetallic compound layer 710 may be provided in a range of 2.27:1 to 3.18:1 with respect to the amount of Sn based on the mass percent (Wt %).

As another example, the intermetallic compound layer 710 may include a region further containing Au. The intermetallic compound layer 710 may include an Au material included in the first and second barrier layers 540 and 560 of the light emitting device 500 shown in FIG. 37. For example, the Au-containing region may be provided between the central region of the intermetallic compound layer 710 and the frame 600. The Au-containing region may be provided closer to the frame 600 than the semiconductor layer 510 in the intermetallic compound layer 710.

As another example, the second Ag layer 630 shown in FIG. 39 may be disposed between the intermetallic compound layer 710 and the second layer 620. For example, when the intermetallic compound layer 710 is formed, a part of Ag of the second Ag layer 630 and the Sn layer 550 may form an intermetallic compound, and a remaining Ag layer may be formed between the intermetallic compound layer 710 and the second layer 630.

The metal layer 520 shown in FIG. 37 may be disposed between the semiconductor layer 510 and the intermetallic compound layer 710.

Figure 40:
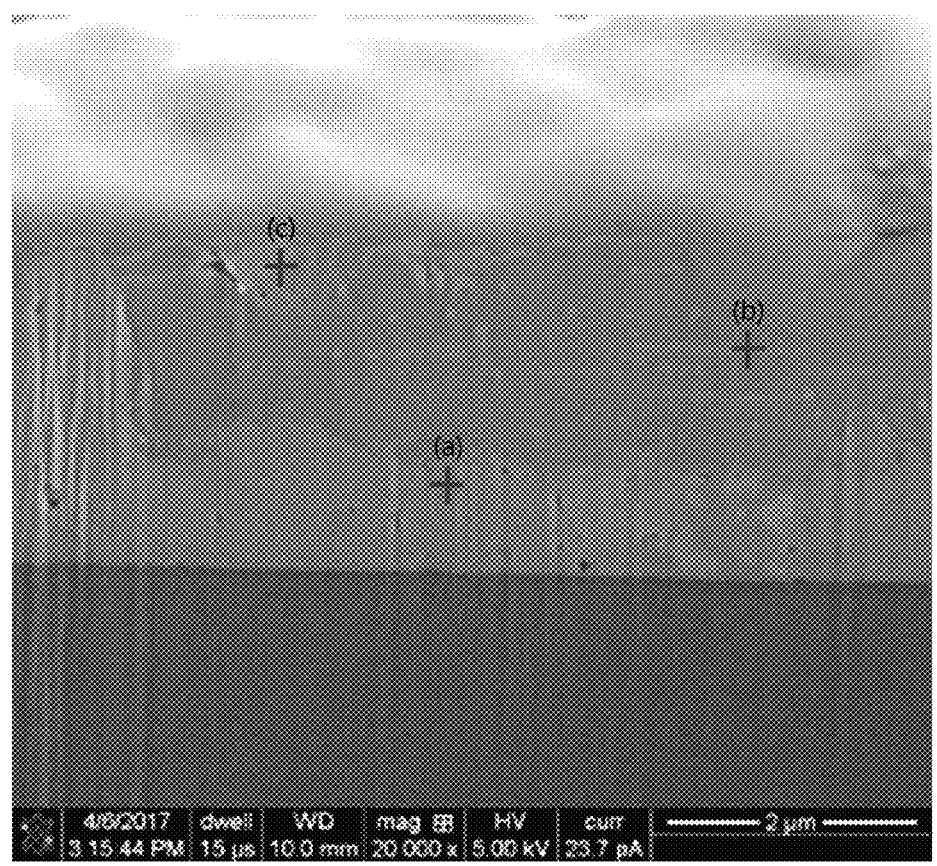
FIG. 40 is an SEM analysis photograph of a bonding area applied to a light emitting device package according to a third embodiment of the invention.
Figure 41:
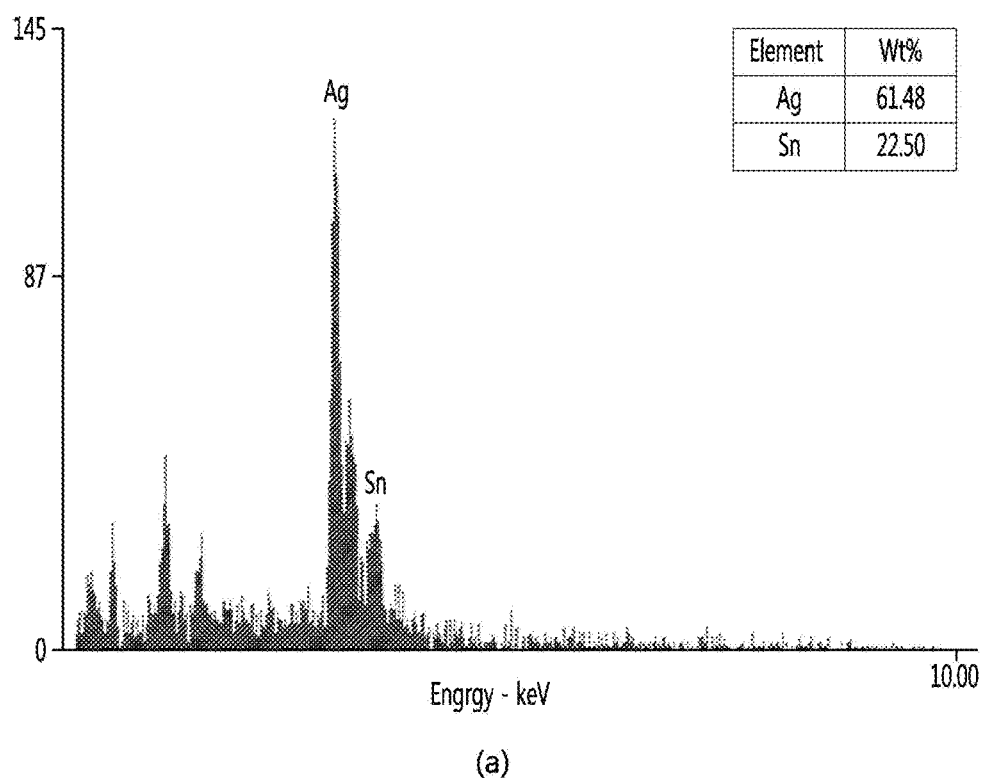
FIGS. 41 to 43 are diagrams illustrating the analysis of components of the area to area of the bonding area shown in FIG. 40.
Figure 42:
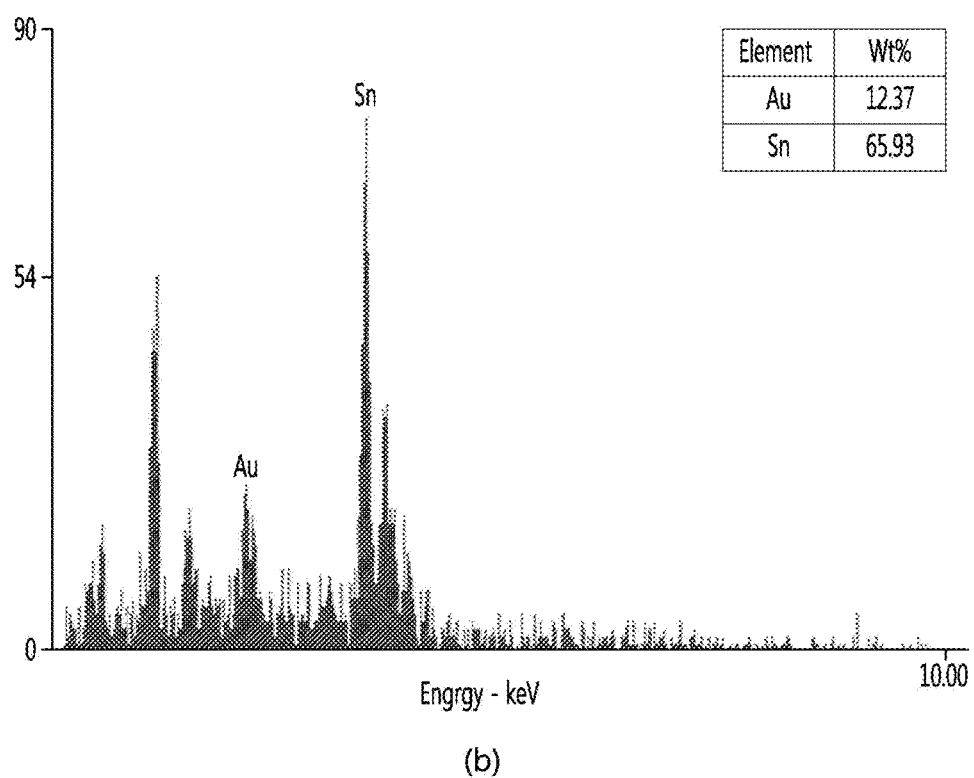
Figure 43:
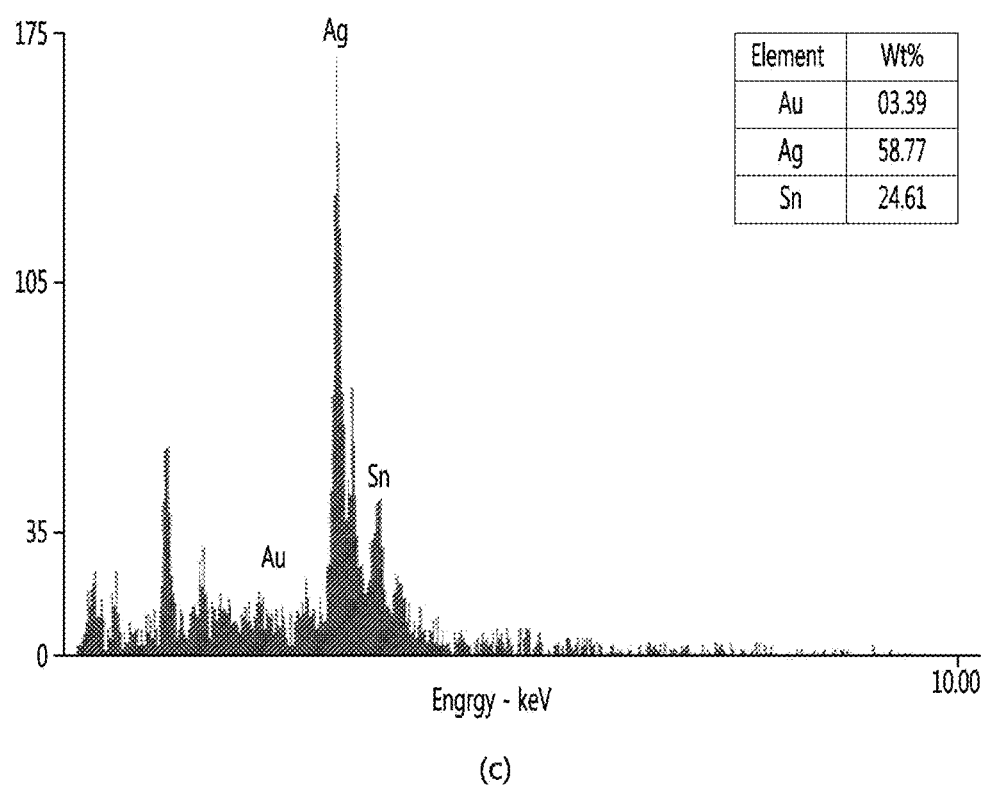

Then, FIGS. 40 to 43 show an example in which an intermetallic compound layer according to the third embodiment is formed. FIG. 40 is an SEM analysis photograph of the bonding region applied to the light emitting device package according to the third embodiment, and FIGS. 42 to 43 are graphs showing the SEM analysis of the bonding region applied to the light emitting device package according to the third embodiment, FIG. 40.

An SEM analysis photograph shown in FIG. 40 shows a case where a semiconductor layer 510 is disposed below a bonding region and a frame 600 is disposed above a bonding region. According to the embodiment, it can be confirmed that an intermetallic compound layer containing Ag and Sn is formed in the region (a) and the region (c) of the bonding region as shown in FIGS. 40, 42 and 43. At this time, it can be seen that in the region (a), Ag is provided as the weight percentage (Wt %) at 61.48 and Sn is provided as the mass percent (Wt %) at 22.50. As described above, it can be seen that the ratio of Ag to Sn in the region (a) was formed at a ratio of 2.7:1 based on the weight percentage (Wt %). As shown in FIGS. 40 and 43, it can be seen that in the region (c), Ag is provided in a weight percentage (Wt %) of 58.77 and Sn is provided in a weight percentage (Wt %) in 24.61. Thus, it can be seen that in the region (c), the ratio of Ag and Sn was formed at a ratio of about 2.39:1 based on the weight percentage (Wt %). Also, it can be confirmed that a small amount of Au material was detected in the region (c). As shown in FIGS. 40 and 42, it can be seen that no Ag material was detected in the region (b), and a Sn material and an Au material were detected. The Au material is interpreted as a material contained in the barrier layer.

In FIGS. 40 to 43, the intermetallic compound layer formed in the region (a) is formed by intermetallic compounds layer formed by the first Ag layer 530 and the Sn layer 550 shown in FIG. 37. The intermetallic compound layer formed in the region (c) is interpreted as an intermetallic compound layer formed by the Sn layer 550 and the second Ag layer 630 shown in FIG. 37 and FIG. 38. Since the IMC layer 710 are formed in the bonding region including an upper region and a lower region is formed, the semiconductor layer 510, the IMC layer 710 and the frame 600 as shown in FIG. 39 may be stably coupled.

Figure 44:
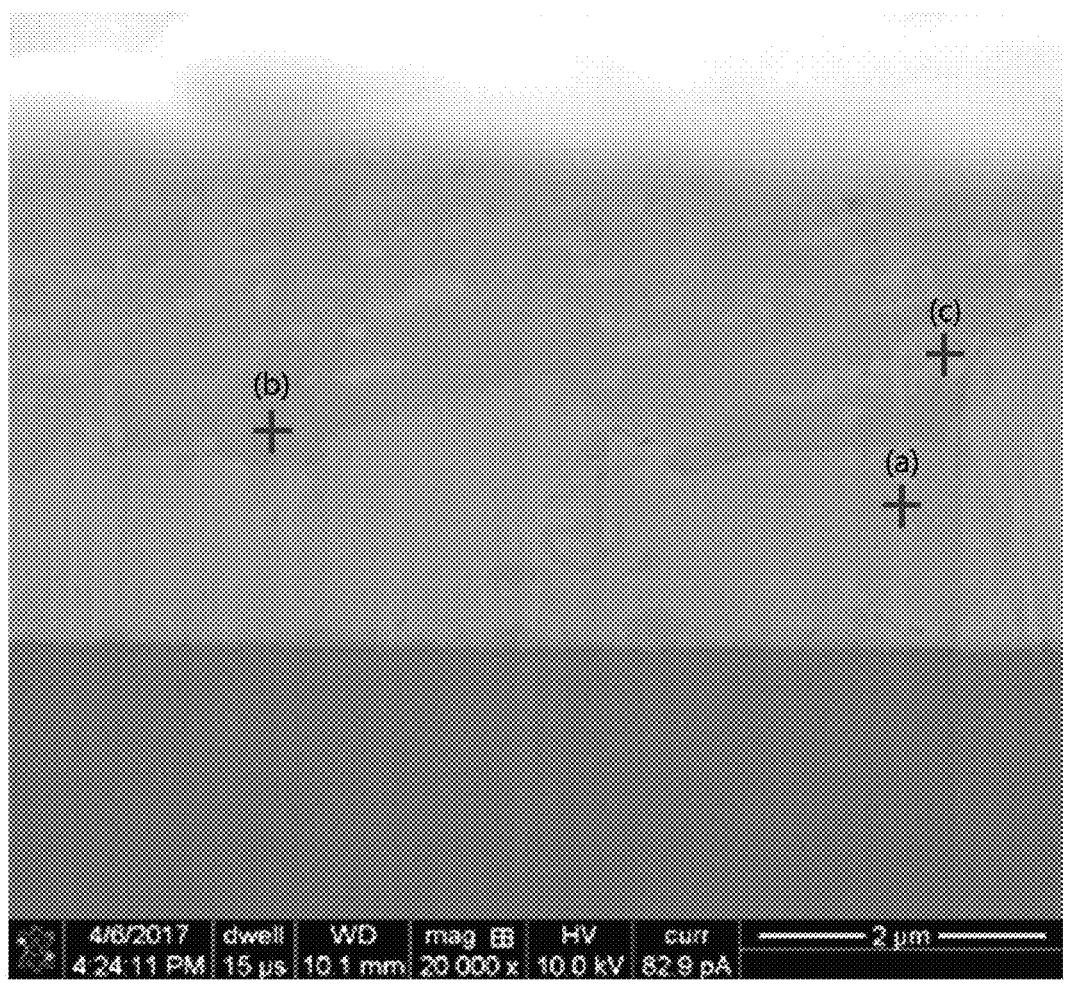
FIG. 44 is an SEM analysis photograph of a bonding area applied to a light emitting device package according to a third embodiment of the invention.
Figure 45:
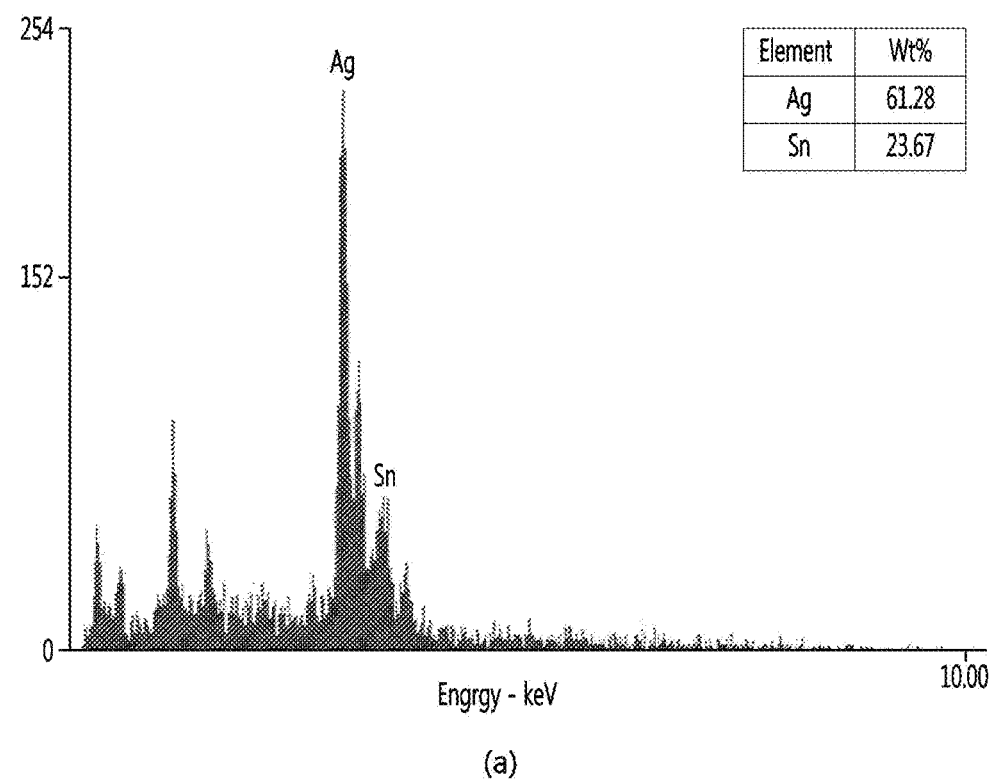
FIG. 45 to FIG. 47 are diagrams illustrating the analysis of components of the area to area of the bonding area shown in FIG. 44.
Figure 46:
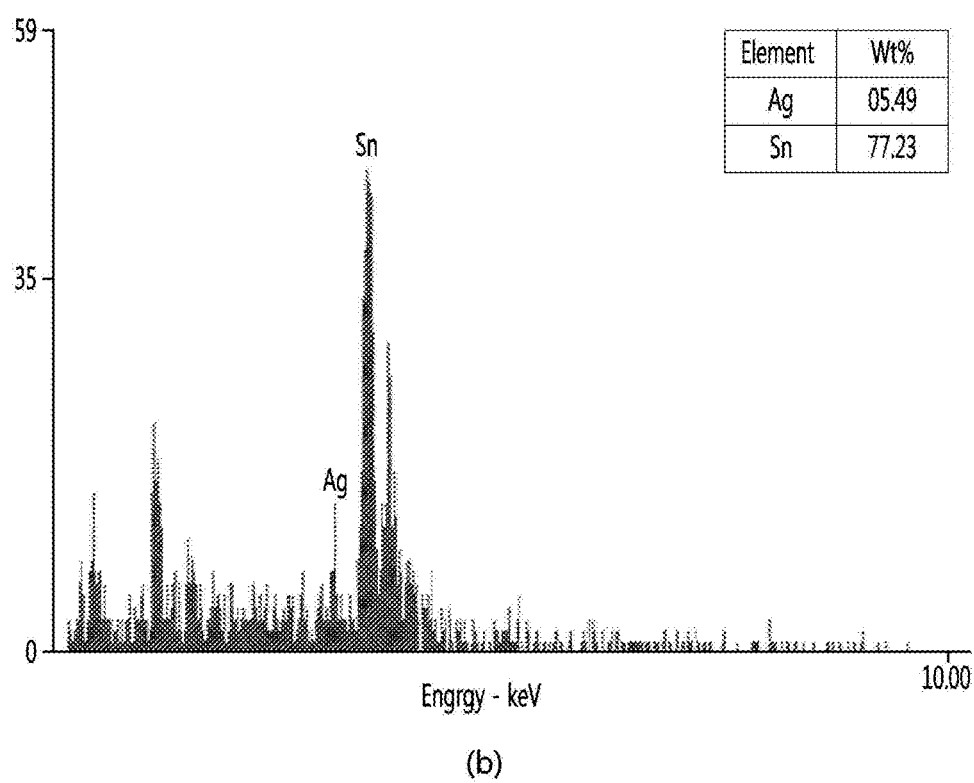
Figure 47:
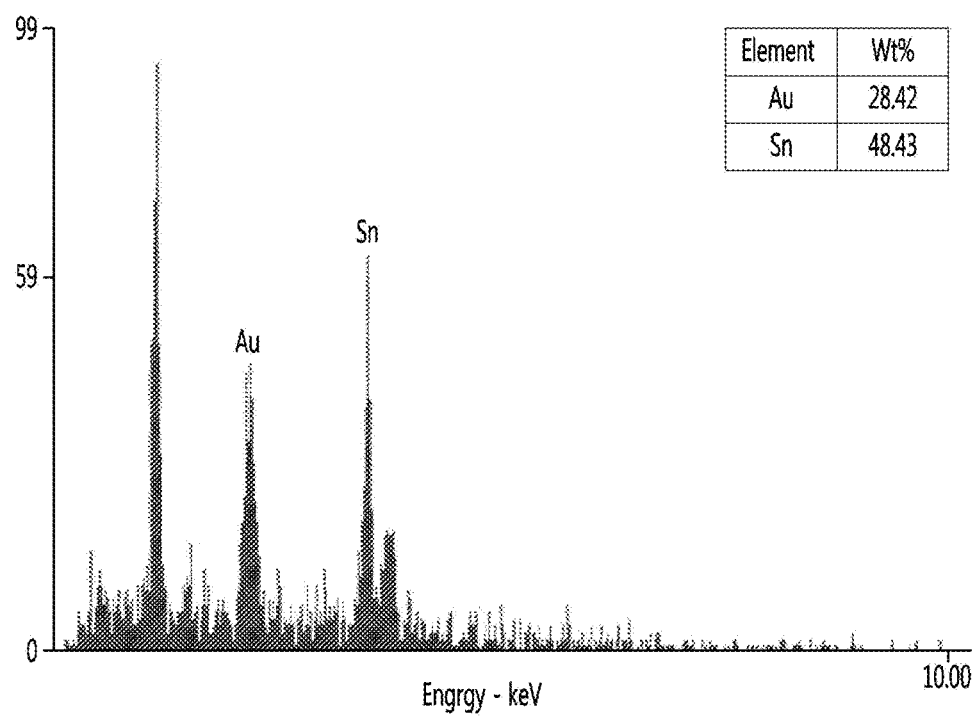

FIGS. 44 to 47 show another example in which the intermetallic compound layer according to the third embodiment is formed. FIG. 44 is another example of a SEM analysis photograph of a bonding region applied to the light emitting device package according to the third embodiment, and FIGS. 45 to 47 illustrate the SEM analysis of the bonding region applied to the light emitting device package according to the third embodiment, respectively.

The SEM photograph shown in FIG. 44 shows a case where a semiconductor layer 510 is disposed below the bonding region and a frame 600 is disposed above the bonding region. As shown in FIG. 46, it can be confirmed that an intermetallic compound layer containing Ag and Sn is formed in the region (a) of the bonding region. At this time, as shown in FIG. 44 and FIG. 45, in the region (a), Ag is provided in a weight percentage (Wt %) of 61.28 and Sn is confirmed in a weight percentage (Wt %) of 23.67. As described above, it can be confirmed that the intermetallic compound is formed at a ratio of about 2.59:1 of the Ag and Sn based on the weight percentage (Wt %) in the region (a).

As shown in FIG. 44 and FIG. 46, in the region (b), Ag is provided in a weight percentage (Wt %) at 05.49 and Sn is provided in a mass percent (Wt %) at 77.23. Thus, it is difficult to say that the intermetallic compound between Ag and Sn is properly formed in the region (b) because the amount of Ag is significantly smaller than the amount of Sn.

As shown in FIG. 44 and FIG. 46, in the region (c), no Ag material was detected, Au was provided in 28.42 by mass percent and Sn was provided in 48.43 by mass percent. As described above, it can be confirmed that the intermetallic compound layer including Ag and Sn is not normally formed in the region (c).

The intermetallic compound (IMC) layer formed in the region (a) is an intermetallic compound layer formed by the first Ag layer 530 and the Sn layer 550 described with reference to FIG. 37.

In the embodiment shown in FIG. 44, since the Sn layer 550 described with reference to FIG. 37 is not sufficiently provided, the intermetallic compound layer in the region (a) is formed by the Sn layer 550 and the first Ag layer 530, and the intermetallic compound layer in the region (b) and region (c) is not formed properly.

Referring to FIG. 44, since a stable bonding force is not provided between the light emitting device 500 and the frame 600, the light emitting device 500 may not be bonded to the frame 600.

Figure 48:
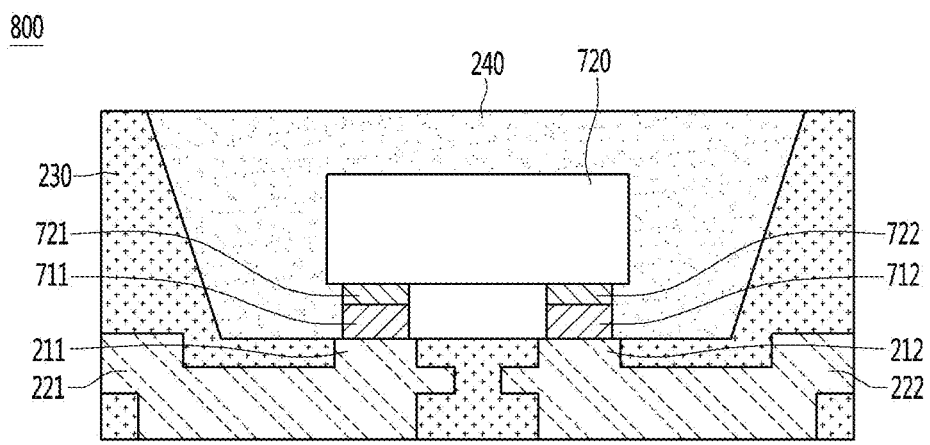
FIG. 48 illustrates another example of a light emitting device package according to a third embodiment of the invention.

FIG. 48 is a view showing another example of the light emitting device package according to the third embodiment of the present invention. In the description of FIG. 48, description overlapping with those described with reference to FIGS. 1 to 47 may be omitted.

Referring to FIG. 48, the light emitting device package may include a first frame 221 and a second frame 222. The first frame 221 and the second frame 222 may be spaced apart from each other. The body 230 may be disposed between the first frame 221 and the second frame 222. The first frame 221 may include a first pad portion 211 exposed on an upper surface of the body 230. The second frame 222 may include a second pad portion 212 exposed on an upper surface of the body 230.

The light emitting device 720 may be disposed on the first frame 221 and the second frame 222. The light emitting device 720 may be disposed on the body 230. The light emitting device 720 may include a first electrode 721 disposed on the first frame 221. The light emitting device 720 may include the first electrode 721 disposed on the first pad portion 211. The light emitting device 720 may include a second electrode 722 disposed on the second frame 222. The light emitting device 720 may include the second electrode 722 disposed on the second pad portion 212.

The first electrode 721 may be electrically connected to the first conductivity type semiconductor layer of the light emitting device 720. The second electrode 722 may be electrically connected to the second conductivity type semiconductor layer of the light emitting device 720.

The first bonding pad 711 may be disposed between the first electrode 721 and the first frame 221. The first bonding pad 711 may be electrically connected to the first electrode 721. The second bonding pad 712 may be disposed between the second electrode 722 and the second frame 222. The second bonding pad 712 may be electrically connected to the second electrode 722.

The first and second bonding pads 711 and 712 may include an intermetallic compound layer as described above. The intermetallic compound layer provided on the first and second bonding pads 711 and 712 may include Ag and Sn. The weight percentage (Wt %) of Ag and Sn contained in the intermetallic compound layer may be in the range of 2.27:1 to 3.18:1. The intermetallic compound layer may further include a region containing Au. Au may be disposed between the central region of the first and second intermetallic compound layers and the first and second frames 221 and 222.

The first and second frames 221 and 222 may include a Ni layer disposed under the first and second intermetallic compound layers, and a Cu layer disposed under the Ni layer. Have, and an Ag layer disposed between the first and second intermetallic compound (IMC) layers and the Ni layer. By way of example, the Ag layer and the Ni layer may each be provided to a thickness of a few micrometers.

Here, the light emitting device package may be attached to the main substrate that supplies power according to an application product, and may be further attached by surface mounting (SMT). At this time, as one example, the light emitting device package may be surface mounted (SMT) on the main substrate by bonding or the like.

Figure 49:
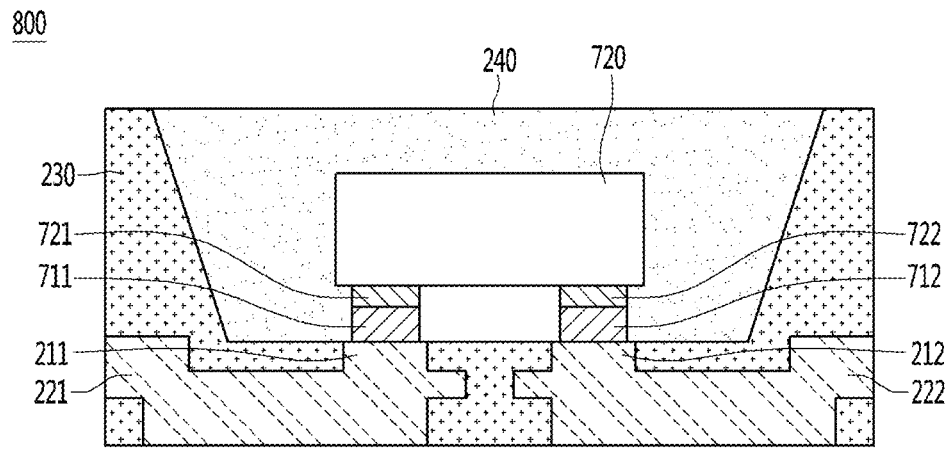
FIG. 49 illustrates an example of a light source device having a light emitting device package according to a third embodiment of the invention.

FIG. 49 is a diagram illustrating an example of a light source device having a light emitting device package according to a third embodiment of the present invention. In the description of FIG. 49, description of elements overlapping with those described in the first and second embodiments may be omitted, and the configurations of the first and second embodiments may be selectively included.

Referring to FIG. 49, a light emitting device package 800 may include a light emitting device 820, a pad portion 210, a lead frame 220, a package body 230, and a circuit board 310. One or more light emitting device packages 800 may be disposed on the circuit substrate 310. The circuit substrate 310 is a board, a substrate, a main substrate, or a submount.

The light emitting device 820 may be electrically connected to the pad portion 210 provided in the package body 230. The pad portion 210 may be electrically connected to the circuit substrate 310 disposed below. For example, the pad portion 210 may be electrically connected to the circuit substrate 310 through the lead frame 220 disposed at the lower part.

The pad unit 210 may be provided integrally with the lead frame 220 and may be provided in a structure separated from each other.

The light emitting device 820 may be disposed on the pad portion 210 provided on the lead frame 220. The molding part 240 may be disposed on the light emitting device 820. For example, the molding part 240 may include wavelength conversion particles that receive light provided from the light emitting device 820 and emit wavelength-converted light.

Referring to FIG. 49, a light emitting device package 800 includes an intermetallic compound (IMC) layer 710 disposed on the pad portion 210 and a bonding layer 314 and 315 disposed under the lead frame 220.

By way of example, the intermetallic compound (IMC) layer 710 may correspond to the intermetallic compound layer described with reference to FIGS. 32 to 48. In addition, the bonding layers 314 and 315 may include a bonding material used in a bonding process such as soldering. For example, the bonding layers 314 and 315 may include at least one selected from low melting point bonding materials including Sn and In, or an alloy thereof.

As shown in FIGS. 32 to 48, the intermetallic compound (IMC) layer 710 may have a higher melting point than the bonding layers 314 and 315. In addition, the intermetallic compound (IMC) layer 710 may be formed below the melting point of the bonding layers 314 and 315.

The bonding process between the light emitting device 820 and the pad portion 210 may be performed at a relatively low first temperature. In addition, the bonding process between the light emitting device 820 and the pad portion 210 may be performed while applying a relatively low first pressure.

The bonding process between the lead frame 220 and the circuit substrate 310 may be performed at a relatively high second temperature. Also, the bonding process between the lead frame 220 and the circuit substrate 310 may be performed while applying a relatively high second pressure.

The melting point of the intermetallic compound (IMC) layer 710 may be higher than the second temperature. The bonding force between the light emitting device 820 and the pad portion 210 is not deteriorated in a reflow process for bonding between the lead frame 220 and the circuit substrate 310.

In addition, the bonding process between the light emitting device 820 and the pad portion 210 may be performed at the relatively low first temperature. Accordingly, it is possible to prevent the package body 230 from being damaged or discolored during the bonding process between the light emitting device 820 and the pad portion 210.

Since the bonding process between the light emitting device 820 and the pad portion 210 can be performed at the relatively low temperature, the selection for the material constituting the package body 230 can be widened. The package body 230 may be provided using a relatively inexpensive resin material as well as an expensive material such as ceramics.

The light emitting device 820 may be connected to the pad portion 210 by a flip chip bonding method. The light emitting device 820 may emit top light and side light. Also, the light emitting device 820 may emit light in a downward direction. As described above, the light emitting device 820 according to the embodiment may be a flip chip light emitting device that emits light in six-sided directions.

Next, another example of the light emitting device of the light emitting device package according to the embodiment of the present invention will be described with reference to FIGS. 50 to 54. In describing FIGS. 50 to 54, the same configurations as those described above can be omitted from the description and optionally included.

Figure 50:
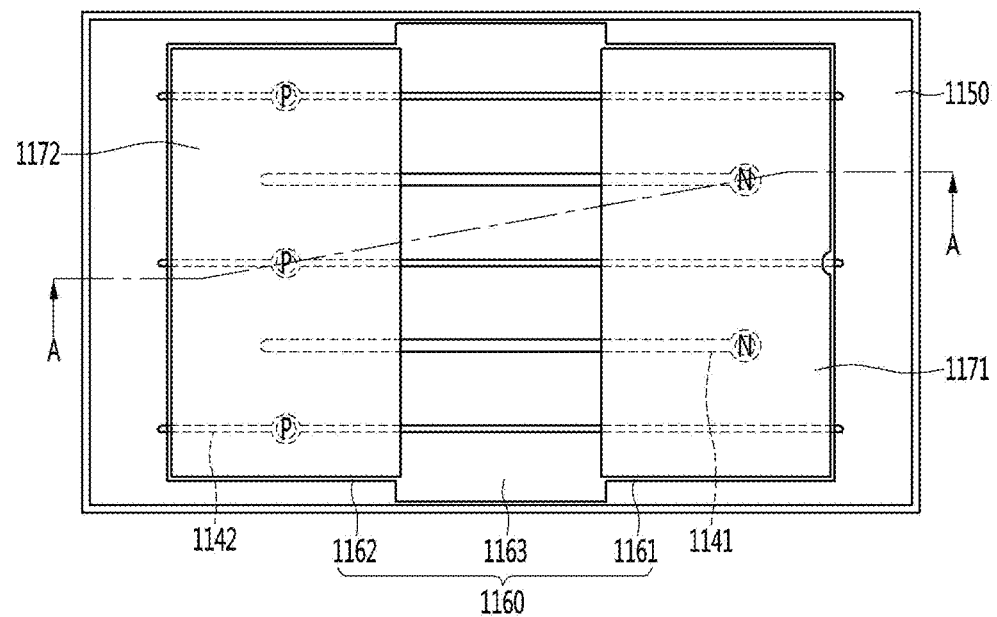
FIG. 50 is a plan view illustrating another example of a light emitting device of a light emitting device package according to a third embodiment of the invention.
Figure 51:
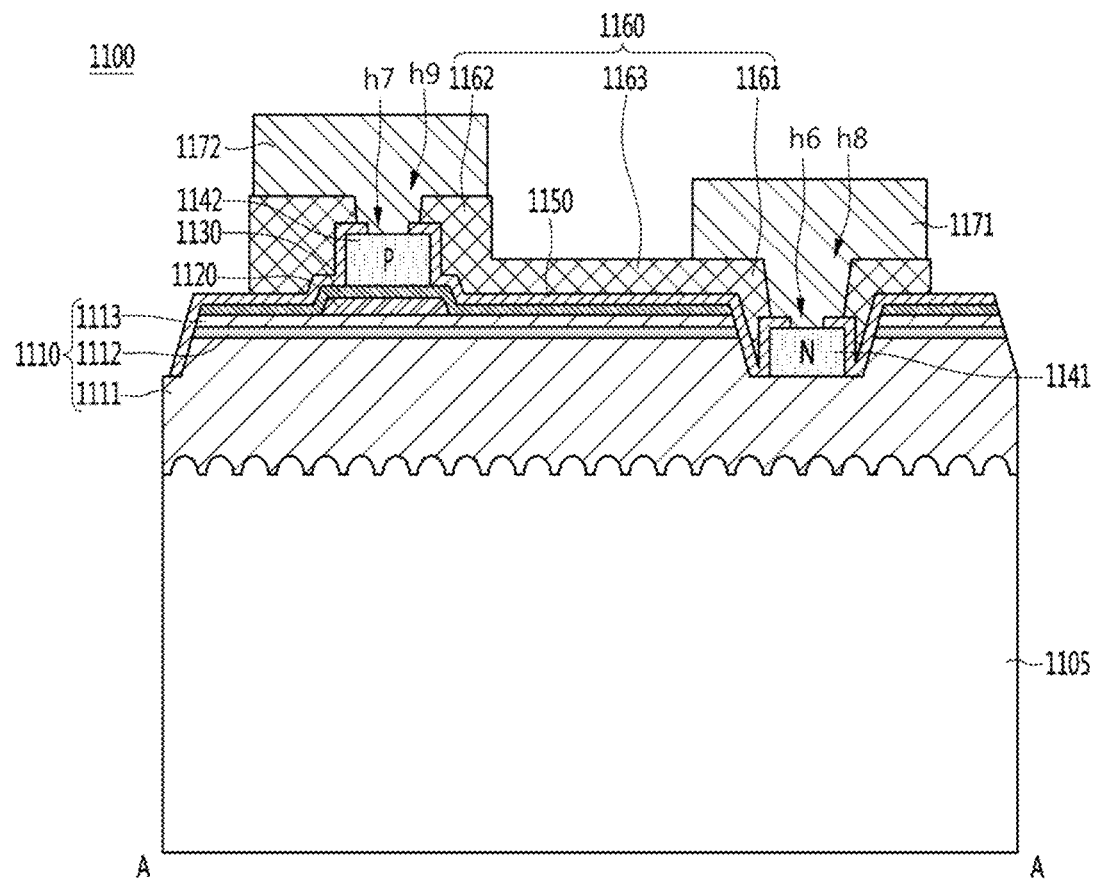
FIG. 51 is a cross-sectional view taken along line A-A of the light emitting device shown in FIG. 50.

FIG. 50 is a plan view showing another example of the light emitting device of the light emitting device package according to the third embodiment of the present invention, and FIG. 51 is a sectional view taken along the line A-A of the light emitting device shown in FIG. 50.

Referring to FIG. 50, the first electrode 1141 and the second electrode 1142 are disposed below the first bonding pad 1171 and the second bonding pad 1172. However, the first electrode 1141 and the second electrode 1142 are disposed under the first bonding pad 1171 and the second bonding pad 1172. The first bonding pad 1171 and the second bonding pad 1172 may include the bonding pads described above.

As shown in FIGS. 50 and 51, the light emitting device 1100 may include a light emitting structure 1110 disposed on the substrate 1105.

The substrate 1105 may be selected from a group including a sapphire substrate ($Al_2O_3$), SiC, GaAs, GaN, ZnO, Si, GaP, InP and Ge. For example, the substrate 1105 may be provided as a patterned sapphire substrate (PSS) having a concavo-convex pattern formed on its upper surface.

The light emitting structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

According to an embodiment of the invention, the first conductivity type semiconductor layer 1111 may be provided as an n-type semiconductor layer, and the second conductivity type semiconductor layer 1113 may be provided as a p-type semiconductor layer. According to another embodiment, the first conductivity type semiconductor layer 1111 may be provided as a p-type semiconductor layer, and the second conductivity type semiconductor layer 1113 may be provided as an n-type semiconductor layer. For convenience of explanation, the first conductivity type semiconductor layer 1111 is provided as an n-type semiconductor layer and the second conductivity type semiconductor layer 1113 is provided as a p-type semiconductor layer.

In addition, the first conductivity type semiconductor layer 1111 is disposed in contact with the substrate 1105. However, a buffer layer may be disposed between the first conductivity type semiconductor layer 1111 and the substrate 1105. For example, the buffer layer can reduce the difference in lattice constant between the substrate 1105 and the light emitting structure 1110 and improve crystallinity.

As shown in FIG. 51, the light emitting device 1100 may include a current diffusion layer 1120 and an ohmic contact layer 1130. The current diffusion layer 1120 and the ohmic contact layer 1130 can improve current diffusion to increase light output. For example, the current diffusion layer 1120 may be provided as an oxide or a nitride. The width of the current diffusion layer 1120 may be greater than the width of the second bonding pad 1142 disposed above. Accordingly, the current diffusion layer 1120 can improve the luminous flux by preventing the current concentration at the lower side of the second bonding pad 1142 and improving the electrical reliability.

The ohmic contact layer 1130 may include at least one selected from the group consisting of a metal, a metal oxide, and a metal nitride. The ohmic contact layer 1130 may include a light-transmitting material. For example, the ohmic contact layer 1130 may include at least one selected from the group consisting of ITO (indium tin oxide), IZO (indium zinc oxide), IZON (indium zinc oxide), IZTO (indium zinc tin oxide), IAZO zinc oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

Figure 52:
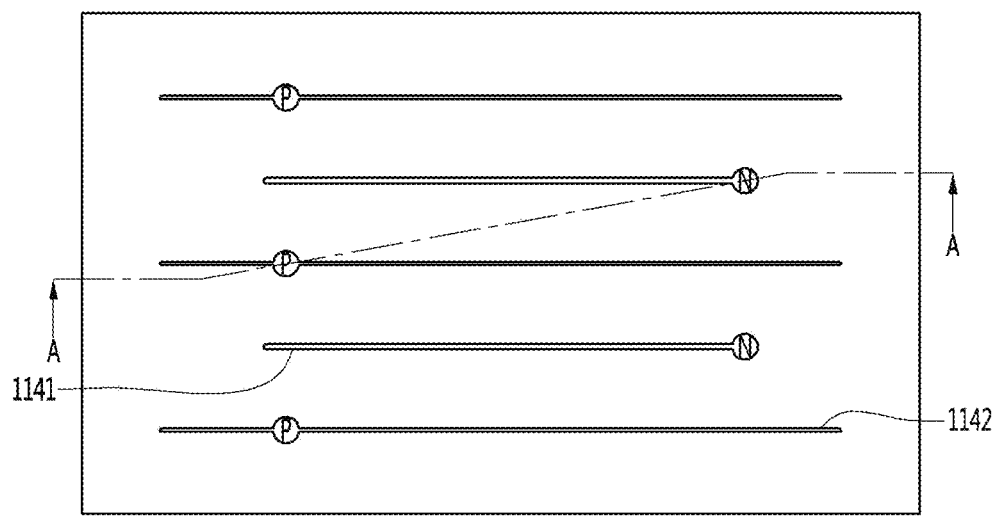
FIG. 52 illustrates an arrangement of a first bonding pad and a second bonding pad of a light emitting device applied to a light emitting device package according to a third embodiment of the invention.

Referring to FIGS. 50 to 52, the first electrode 1141 may be electrically connected to the first conductivity type semiconductor layer 1111. The first electrode 1141 may be disposed on the first conductivity type semiconductor layer 1111. For example, the first electrode 1141 may be disposed on a top surface of the first conductivity type semiconductor layer 1111 exposed by removing a part of the second conductivity type semiconductor layer 1113 and a part of the active layer 1112.

The first electrode 1141 may be disposed through a recess of the light emitting structure 1110. The recess may pass through the second conductivity type semiconductor layer 1113 and the active layer 1112 to expose a portion of the first conductivity type semiconductor layer 1111.

The second electrode 1142 may be electrically connected to the second conductivity type semiconductor layer 1113. The second electrode 1142 may be disposed on the second conductivity type semiconductor layer 1113. The current diffusion layer 1120 may be disposed between the second electrode 1142 and the second conductivity type semiconductor layer 1113. The second electrode 1142 may be disposed on the ohmic contact layer 1130.

The first electrode 1141 and the second electrode 1142 may have a single-layer structure or a multi-layer structure. For example, the first electrode 1141 and the second electrode 1142 may be ohmic electrodes. For example, the first electrode 1141 and the second electrode 1142 may be formed of one selected from the group consisting of ZnO, IrOx, RuOx, NiO, RuOx/ITO, Ni/IrOx/Au, and Ni/IrOx/Au/ITO, Cr, Ti, Al, Rh, Pd, Ir, Ru, Mg, Zn, Pt, Au and Hf or an alloy of two or more of them.

The first electrode 1141 and the second electrode 1142 may further include branch electrodes branched from each other. The first electrode 1141 and the second electrode 1142 can prevent the concentration of current through the branch electrodes and diffuse the current flow.

The light emitting device 1100 may include a protective layer 1150. The protective layer 1150 may be the second insulating layer in FIGS. 30 and 31. The protective layer 1150 may be disposed on the second electrode 1142. The protective layer 1150 may include a second opening h7 that exposes a portion of the P region of the second electrode 1142. The protective layer 1150 may be disposed on the first electrode 1141. The passivation layer 1150 may include a first opening h6 for exposing a portion of the N region of the first electrode 1141. For example, the protective layer 1150 may be provided as an insulating material. For example, the protective layer 1150 may be formed of at least one material selected from the group consisting of $SiO_2$, $SiO_x$, $SiO_xN_y$, $Si_3N_4$, and $Al_2O_3$.

Figure 53:
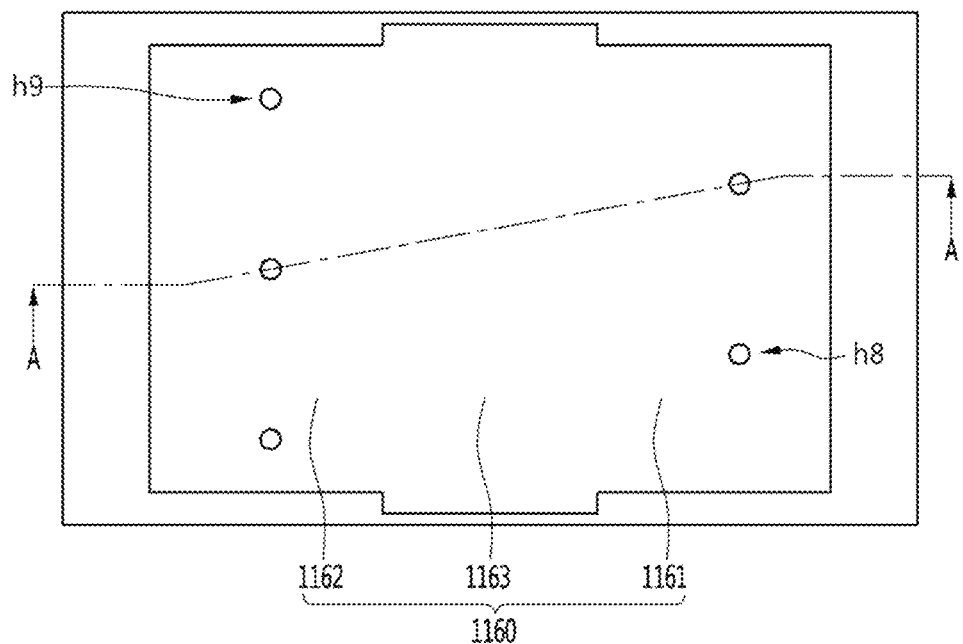
FIG. 53 illustrates an example of an arrangement of a reflective layer applied to a light emitting device according to a third embodiment of the invention.

As shown in FIGS. 51 to 53, the light emitting device 1100 may include a reflective layer 1160. The reflective layer 1160 may include a first reflective portion 1161, a second reflective portion 1162, and a third reflective portion 1163. The reflective layer 1160 may be disposed on the protective layer 1150. The reflective layer 1160 may be a material of the third insulating layer in FIGS. 30 and 31, or may be an insulating reflective layer. The first reflective portion 1161 may be disposed on the first electrode 1141 and the second electrode 1142. The first reflective portion 1161 may be disposed on a portion of the first electrode 1141. The first reflective portion 1161 may be disposed on a portion of the second electrode 1142. The first reflective portion 1161 may include a third opening h8 that exposes an upper surface of the first electrode 1141. The first reflective portion 1161 may include a third opening h8 provided corresponding to an area where the first opening h6 of the passivation layer 1150 is formed. The second reflective portion 1162 may be disposed on the first electrode 1141 and the second electrode 1142. The second reflective portion 1162 may be disposed on a portion of the first electrode 1141. The second reflective portion 1162 may be disposed on a portion of the second electrode 1142.

The second reflective portion 1162 may be spaced apart from the first reflective portion 1161. The second reflective portion 1162 may include a fourth opening h9 that exposes an upper surface of the second electrode 1142. The second reflective portion 1162 may include a fourth opening h9 provided corresponding to an area where the second opening h7 of the protection layer 1150 is formed.

The third reflective portion 1163 may be disposed on the first electrode 1141 and the second electrode 1142. The third reflective portion 1163 may be disposed on a portion of the first electrode 1141. The third reflective portion 1163 may be disposed on a portion of the second electrode 1142.

The third reflective portion 1163 may be disposed between the first reflective portion 1161 and the second reflective portion 1162. For example, the third reflective portion 1163 may be connected to the first reflective portion 1161. The third reflective portion 1163 may be connected to the second reflective portion 1162. The third reflective portion 1163 may be physically in direct contact with the first reflective portion 1161 and the second reflective portion 1162.

The reflective layer 1160 may be provided as an insulating reflective layer. For example, the reflective layer 1160 may be provided as a DBR (Distributed Bragg Reflector) layer or an ODR (Omni Directional Reflector) layer. In addition, the reflective layer 1160 may include a metal material.

According to an embodiment of the present invention, the first reflective portion 1161 may be disposed on a side surface and a part of an upper surface of the first electrode 1141 so as to expose an upper surface of the first electrode 1141. The second reflective portion 1162 may be disposed on the side surface and a part of the upper surface of the second electrode 1142 so as to expose the upper surface of the second electrode 1142.

The first reflective portion 1161 and the second reflective portion 1162 reflect the light emitted from the active layer 1112 of the light emitting structure 1110 and may be reduced by light absorption by the first bonding pad 1171 and the second bonding pad 1172 to improve the luminous intensity Po.

For example, the first reflective portion 1161 and the second reflective portion 1162 may be made of an insulating material. The insulating material may include a material having a high reflectivity, for example, a DBR structure, in order to reflect light emitted from the active layer 1112. In addition, for an example, the third reflective portion 1163 may include a DBR structure.

The first reflective portion 1161 and the second reflective portion 1162 may have a DBR structure in which materials having different refractive indexes are repeatedly disposed. For example, the first reflective portion 1161 and the second reflective portion 1162 may be disposed in a single layer or a stacked structure including at least one of $TiO_2$, $SiO_2$, $Ta_2O_5$, and $HfO_2$.

According to another embodiment of the present invention, the first reflective portion 1161 and the second reflective portion 1162 may be provided as a material capable of adjusting the reflectance to light from the active layer 1112 according to the wavelength of the light emitted from the active layer 1112.

The light emitting device 1100 includes a first bonding pad 1171 disposed on the first reflective portion 1161 and a second bonding pad 1172 disposed on the second reflective portion 1162. The second bonding pad 1172 may be spaced apart from the first bonding pad 1171.

The first bonding pad 1171 may contact a part of the N region of the first electrode 1141 through the third opening h8 and the first opening h6. The second bonding pad 1172 may contact a part of the P region of the second electrode 1142 through the fourth opening h9 and the second opening h7.

The light emitting device according to the embodiment may be connected to an external power source by a flip chip bonding method. For example, in manufacturing the light emitting device package, the upper surface of the first bonding pad 1171 and the upper surface of the second electrode pad 172 may be disposed on a submount, a lead frame, or a circuit substrate. For example, the first bonding pad 1171 and the second bonding pad 1172 may include the bonding pads described with reference to FIGS. 1 to 48.

When the light emitting device according to the embodiment is mounted by a flip chip bonding method and is implemented as a light emitting device package, the light provided from the light emitting structure 1110 may be emitted through the substrate 1105. Light emitted from the light emitting structure 1110 may be reflected by the first and second reflective portions 1161 and 1162 and may be emitted toward the substrate 1105.

Also, the light emitted from the light emitting structure 1110 may be emitted in the lateral direction of the light emitting structure 1110. The light emitted from the light emitting structure 1110 may be transmitted through a region where the first bonding pad 1171 and the second bonding pad 1172 are not provided among the surfaces on which the first bonding pad 1171 and the second bonding pad 1172 are disposed.

The light emitted from the light emitting structure 1110 may be emitted to the outside through a region where the first to third reflective portions 1161, 1162 and 1163 are not provided among the surfaces on which the first bonding pad 1171 and the second bonding pad 1172 are disposed.

Accordingly, the light emitting device 1100 according to the embodiment can emit light in six-sided directions surrounding the light emitting structure 1110, and the light intensity can be remarkably improved.

According to the light emitting device and the light emitting device package according to the embodiment, since the first bonding pad 1171 and the second bonding pad 1172 having a large area can be directly bonded to the circuit board, the bonding process of the flip chip may be carried out easily and stably.

In the description of the light emitting device according to the embodiment, the case where the ohmic contact layer 1130 is provided on the second conductivity type semiconductor layer 1113 has been described. However, according to another embodiment, the ohmic contact layer 1130 may be omitted, and the second electrode 1142 may directly contact the second conductivity type semiconductor layer 1113.

Figure 54:
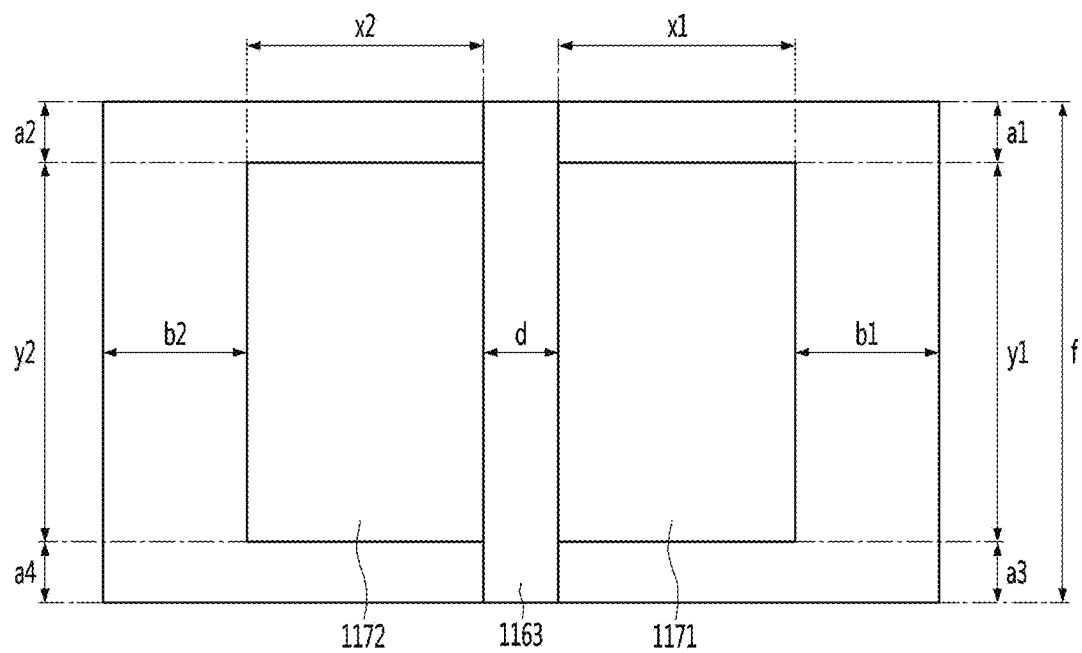
FIG. 54 illustrates an arrangement of a first bonding pad and a second bonding pad applied to a light emitting device according to a third embodiment of the invention.

Referring to FIG. 54, the arrangement relationship of the first bonding pad 1171 and the second bonding pad 1172 will be described.

Referring to FIGS. 54 and 51, according to the light emitting device of the embodiment, when viewed from the top of the light emitting device 1100, the sum of the areas of the first bonding pad 1171 and the second bonding pad 1172 is less than or equal to 60% of the entire area of the upper surface of the light emitting device 1100 on which the first bonding pad 1171 and the second bonding pad 1172 are disposed. The sum of the areas of the first bonding pad 1171 and the second bonding pad 1172 is a sum of upper surface areas of the first and second bonding pads 1171 and 1172.

For example, the entire area of the upper surface of the light emitting device 1100 corresponds to the area defined by the lateral length and the longitudinal length of the lower surface of the first conductivity type semiconductor layer 1111 of the light emitting structure 1110. The entire area of the upper surface of the light emitting device 1100 may correspond to the area of the upper surface or the lower surface of the substrate 1105.

The sum of the areas of the first bonding pad 1171 and the second bonding pad 1172 is equal to or smaller than 60% of the entire area of the light emitting device 1100. Accordingly, the amount of light emitted to the surface on which the first bonding pad 1171 and the second bonding pad 1172 are disposed can be increased. Accordingly, according to the embodiment, since the amount of light emitted toward the six surfaces of the light emitting device 1100 is increased, the light extraction efficiency can be improved and the light intensity Po can be increased.

In addition, when viewed from the top of the light emitting device, the sum of the areas of the first bonding pad 1171 and the second bonding pad 1172 is equal to or greater than 30% of the entire area of the light emitting device 1100.

The sum of the areas of the first bonding pad 1171 and the second bonding pad 1172 may be equal to or greater than 30% of the entire area of the light emitting device 1100. Accordingly, the light emitting device can be stably mounted through the first bonding pad 1171 and the second bonding pad 1172, and the electrical characteristics of the light emitting device may not be deteriorated.

Accordingly, the sum of the areas of the first bonding pad 1171 and the second bonding pad 1172 is equal to or greater than 30% of the entire area of the light emitting device 1100, so that a stable mount may be performed through the first bonding pad 1171 and the second bonding pad 1172, and electrical characteristics of the light emitting device 1100 may be ensured.

The sum of the areas of the first bonding pad 1171 and the second bonding pad 1172 may be selected as 30% to 60% with respect to the entire area of the light emitting device 1100 in consideration of ensuring the light extraction efficiency and the bonding stability.

When the sum of the areas of the first bonding pad 1171 and the second bonding pad 1172 is in a range of 30% to 100% of the entire area of the light emitting device 1100, the electrical characteristics of the light emitting device package can be improved and the bonding force to be mounted on the light emitting device package can be increased.

In addition, when the sum of the areas of the first bonding pad 1171 and the second bonding pad 1172 is more than 0% and equal to or less than 60% of the entire area of the light emitting device 1100, the amount of light emitted to the surface on which the first bonding pad 1171 and the second bonding pad 1172 are disposed increases, so that the light extraction efficiency of the light emitting device 1100 may be improved and the light intensity Po may be increased.

The sum of the areas of the first bonding pad 1171 and the second bonding pad 1172 is selected as 30% to 60% of the entire area of the light emitting device 1100 so as to ensure the electrical characteristics of the light emitting device 1100 and the bonding strength to be mounted on the light emitting device package and increase the light intensity. The sum of the areas of the first and second bonding pads 1171 and 1172 may be the sum of the areas of the first and second bonding pads 1171 and 1172, an entire area of the light emitting device 1100 is an area of entire upper surface thereof, and the upper surfaces of the first and second bonding pads 1171 and 1172 may have an area facing each frame of the light emitting device package.

According to another embodiment of the invention, the sum of the areas of the first bonding pad 1171 and the second bonding pad 1172 in order to secure the electrical characteristics and the bonding strength of the light emitting device 1100 may be in a range of more than 60% and less than 100%. The sum of the area of the first bonding pad 1171 and the area of the second bonding pad 1172 may be in a range of more than 0% and less than 30%.

The first bonding pad 1171 is provided in a length of x1 along the long axis direction of the light emitting device 1100 and is provided in a length y1 along the short axis direction of the light emitting device 1100. For example, a ratio of x1 and y1 may be 1:1.5 to 1:2.

The second bonding pad 1172 may be provided in a length of x2 along the long axis direction of the light emitting device 1100 and may be provided in a length of y2 along the short axis direction of the light emitting device 1100. For example, a ratio of x2 and y2 may be 1:1.5 to 1:2.

The minimum distance d between the first bonding pad 1171 and the second bonding pad 1172 may be 125 micrometers or more. The minimum distance d between the first bonding pad 1171 and the second bonding pad 1172 is determined by taking into account a gap between the second pad portion and the first pad portion of the package body on which the light emitting device 1100 is mounted.

As an example, the minimum distance between the first pad portion and the second pad portion of the package body may be provided at a minimum of 125 micrometers and may be provided at a maximum of 200 micrometers. At this time, considering the process error, the distance d between the first bonding pad 1171 and the second bonding pad 1172 may be, for example, in the range of 125 to 300 micrometers.

When the distance d between the first bonding pad 1171 and the second bonding pad 1172 is 125 micrometers or more, a space between the first bonding pad 1171 and the second bonding pad 1172 of the light emitting device may be secured a minimum space in which no short circuit occurs, a light emitting area for improving light extraction efficiency may be secured, and the light intensity Po of the light emitting device 1100 may be increased.

When the distance d between the first bonding pad 1171 and the second bonding pad 1172 is 300 micrometers or less, the first and second frames of the light emitting device package and the light emitting device and the first bonding pad 1171 and the second bonding pad 1172 can be bonded with a sufficient bonding force and the electrical characteristics of the light emitting device 1100 may be secured.

The minimum distance d between the first bonding pad 1171 and the second bonding pad 1172 is set to be greater than 125 micrometers in order to secure optical characteristics and less than 300 micrometers in order to secure reliability due to electrical characteristics and bonding force.

Although the minimum distance d between the first bonding pad 1171 and the second bonding pad 1172 has been described as an example in the range of 125 to 300 micrometers, the minimum distance d may be arranged to be less than 125 micrometers to improve electrical properties or reliability, and may be arranged to be greater than 300 micrometers to improve optical properties.

The first bonding pad 1171 is spaced apart from a side of the short axis direction of the light emitting device 1100 by a length b1 and is spaced apart from the side of the long axis direction of the light emitting device 1100 by a length a1 or a3. In this case, the a1 or a3 may be 40 micrometers or more, and the b1 may be 100 micrometers or more.

The second bonding pad 1172 is spaced apart from a side of the short axis direction of the light emitting device 1100 by a length b2 and is spaced apart from a length a2 or a4 from a side of the long axis direction of the light emitting device 1100. In this case, the a2 or a4 may be 40 micrometers or more, and the b2 may be 100 micrometers or more.

According to the embodiment, the a1, a2, a3 and a4 may be provided with the same value. In addition, the b1 and b2 may be provided with the same value. According to another embodiment, at least two of a1, a2, a3 and a4 are different values, and the b1 and b2 may be different values.

As shown in FIG. 54, the third reflective portion 1163 may be disposed between the first bonding pad 1171 and the second bonding pad 1172. For example, the length of the third reflective portion 1163 along the long axis of the light emitting device 1100 corresponds to the distance d between the first bonding pad 1171 and the second bonding pad 1172. The length f of the third reflective portion 1163 may be a length in the short axis direction of the light emitting device 1100. For example, the length f of the third reflective portion 1163 may correspond to a length in the short axis direction of the light emitting device 1100. For example, the top surface area of the third reflective portion 1163 may be in the range of 10% to 25% of the entire upper surface of the light emitting device 1100.

When the top surface area of the third reflective portion 1163 is 10% or more of the entire upper surface of the light emitting device 1100, the package body disposed under the light emitting device may be discolored or prevented from cracking, and when it is 25% or less, it is advantageous to secure the light extraction efficiency to emit light to the six surfaces of the light emitting device.

As another example, in order to improve the light extraction efficiency, the area of the third reflective portion 1163 may be set to more than 0% and less than 10% of the entire upper surface of the light emitting device 1100 have. In order to prevent discoloration or cracking of the package body, the area of the third reflective portion 1163 may be set to more than 25% and less than 100% of the entire upper surface of the light emitting device 100.

Accordingly, the first region provided between the first bonding pad 1171 and the second bonding pad 1172 may be provided so that light generated from the light emitting structure 1110 is not transmitted through the first region. At this time, the first region may be a region corresponding to the minimum distance between the first bonding pad 1171 and the second bonding pad 1172. In addition, the first region may correspond to a length (e.g., d) arranged in the long axis direction of the light emitting device in the third reflective portion 1163.

Also, a second region provided between the first bonding pad 1171 or the second bonding pad 1172 adjacent to the long side and the long side of the light emitting device 1100 may be transmitted and emitted light generated from the light emitting structure 1100. At this time, the second region may be a region corresponding to the lengths b1 and b2.

A third region provided between the first bonding pad 1171 or the second bonding pad 1172 adjacent to the short side and the short side of the light emitting device 1100 may be transmitted and emitted light generated for the light emitting structure 1100. At this time, the third region may be a region corresponding to the lengths a1, a2, a3, and a4.

For example, in the case where the light emitting device 1100 according to the embodiment has a length in the long axis direction of 1250 mm or more and a short axis length of 750 mm or more, the above-mentioned variables may have the following values.

If the area of the first bonding pad 1171 is equal to the area of the second bonding pad 1172 and the sum of the two areas is 30%, x1:y1=1:2, and the value of d is provided at 125 micrometers, the value of x1 may be provided at 265 micrometers, and the value of y1 may be provided at 530 micrometers. Accordingly, for example, the value of a1 may be 110 micrometers or less and for example, the value of b1 may be 300 micrometers or less.

That is, when the sum of the area of the first bonding pad 1171 and the area of the second bonding pad 1172 is determined according to the size of the light emitting device 1100, a ratio of a lateral length and a longitudinal length of the first and second bonding pad 1171, and the value of distance d is determined, the remaining variables may be calculated by calculation. Accordingly, the upper limit values of a1, a2, a3, a4, b1, b2, etc. are not shown.

According to the embodiment, the size of the first reflective portion 1161 may be several micrometers larger than the size of the first bonding pad 1171. For example, the area of the first reflective portion 1161 may be sufficiently large to cover the area of the first bonding pad 1171. The length of one side of the first reflective portion 1161 may be about 4 micrometers to 10 micrometers larger than the length of one side of the first bonding pad 1171 in consideration of a process error.

The size of the second reflective portion 1162 may be several micrometers larger than the size of the second bonding pad 1172. For example, the area of the second reflective portion 1162 may be sufficiently large to cover the area of the second bonding pad 1172. The length of one side of the second reflective portion 1162 may be about 4 micrometers to 10 micrometers larger than the length of one side of the second bonding pad 1172.

According to the embodiment, light emitted from the light emitting structure 1110 may reflect by the first reflective portion 1161 and the second reflective portion 1162 without being incident on the first bonding pad 1171 and the second reflective portion 1162. Accordingly, the light generated and emitted from the light emitting structure 1110 may not be lost in the first bonding pad 1171 and the second bonding pad 1172.

Since the third reflective portion 1163 is disposed between the first bonding pad 1171 and the second bonding pad 1172, light may be reflected in the region between the first bonding pad 1171 and the second bonding pad 1172.

The light emitting device 1100 according to the embodiment may be mounted, for example, in a flip chip bonding manner to provide a light emitting device package. When the package body on which the light emitting device 1100 is mounted is provided by resin or the like, the package body may be discolored or cracked due to strong short-wavelength light emitted from the light emitting device 1100 in a lower region of the light emitting device 1100.

However, according to the light emitting device 1100 according to the embodiment, since light may be prevented from being emitted between the regions where the first bonding pad 1171 and the second bonding pad 1172 are disposed, it is possible to prevent the package body disposed in the lower region of the element 1100 from being discolored or cracked.

The length (eg, d) of the third reflective portion 1163 may be minimized in consideration of a minimum distance between the first pad portion and the second pad portion provided on the package body. The first bonding pad 1171 and the second bonding pad 1172 are spaced apart from each other by a minimum distance b1 and b2 between the short side surface of the light emitting device 1100 and the first bonding pads 1171 or the second bonding pads 1172. The amount of light emitted to the sides of the first bonding pad 1171 and the second bonding pad 1172 can be improved.

According to the embodiment, at least 20% of the upper surface area of the light emitting device 1100 in which the first bonding pad 1171, the second bonding pad 1172, and the third reflective portion 1163 may be transmitted through and emitted from the light emitting structure 1110.

Since the amount of light emitted toward the six surfaces of the light emitting device 1100 is increased, the light extraction efficiency can be improved and the light intensity Po can be increased. In addition, it is possible to prevent the package body disposed close to the lower surface of the light emitting device 1100 from being discolored or cracked.

According to the light emitting device package and the method of manufacturing the light emitting device package according to the embodiment, the first bonding pad and the second bonding pad of the light emitting device may receive driving power through the conductive part disposed in the through hole of the frame. The melting point of the conductive part disposed in the through hole may be selected to have a higher value than the melting point of the common bonding material.

Therefore, when the light emitting device package according to the embodiment is bonded to a main substrate through a reflow process, re-melting phenomenon does not occur, so that electrical connection and physical bonding force are not deteriorated.

Also, in the process of manufacturing the light emitting device package, the package body 110 does not need to be exposed to high temperature. Therefore, according to the embodiment, it is possible to prevent the package body 110 from being exposed to high temperatures to be damaged or discolored. Thus, the selection range for the material constituting the body can be widened. According to the embodiment, the body may be provided using not only expensive materials such as ceramics but also relatively inexpensive resin materials.

Meanwhile, the light emitting device package according to the embodiment may be applied to a light source device. Further, the light source device may include a display device, a lighting device, a head lamp, and the like depending on an industrial field.

As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a first frame having a first through hole;
   a second frame having a second through hole;
   a body disposed between the first and second frames;
   a light emitting device including a first bonding pad and a second bonding pad;
   a first conductive part in the first through hole; and
   a second conductive part in the second through hole,
   wherein the first through hole passes through an upper surface and a lower surface of the first frame,
   wherein the second through hole passes through an upper surface and a lower surface of the second frame,
   wherein the first bonding pad faces the first frame and is overlapped with the first through hole in a vertical direction,
   wherein the second bonding pad faces the second frame and is overlapped with the second through hole in the vertical direction, and
   wherein the first bonding pad includes a first contact region that is in contact with the first conductive part on the first through hole and a first non-contact region that is not in physical contact with the first conductive part.

2. The light emitting device package of claim 1, wherein the second bonding pad has a second contact region that is in contact with the second conductive part on the second through hole and a second non-contact region that is not in physical contact with the second conductive part.

3. The light emitting device package of claim 2, wherein the first and second conductive parts comprise a solder paste.

4. The light emitting device package of claim 3, wherein at least one of the first and second bonding pads has an area of each of the first and second contact regions that is at least twice an area of a particle constituting the first and second conductive part.

5. The light emitting device package of claim 3, wherein at least one of the first and second bonding pads has an area of each of the first and second non-contact regions that is at least 1.5 times an area of a particle constituting the first and second conductive parts.

6. The light emitting device package of claim 3, wherein an area of the first contact region of the first bonding pad is smaller than an area of a top surface of the first through hole, and
   wherein an area of a second contact region of the second bonding pad is smaller than a top surface area of the second through hole.

7. The light emitting device package of claim 6, wherein a first contact region of the first bonding pad is disposed on the first through hole,
   wherein the second contact region of the second bonding pad is disposed on the second through hole,
   wherein the first non-contact region of the first bonding pad is disposed on the first through hole and includes an area smaller than an area of the first contact region, and
   wherein the second non-contact area of the second bonding pad is disposed on the second through hole and is smaller than an area of the second contact area.

8. The light emitting device package of claim 6, wherein the first and second conductive parts each have a concave curved surface on the first and second non-contact regions, respectively.

9. The light emitting device package of claim 6, further comprising at least one of an adhesive and a resin part disposed between the body and the light emitting device.

10. The light emitting device package of claim 9, wherein the body includes a recess recessed from an upper surface in a downward direction,
    wherein the adhesive is disposed in the recess, and
    wherein the adhesive contacts the upper surface of the body, a lower surface of the light emitting device, and the first and second bonding pads.

11. The light emitting device package of claim 10, wherein at least one of the adhesive and the resin part is disposed outside the first and second non-contact regions of the first and second bonding pads.

12. The light emitting device package of claim 9, wherein the first and second frames are conductive frames,
    wherein the adhesive is formed of an insulating resin material, and
    wherein the body has a cavity having inclined sidewalls around the light emitting device.

* * * * *